United States Patent
Kataoka

(10) Patent No.: US 9,263,488 B2
(45) Date of Patent: Feb. 16, 2016

(54) SEMICONDUCTOR DEVICE, MANUFACTURING METHOD OF SEMICONDUCTOR DEVICE, SEMICONDUCTOR WAFER, AND ELECTRONIC EQUIPMENT

(71) Applicant: Sony Corporation, Tokyo (JP)

(72) Inventor: Toyotaka Kataoka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/382,091

(22) PCT Filed: Mar. 4, 2013

(86) PCT No.: PCT/JP2013/055886
§ 371 (c)(1),
(2) Date: Aug. 29, 2014

(87) PCT Pub. No.: WO2013/137049
PCT Pub. Date: Sep. 19, 2013

(65) Prior Publication Data
US 2015/0035109 A1    Feb. 5, 2015

(30) Foreign Application Priority Data

Mar. 16, 2012  (JP) .................................. 2012-060546
Dec. 27, 2012  (JP) .................................. 2012-285320

(51) Int. Cl.
*H01L 27/146*    (2006.01)

(52) U.S. Cl.
CPC ...... *H01L 27/14634* (2013.01); *H01L 27/1464* (2013.01); *H01L 27/1469* (2013.01); *H01L 27/14636* (2013.01); *H01L 27/14689* (2013.01)

(58) Field of Classification Search
CPC ................... H01L 27/14634; H01L 27/14636; H01L 27/1469; H01L 27/14689; H01L 27/1464
See application file for complete search history.

(56) References Cited

U.S. PATENT DOCUMENTS 6,232,655 B1 *  5/2001  Sugimura ..................... 257/690
8,456,014 B2 *  6/2013  Kobayashi et al. ........... 257/774
(Continued)

FOREIGN PATENT DOCUMENTS

JP    2004-031499    1/2004
JP    2004-063786    2/2004
(Continued)

OTHER PUBLICATIONS

International Search Report: International Application No. PCT/JP2013/055886; Date of the actual completion of the international search: May 15, 2013. (Form PCT/ISA/210).

(Continued)

*Primary Examiner* — Nikolay Yushin
(74) *Attorney, Agent, or Firm* — Hazuki International, LLC

(57) ABSTRACT

The present technology relates to a semiconductor device, a manufacturing method of a semiconductor device, a semiconductor wafer, and electronic equipment, which allow a semiconductor device, in which miniaturization is possible, to be provided. A semiconductor device includes a semiconductor substrate, a wiring layer that is formed on the semiconductor substrate, and a drive circuit that is provided in a circuit forming region of the semiconductor substrate. Then, the semiconductor device is configured to include a pad electrode that is electrically connected to the drive circuit and exposed from the side surface of the wiring layer, and an external connection terminal that is provided in side surfaces of the semiconductor substrate and the wiring layer, and is electrically connected to the pad electrode.

15 Claims, 51 Drawing Sheets

(56) References Cited

U.S. PATENT DOCUMENTS

| | | |
|---|---|---|
| 2004/0077121 A1 | 4/2004 | Maeda et al. |
| 2004/0157410 A1 | 8/2004 | Yamaguchi |
| 2007/0037379 A1 | 2/2007 | Enquist et al. |
| 2010/0109006 A1* | 5/2010 | Kobayashi et al. ............ 257/48 |
| 2011/0233702 A1 | 9/2011 | Takahashi et al. |

FOREIGN PATENT DOCUMENTS

| | | |
|---|---|---|
| JP | 2004-221372 | 8/2004 |
| JP | 2007-150283 | 6/2007 |
| JP | 2009-505401 | 2/2009 |
| JP | 2011-204915 | 10/2011 |
| WO | WO-2008/062767 | 5/2008 |

OTHER PUBLICATIONS

Written Opinion of the International Searching Authority: International Application No. PCT/JP2013/055886; Date: May 28, 2013. (Form PCT/ISA/220 and PCT/ISA/237).

* cited by examiner

SEMICONDUCTOR DEVICE, MANUFACTURING METHOD OF SEMICONDUCTOR DEVICE, SEMICONDUCTOR WAFER, AND ELECTRONIC EQUIPMENT

TECHNICAL FIELD

The present technology relates to a semiconductor device, a manufacturing method of the semiconductor device, a semiconductor wafer in which a semiconductor device is formed, and electronic equipment to which a semiconductor device is applied.

BACKGROUND ART

The demand of a solid state imaging device (image sensor) as a semiconductor device used in electronic equipment has been increasing. For the solid state imaging device, a structure of a so-called back-illumination has been proposed in which a drive circuit is formed on the surface of a semiconductor substrate and a back surface is a light receiving side, in order to intend to improve photoelectric conversion efficiency and sensitivity with respect to incident light. In the backside illumination type solid state imaging device, it is possible to increase a light receiving aperture ratio of the light receiving surface, and to increase an incident area of light in the same chip area.

Further, in the backside illumination type solid state imaging device, wiring and contact pads may be provided below a sensor, as compared to a front side illumination type. Therefore, the backside illumination type solid state imaging device has a structure in which the wirings are provided on the surface of a substrate, and thus the miniaturization of a device is possible, as compared to the front side illumination type solid state imaging device having the same light receiving area. Then, the device is miniaturized, such that it is possible to increase a chip yield in a wafer surface.

Meanwhile, in the backside illumination type solid state imaging device, since there are no contact pads on the upper surface, a method of connecting the contact pads from the outside is a problem. As a solution method, a method has been proposed in which an external connection terminal is provided in an outer peripheral portion of a circuit forming region of the semiconductor device in which various active elements and circuits are arranged (for example, see PTL 1). The external connection terminal is configured to be able to be connected from the surface on the light receiving surface side of the backside illumination type solid state imaging device.

CITATION LIST

Patent Literature

PTL 1: Japanese Unexamined Patent Application Publication No. 2007-150283

SUMMARY OF INVENTION

Technical Problem

As the backside illumination type solid state imaging device described above, a technology of miniaturization without changing the area of the circuit forming region has been required in the semiconductor device.

In the present technology, an object is to provide a semiconductor device in which miniaturization is possible, electronic equipment, a manufacturing method of a semiconductor device in which the miniaturization of the semiconductor device is possible, and a semiconductor wafer in which a semiconductor device is formed.

Solution to Problem

A semiconductor device of the present technology includes a semiconductor substrate, a wiring layer that is formed on the semiconductor substrate, and a drive circuit that is provided in a circuit forming region of the semiconductor substrate. Then, the semiconductor device further includes a pad electrode that is electrically connected to the drive circuit and exposed from the side surface of the wiring layer, and an external connection terminal that is provided in side surfaces of the semiconductor substrate and the wiring layer, and is electrically connected to the pad electrode.

Then, electronic equipment of the present technology includes the semiconductor device and a signal processing circuit that processes an output signal of the semiconductor device.

A semiconductor wafer of the present technology includes a plurality of circuit forming regions, a scribe region that is arranged to surround the circuit forming regions, and a drive circuit that is provided in the circuit forming regions. Then, the semiconductor wafer further includes a pad electrode that is electrically connected to the drive circuit and formed from an end of the circuit forming region to the scribe region, an opening portion that is formed on the pad electrode, and a conductor layer that is formed on a side surface and a lower surface of the opening portion and is electrically connected to the drive circuit.

A manufacturing method of a semiconductor device of the present technology includes a process of forming a drive circuit in a circuit forming region of a semiconductor substrate, a process of forming a wiring layer on the semiconductor substrate, and a process of forming a pad electrode in the wiring layer. The manufacturing method further includes a process of forming an opening portion for exposing the pad electrode in a surface, from the circuit forming region to a scribe region, a process of forming a conductor layer in a side surface of the opening portion, and a process of singulating the circuit forming region in the scribe region.

Further, a manufacturing method of a semiconductor device of the present technology includes a process of forming a drive circuit in a circuit forming region of a semiconductor substrate, a process of forming a wiring layer on a semiconductor substrate, and a process of forming a pad electrode in the wiring layer. Then, the manufacturing method further includes a process of forming a penetrating electrode which penetrates the semiconductor substrate and is connected to the pad electrode, a process of forming an opening portion for exposing the pad electrode in a surface and exposing the penetrating electrode in a side surface, from the circuit forming region to the scribe region, and a process of singulating the circuit forming region in the scribe region.

According to the semiconductor device of the present technology, since external connection terminals are formed in the side surface of the semiconductor device, a region for providing terminals on the upper surface of the semiconductor device becomes unnecessary. Therefore, it is possible to increase an area ratio of a circuit region in a semiconductor chip. Accordingly, without affecting the properties of the semiconductor device, the miniaturization of a semiconductor device and electronic equipment including a semiconductor device can be realized.

In addition, according to the semiconductor wafer of the present technology, the pad electrode which is connected to the drive circuit is exposed in the wafer surface by the opening portion which is formed from the circuit forming region to the scribe region. The conductor layer that is connected to the pad electrode is formed. Accordingly, it is possible to perform an inspection of the semiconductor device in the pad electrode or the conductor layer. Then, after an inspection, the pad electrode which is formed in the scribe region is removed by singulating the circuit forming region in the scribe region, and the conductor layer as the external connection terminal remains on the side surface of the singulated semiconductor device. Accordingly, a region for providing terminals for an inspection and an external connection is not required in the upper surfaces of the semiconductor wafer and semiconductor device, and thus miniaturization of the semiconductor device is possible.

Further, according to the manufacturing method of a semiconductor device of the present technology, the pad electrode is exposed by the opening portion which is formed from the circuit forming region in the scribe region. Further, the conductor layer is formed in the side surface and the lower surface of the opening portion. Therefore, the inspection of the semiconductor device is possible by the pad electrode or the conductor layer which is exposed from the opening portion. Then, the external connection terminal of the semiconductor device is formed from the conductor layer which is formed in the side surface of the opening portion, by singulating the circuit forming region in the scribe region. Further, the pad electrode which is formed in the scribe region is removed by the scribing, and does not remain in the singulated semiconductor device. Accordingly, a region for providing terminals for an inspection and an external connection is not required in the upper surfaces of the semiconductor wafer and semiconductor device, and thus miniaturization of the semiconductor device is possible.

Advantageous Effects of Invention

According to the present technology, miniaturization of a semiconductor device and electronic equipment is possible. Further, it is possible to provide a manufacturing method of a semiconductor device that can be miniaturized.

DESCRIPTION OF EMBODIMENTS

Hereinafter, examples of the best mode for implementing the present technology will be described, but the present technology is not limited to the following examples.

In addition, a description will be given in the following order:

1. Overview of solid state imaging device
2. First embodiment (semiconductor device and semiconductor wafer)
3. First embodiment (manufacturing method of semiconductor device and semiconductor wafer)
4. Second embodiment (semiconductor device and semiconductor wafer)
5. Second embodiment (manufacturing method of semiconductor device and semiconductor wafer)
6. Third embodiment (semiconductor device and semiconductor wafer)
7. Third embodiment (manufacturing method of semiconductor device and semiconductor wafer)
8. Fourth embodiment (semiconductor device and semiconductor wafer)
9. Fourth embodiment (manufacturing method of semiconductor device and semiconductor wafer)
10. Fifth embodiment (semiconductor device and semiconductor wafer)
11. Fifth embodiment (manufacturing method of semiconductor device and semiconductor wafer)
12. Sixth embodiment (semiconductor device and semiconductor wafer)
13. Seventh embodiment (semiconductor device and semiconductor wafer)
14. Eighth embodiment (semiconductor device and semiconductor wafer)
15. Ninth embodiment (semiconductor device and semiconductor wafer)
16. Tenth embodiment (electronic equipment)

1. Overview of Solid State Imaging Device

Before describing embodiments, an overview of a semiconductor device will be described as an example of a solid-state imaging device.

As described above, since the drive circuit is provided on the surface opposite to the light receiving surface in the backside illumination type solid state imaging device, the miniaturization of a device is possible. Further, since it is necessary for incident light to efficiently reach a light conversion unit (light receiving unit), a substrate for forming the light receiving unit is made thinner, and thus a supporting substrate is required. Therefore, the backside illumination type solid state imaging device has characteristics of easily using another device as the supporting substrate.

Figure 46:
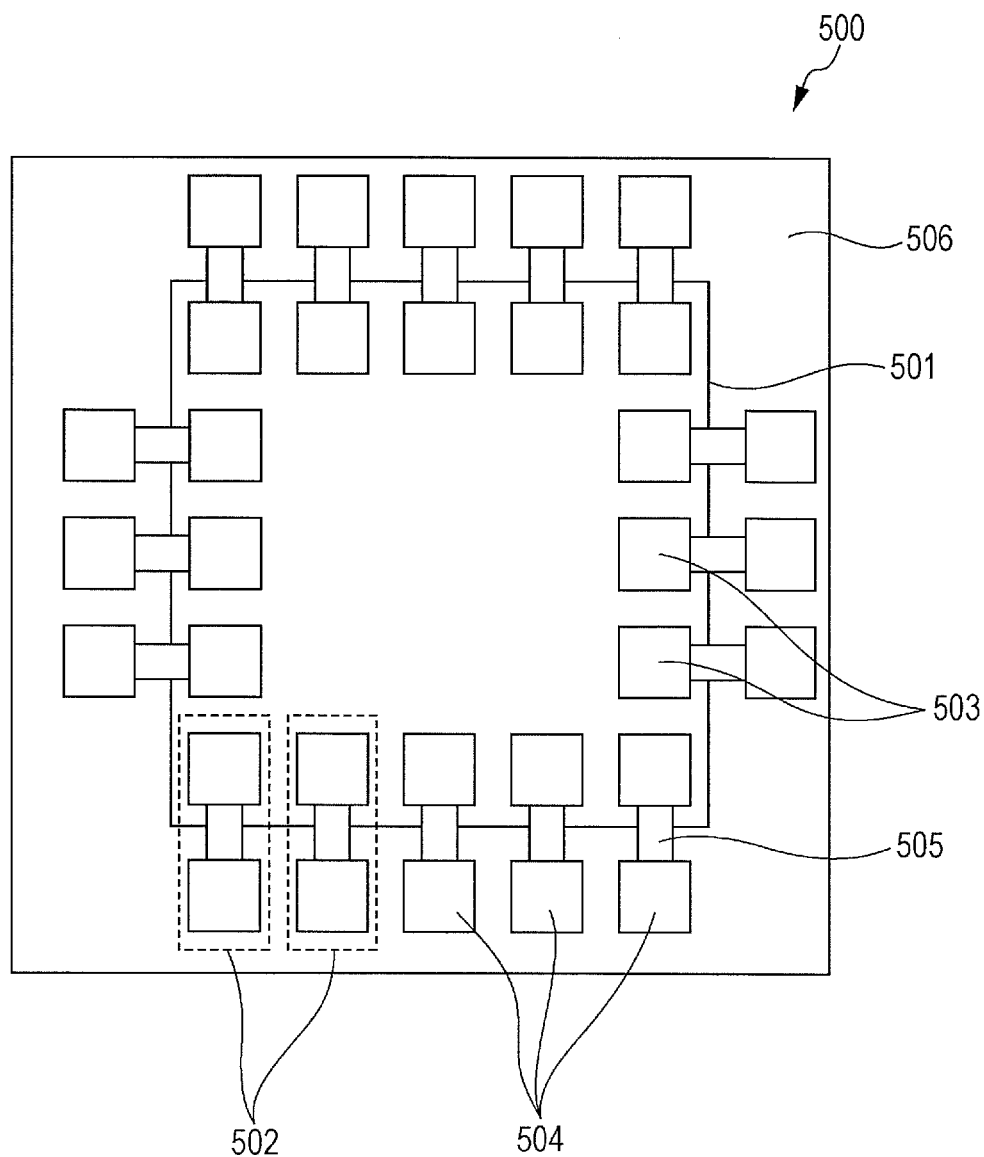
FIG. 46 is a diagram illustrating a configuration of a semiconductor device in the related art.

However, since there is no contact pad on the upper surface in the backside illumination type solid state imaging device, an access method to the contact pad is a problem. As a method to solve the problem, a configuration of a semiconductor device disclosed in PTL 1 is illustrated in FIG. 46. In the semiconductor device, a plurality of extension bond pads 502 are provided in a circuit forming region 501 of a semiconductor device that is formed on a wafer 500. The extension bond pad 502 includes a first bond pad 503, second bond pad 504, and a metal extension portion 505. The first bond pad 503 is arranged in the circuit forming region 501 of the semiconductor device. The second bond pad 504 is arranged in an outer peripheral portion 506 of the circuit forming region 501. Then, the first bond pad 503 and the second bond pad 504 are electrically connected by a metal extension portion 505.

In the semiconductor device configured as described above, an inspection of the semiconductor device is performed using the second bond pad 504, before the semiconductor device is singulated by scribing the wafer 500. For example, an inspection by a four-terminal method using a test probe is performed in the second bond pad 504 of the semiconductor device in a wafer state.

However, in the above semiconductor device, it is necessary to leave the second bond pad 504 used for an inspection in a wafer state in the periphery of the circuit forming region 501 as an external connection terminal. Therefore, a circuit forming region 501 is formed larger in a size than the circuit forming region 501, by the size of the second bond pad 504.

Further, when a solid state imaging device chip is formed in a predetermined size, the area of the circuit forming region 501 is reduced by the size of the second bond pad 504.

Thus, in the present technology, a pad electrode which is exposed on the upper surface of the semiconductor wafer is formed in a scribe region of the semiconductor wafer. Then, in the semiconductor device that is singulated after scribing, the external connection terminal is provided in a side surface of a semiconductor substrate which is exposed by the scribing. The external connection terminal provided in the side surface of the substrate is electrically connected to the drive circuit of the semiconductor device by a wiring connected to the pad electrode. Further, the pad electrodes formed in the scribe region is removed during scribing.

In the semiconductor device configured as described above, the pad electrode does not remain in the outer peripheral portion of the circuit forming region by scribing. Further, the external connection terminal is provided in the side surface of the substrate, such that it is not necessary to provide an extra space outside of the circuit forming region. Accordingly, the miniaturization of the second embodiment is possible without affecting the area of the circuit forming region.

2. First Embodiment

Semiconductor Device and Semiconductor Wafer

[Schematic Configuration of Solid State Imaging Device]

Figure 1:
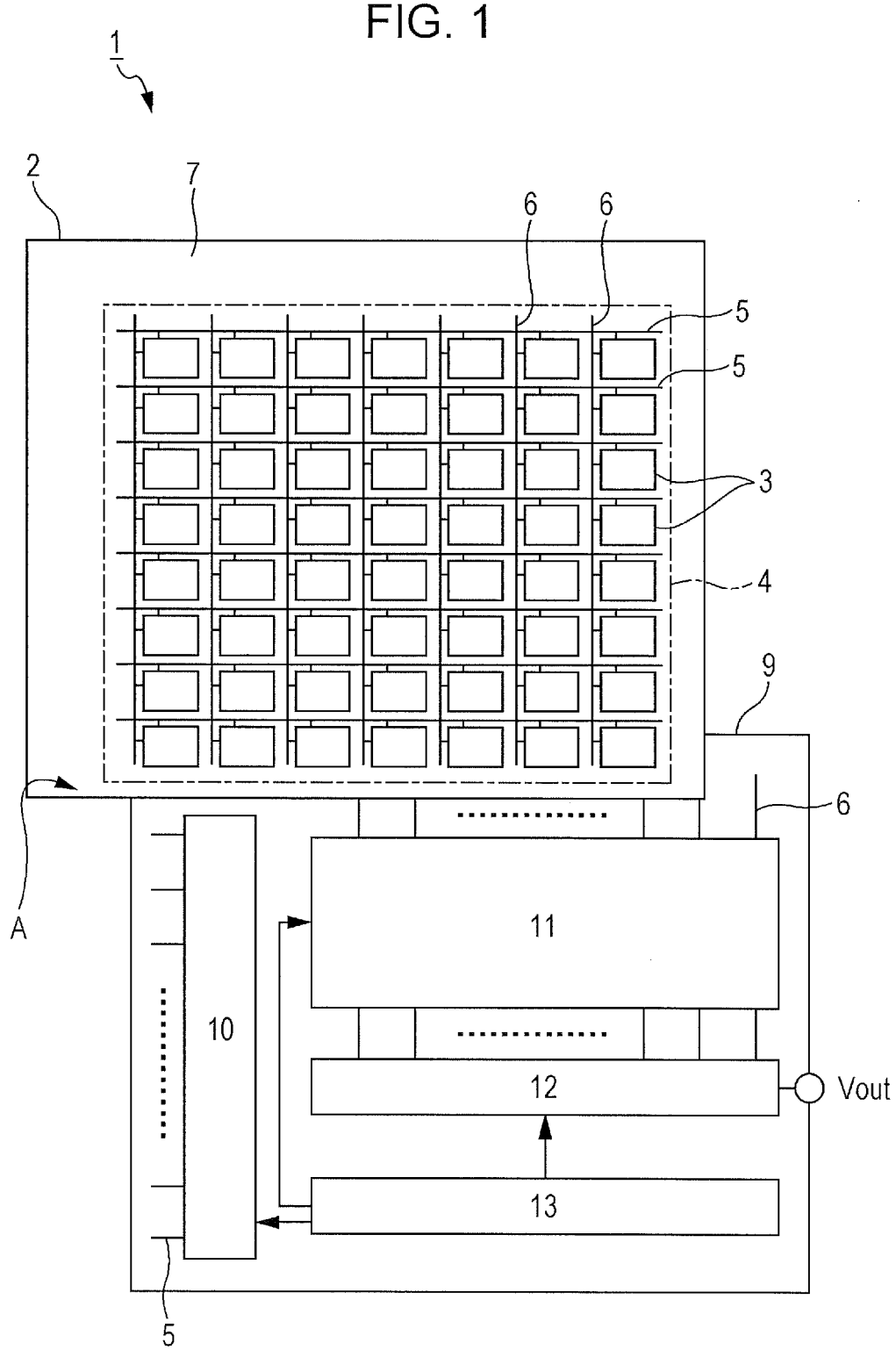
FIG. 1 is a plan view illustrating a configuration of a semiconductor device of embodiments.

FIG. 1 illustrates a schematic configuration of a backside illumination type solid state imaging device of a three-dimensional structure, as an example of a semiconductor device to which the present technology is applied. A solid state imaging device 1 illustrated in FIG. 1 includes a sensor board 2 in which photoelectric conversion units are arranged and formed, and a circuit board 9 which is attached to the sensor board 2 in a state of being laminated.

The sensor board 2, in which one surface is a light receiving surface A, includes a pixel region 4 in which a plurality of pixels 3 including photoelectric conversion units are two-dimensionally arranged with respect to the light receiving surface A. In the pixel region 4, a plurality of pixel driving lines 5 are wired in a row direction, a plurality of vertical signal lines 6 are wired in a column direction, and one pixel 3 is arranged in a state of being connected to one pixel driving line 5 and one vertical signal line 6. A pixel circuit including a photoelectric conversion unit, a charge storage portion, a plurality of transistors (so-called MOS transistor), a capacitor, and the like is provided in each pixel 3. Further, some pixel circuits are provided on a surface opposite to the light receiving surface A. Furthermore, a plurality of pixels may share a part of the pixel circuit.

In addition, the sensor board 2 is provided with a peripheral region 7 outside the pixel region 4. Wirings (not illustrated) are provided in the peripheral region 7, and the wiring is connected to the pixel driving line 5, the vertical signal line 6, and the pixel circuit which are provided in the sensor board 2 and the drive circuit provided in the circuit board 9, as necessary.

The circuit board 9 is provided with drive circuits for driving each pixel 3 provided in the sensor board 2, such as a vertical drive circuit 10, a column signal processing circuit 11, a horizontal drive circuit 12, and a system control circuit 13, on one side facing the sensor board 2. The drive circuits are connected to the wiring on the sensor board 2 and the pixel circuit. Further, the pixel circuit provided on the surface of the sensor board 2 is a part of the drive circuits.

[Configuration of Semiconductor Wafer]

Subsequently, the configuration of the semiconductor wafer on which the aforementioned solid state imaging device is formed will be described.

Figure 2:
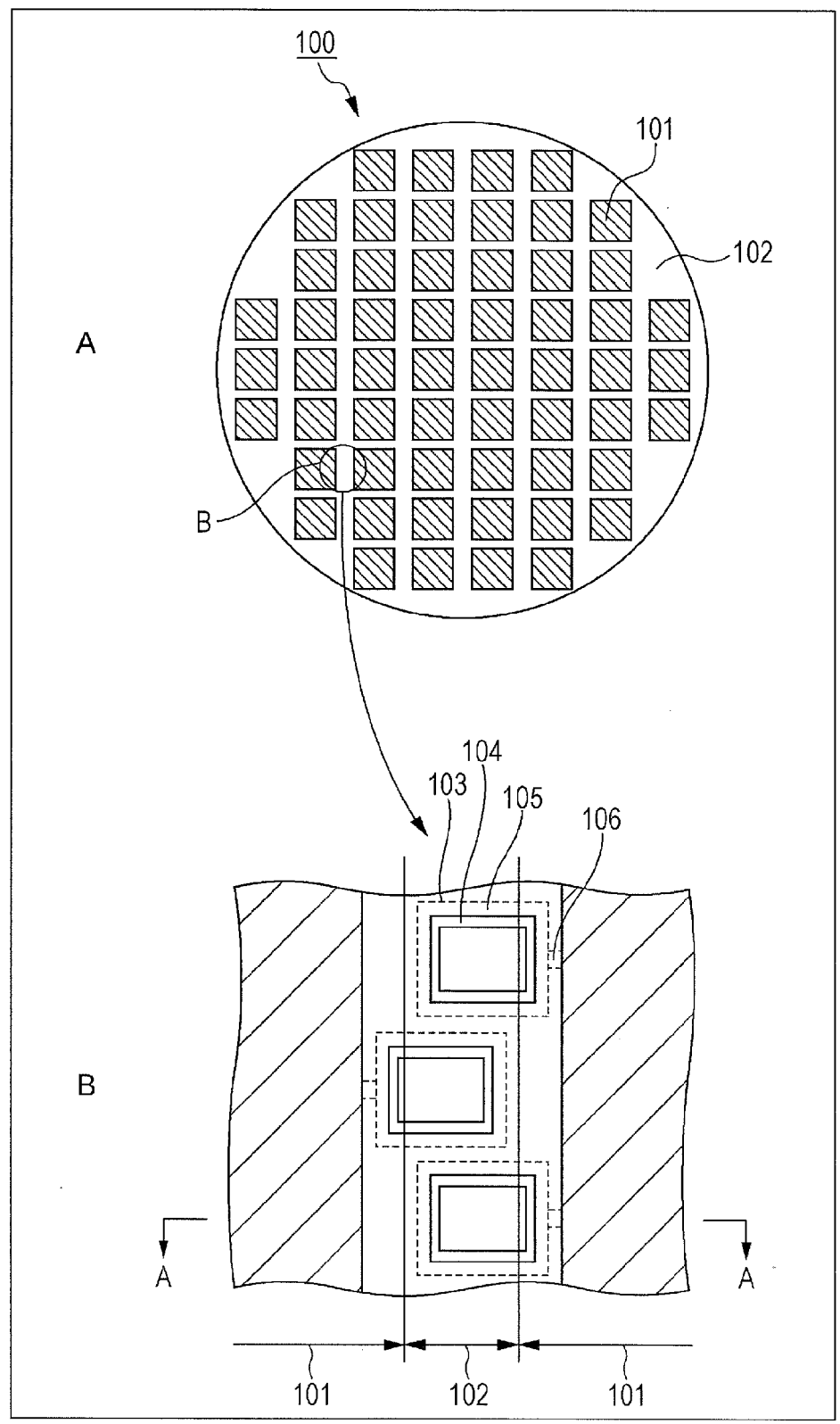
FIG. 2 is a plan view illustrating a configuration of a semiconductor wafer of embodiments.

The configuration of the semiconductor wafer is illustrated in FIG. 2. FIG. 2A is a plan view illustrating a configuration of the semiconductor wafer on the light receiving surface. FIG. 2B is an enlarged view of the configuration of a B portion in FIG. 2A.

As illustrated in FIG. 2A, a plurality of circuit forming regions 101 including the aforementioned solid state imaging device are arranged on the semiconductor wafer 100. Then, a scribe region 102 which is a region to be removed by dicing is arranged in the vicinity of the circuit forming region 101.

Each circuit forming region 101 is a region on which each solid state imaging device which is described above and illustrated in FIG. 1 is formed. In such a circuit forming region 101, the entire surface of the light receiving surface is covered with an insulating film, and a drive circuit is provided on the surface opposite to the light receiving surface, as described in more detail below.

Further, as illustrated in FIG. 2B, in the semiconductor wafer 100, a pad electrode 103 for inspection is provided on the scribe region 102. An opening portion 104, which is provided in the surface of the pad electrode 103 for exposure, is provided above the pad electrode 103. Conductor layers 105 which are external connection terminals of the semiconductor device are provided on the side and lower surface of the opening portion 104.

A wiring 106 is connected to the pad electrode 103 from the circuit forming region 101. Therefore, the pad electrode 103 and the conductor layer 105 are electrically connected to various elements and wirings in the circuit forming region 101 through the wiring 106.

In addition, the pad electrode 103 may be provided or may not be provided below the conductor layer 105. When the pad electrode 103 is provided, the conductor layer 105 and the pad electrode 103 are connected in the lower surface of the opening portion 104. Further, when the pad electrode 103 is not provided, the conductor layer 105 and the pad electrode 103 are connected in the side surface of the opening portion 104.

The pad electrode 103 or the conductor layer 105 is exposed on the light receiving surface of each semiconductor device in a wafer state, through the opening portion 104. Therefore, in the pad electrode 103 or the conductor layer 105, an inspection needle is inserted into the opening portion 104 from the light receiving surface A, and thus it is possible to inspect each semiconductor device in the wafer state.

In the configuration illustrated in FIG. 2B, the area of the opening portion 104 is smaller than the area of a region in which the pad electrode 103 is provided. Then the scribe region 102 is provided on the outside (adjacent circuit forming region 101 side) of the conductor layer 105 which is formed in the circuit forming region 101. Therefore, even after the scribing, a part of the pad electrode 103 and the conductor layer 105 remain in the side surface of the separated semiconductor device. Then, the conductor layer 105 which remains in the side surface of the semiconductor device is an external connection terminal of the semiconductor device.

In addition, the conductor layer 105 continuing from the side surface of the 104 is also formed in the lower surface of the opening portion 104. Since most parts of the conductor layer which are in the lower surface of the opening portion 104 are removed at the time of scribing, there are hardly any left in the singulated semiconductor device.

Further, after the pad electrode 103 exposed from the opening portion 104 is removed, the conductor layer 105 for forming an external connection terminal may be provided in some cases. In this case, only the pad electrode 103, which has not been exposed from the opening portion 104, remains. The conductor layer 105 for forming an external connection terminal may be embedded in the conductor layer, not only in the side surface and the lower part but also in the opening portion 104.

[Cross-Sectional Configuration of Semiconductor Device and Semiconductor Wafer]

Figure 3:
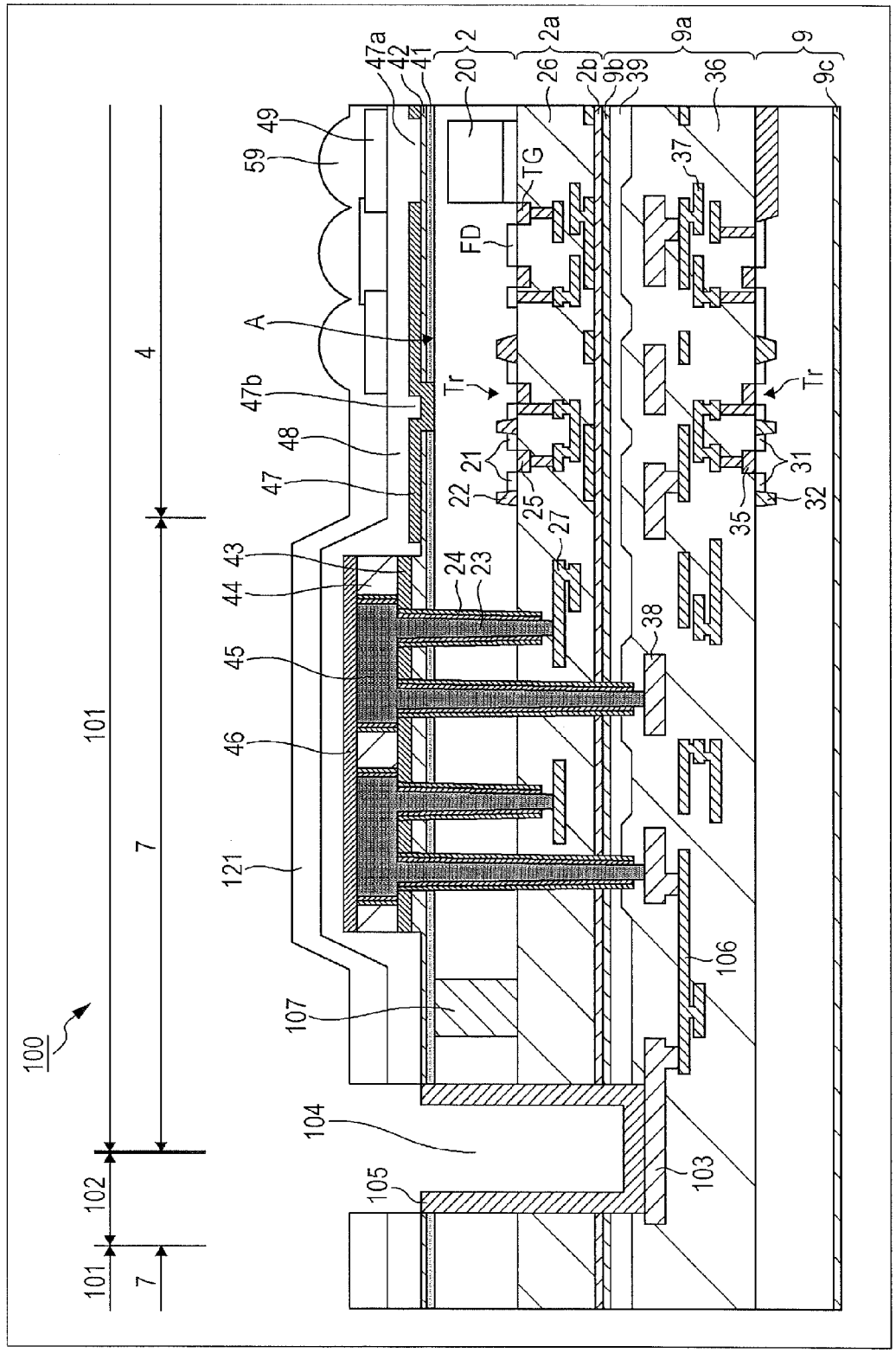
FIG. 3 is a diagram illustrating a configuration of a semiconductor wafer of a first embodiment.
Figure 4:
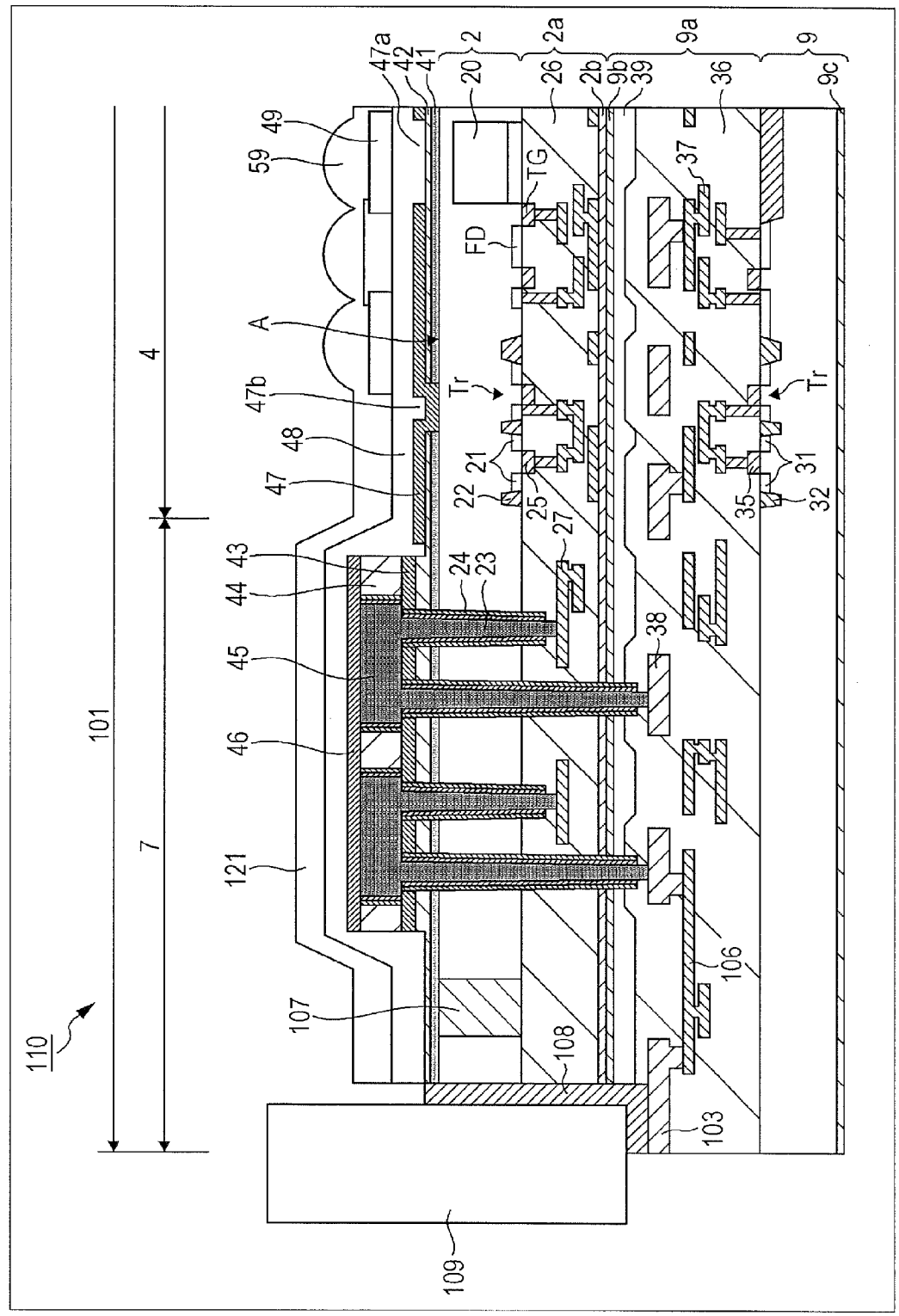
FIG. 4 is a diagram illustrating a configuration of a semiconductor device of the first embodiment.

FIG. 3 illustrates the configuration of the semiconductor wafer in the present embodiment. FIG. 4 illustrates the configuration of the semiconductor device which is singulated from the semiconductor wafer illustrated in FIG. 3. FIG. 3 and FIG. 4 illustrate the configuration of a MOS-type solid state imaging device as an example of the semiconductor device. The MOS type solid state imaging device is a backside illumination type solid state imaging device.

The semiconductor wafer 100 of the first embodiment, as illustrated in FIG. 3, is a semiconductor wafer of a three-dimensional structure in which the sensor board 2 and the circuit board 9 are bonded in a state of being laminated. Further, the semiconductor wafer 100 is configured with the circuit forming region 101 and the scribe region 102 in a plan view. Further, the circuit forming region 101 including the solid state imaging device is configured with the pixel region 4 and the peripheral region 7.

A wiring layer 2a and a protective film 2b covering the wiring layer 2a are provided on the surface on the side facing the circuit board 9 of the sensor board 2. A wiring layer 9a and a protective film 9b covering the wiring layer 9a are provided on the surface of the circuit board 9, that is, on the side facing the sensor board 2.

In addition, a protective film 9c is provided on the back surface of the circuit board 9. The sensor board 2 and the circuit board 9 are bonded with the protective film 2b and the protective film 9b.

An anti-reflection film 41, an interface level suppressing film 42, an etching stop film 43, a wiring groove forming film 44, a wiring 45, a cap film 46, and a light shielding film 47 are provided on the back surface of the sensor board 2, that is, the light receiving surface A. Further, a transparent protective film 48, a color filter 49, and an on-chip lens 59 are laminated on the light shielding film 47 in this order, respectively.

In the semiconductor wafer 100 configured as described above, the pad electrode 103 is provided on the wiring layer 9a from the circuit forming region 101 to the scribe region 102. The pad electrode 103 is connected to the wiring 106 of a drive circuit extended from the wiring layer 9a of the circuit forming region 101. With respect to the pad electrode 103, a part connected to the wiring 106 is arranged in the circuit forming region 101 and most of the other parts are arranged in the scribe region 102.

Further, the opening portion 104 is provided on the pad electrode 103. The opening portion 104 is formed while the respective wiring layers 2a and 9a, the sensor board 2, and the like which are arranged on the pad electrode 103 are removed. Then, a conductor layer 105 for covering the side surface of the opening portion 104 and the upper side of pad electrode 103 and for forming the external connection terminal is provided.

The sensor board 2 is obtained by thinning a semiconductor substrate configured with, for example, a single-crystal silicon. A plurality of photoelectric conversion units 20 are arranged and formed along the light receiving surface A, in the pixel region 4 in each circuit forming region 101 of the sensor board 2. Each photoelectric conversion unit 20 is configured with, for example, a laminated structure of an n-type diffusion layer and a p-type diffusion layer. In addition, the photoelectric conversion unit 20 is provided for each pixel, and a cross section of one pixel is illustrated in the drawings.

Further, an impurity layer, an element separator 22 and the like, which are not illustrated, and also a floating diffusion FD made of an n+ type impurity layer and a source/drain 21 of a transistor Tr are provided on the surface opposite to the light receiving surface A, in the circuit forming region 101 of the sensor board 2.

Further, a penetrating electrode 23 penetrating the sensor board 2 is provided in the peripheral region 7 outside of the pixel region 4, in the circuit forming region 101 of the sensor board 2. The penetrating electrode 23 is made of a conductive material embedded through a separation insulating film 24, within a contact hole formed while penetrating through the sensor board 2.

A wiring layer 2a of the circuit forming region 101 includes a transfer gate TG which is formed through a gate insulating film, a gate electrode 25 of the transistor Tr, and other electrodes which are not illustrated, at an interface with the sensor board 2. Further, the transfer gate TG and the gate electrode 25 are covered with the inter-layer insulating film 26. For example, wirings 27 using copper (Cu) are provided in a groove pattern provided in the inter-layer insulating film 26. A multilayer wiring layer is configured with the plurality of inter-layer insulating films 26 and the wirings 27. The wirings 27 are connected to each other by vias, and are configured in such a manner that some parts thereof are connected to the source/drain 21, the transfer gate TG, and the gate electrode 25. Further, the penetrating electrode 23 which is provided in the sensor board 2 is connected to the wiring 27, and the pixel circuit is configured with the transistor Tr, the wiring 27, and the like.

An insulating protective film 2b is provided on the inter-layer insulating film 26 on which the wiring 27 described above is formed, and the sensor board 2 is bonded with the circuit board 9 in the surface of the protective film 2b.

The circuit board 9 is obtained by thinning a semiconductor substrate configured with, for example, a single-crystal silicon. A source/drain 31 of a transistor Tr, and an impurity layer, an element separator 32, and the like which are not illustrated are provided on the surface layer facing the sensor board 2, in the circuit forming region 101 of the circuit board 9.

The circuit forming region 101 of the wiring layer 9a provided on the surface of the circuit board 9 has a gate electrode 35 which is provided through a gate insulating film, and other electrodes which are not illustrated at an interface with the circuit board 9. The gate electrode 35 and other electrodes are covered with an inter-layer insulating film 36. The wirings 37 made of, for example, copper (Cu) are formed as a multilayer wiring in the groove pattern that is provided on the inter-layer insulating film 36. The wirings 37 are connected to each other by vias, and some parts thereof are connected to the source/drain 31 and the gate electrode 35.

Further, wirings 38 made of aluminum or the like are provided in the bonding surface with the sensor board 2 of the circuit board 9. The wirings 38 arranged in the scribe region 102 become the pad electrode 103. Such wirings 38 are connected to the wirings 37 by vias. The surface of the inter-layer insulating film 36 has an uneven shape corresponding to the wiring 38, the flattening film 39 is provided to cover the uneven surface. The bonding surface of the circuit board 9 is flattened by the flattening film 39.

An insulating protective film 9b is provided on the flattening film 39, and the circuit board 9 is bonded with the sensor board 2 on the surface of the protective film 9b. Further, in the circuit board 9, a protective film 9c covering the circuit board 9 is provided on the back surface opposite to the surface in which the wiring layer 9a is provided.

The anti-reflection film 41, the interface level suppressing film 42, the etching stop film 43, and the wiring groove forming film 44 are provided on the light receiving surface A of the sensor board 2 in the peripheral region 7 of the circuit forming region 101 in order from the light receiving surface A. Further, wirings 45 are provided in the wiring groove forming film 44 and a cap film 46 is provided to cover the wirings 45.

In the pixel region 4 of the circuit forming region 101, the anti-reflection film 41, the interface level suppressing film 42, and the light shielding film 47 are provided on the light receiving surface A of the sensor board 2.

In the scribe region 102, the anti-reflection film 41 and the interface level suppressing film 42 are provided on the light receiving surface A of the sensor board 2.

In addition, an insulating portion 107 is provided in the sensor board 2 in the peripheral region 7. The insulating portion 107 is provided on the outer peripheral side of a circuit configured with various active elements formed in the sensor board 2, wirings penetrating the sensor board 2, and the like. The insulating portion 107 is provided in order to insulate electrical connection between the various active elements formed in the sensor board 2 and the conductor layer 105. Therefore, the insulating portion 107 is formed in the thickness direction of the entire sensor board 2. Further, the insulating portion 107 is continuously formed so as to surround the periphery of the sensor board 2, in the peripheral region 7 of the sensor board 2.

In the configuration described above, each layer is made of the following materials. The anti-reflection film 41 is made of, for example, an insulating material having a higher refractive index than silicon oxide, such as hafnium oxide ($HfO_2$), tantalum oxide ($Ta_2O_5$), or silicon nitride. The interface level suppressing film 42 is made of, for example, silicon oxide ($SiO_2$). For the etching stop film 43, a material in which an etching selectivity is suppressed low with respect to the material constituting the wiring groove forming film 44 of the upper layer is used, for example, silicon nitride (SiN) is used. The wiring groove forming film 44 is made of, for example, silicon oxide ($SiO_2$). The cap film 46 is made of, for example, silicon nitride (SiN).

The wiring 45 is provided while being embedded in the wiring groove forming film 44, on the light receiving surface A of the peripheral region 7 of the circuit forming region 101. The wiring 45 is formed integrally with the penetrating electrode 23 while being embedded, and connects the penetrating electrodes 23 with each other. The top of the wiring 45 is covered with the cap film 46.

The penetrating electrode 23 is provided to penetrate the etching stop film 43, the interface level suppressing film 42, and the anti-reflection film 41, from the wiring 45 on the light receiving surface A, in the peripheral region 7 of the circuit forming region 101, to penetrate the sensor board 2 and to reach the wiring layer 2a. There are a plurality of penetrating electrodes 23, and the penetrating electrodes 23 are connected to the wiring 27 of the sensor board 2, and the wiring 38 of the circuit board 9, or the wiring 37.

The wiring 45 and the penetrating electrode 23 are integrally formed through the separation insulating film 24 continuously covering the wiring groove which is formed in the wiring groove forming film 44 and the inner wall of the contact hole in the lower portion thereof, by embedding copper (Cu) in the wiring groove and the contact hole. Here, the parts of the wiring groove correspond to the wiring 45, and the parts of the contact hole correspond to the penetrating electrode 23. Further, the separation insulating film 24 is made of, for example, a material having an anti-diffusion function for copper (Cu), such as a silicon nitride (SiN). In this manner, the wirings 27 of the sensor board 2 to which the penetrating electrodes 23 are respectively connected and the wirings 38 of the circuit board 9 or the wirings 37 are electrically connected, by connecting the penetrating electrodes 23 with the wiring 45. In other words, the drive circuit of the sensor board 2 and the drive circuit of the circuit board 9 are connected.

The light shielding film 47 is provided on the top of the interface level suppressing film 42 above the light receiving surface A, in the pixel region 4 of the circuit forming region 101, and includes a plurality of light receiving openings 47a corresponding to the respective photoelectric conversion unit 20. Such a light shielding film 47 is made of a conductive material having an excellent light-shielding property such as aluminum (Al) or tungsten (W), and is provided in a state of being grounded to the sensor board 2 in the opening 47b.

A transparent protective film 48 is provided in the circuit forming region 101 and the scribe region 102 in a state of covering the cap film 46 and the light shielding film 47 on the light receiving surface A. The transparent protective film 48 is made of an insulating material, for example, an acrylic resin, or the like.

In the pixel region 4 of the circuit forming region 101, a color filter 49 corresponding to each photoelectric conversion unit 20 and an on-chip lens 59 are provided on the transparent protective film 48. The color filter 49 is configured with each color corresponding to each photoelectric conversion unit 20. The arrangement of the color filter 49 to each color is not limited. The on-chip lens 59 is configured such that incident light is condensed on each photoelectric conversion unit 20.

Meanwhile, in the peripheral region 7 and the scribe region 102 of the circuit forming region 101, a lens material layer 121 which is integral with the on-chip lens 59 is provided on the transparent protective film 48.

The pad electrode 103 is a part of the wiring 38 which is provided from the circuit forming region 101 to the scribe region 102. Further, wirings 106 constituting the drive circuit of the circuit forming region 101 is connected to the pad electrode 103 by vias.

The opening portion 104 is provided on the pad electrode 103, and opens from the light receiving surface A side to the pad electrode 103. In other words, the opening portion 104 is an opening obtained by engraving the lens material layer 121, the transparent protective film 48, the interface level suppressing film 42, the anti-reflection film 41, the sensor board 2, the inter-layer insulating film 26, the protective film 2b, the protective film 9b, the flattening film 39, and the inter-layer insulating film 36. In addition, wirings 27 constituting the solid state imaging device is not provided in the scribe region 102 of the wiring layer 2a penetrating the opening portion 104.

The conductor layer 105 which is the external connection terminal of the semiconductor device is provided in the opening portion 104. The conductor layer 105 is provided in the side and the lower surface of the opening portion 104. Then, in the lower surface of the opening portion 104, the conductor layer 105 is connected to the pad electrode 103. Therefore, the conductor layer 105 is electrically connected to the wiring 106 of the drive circuit through the pad electrode 103.

Further, in the opening portion 104, the scribe region 102 is provided on an outer peripheral side of the circuit forming region 101 than the conductor layer 105 that is formed on the circuit forming region 101. Therefore, the conductor layer 105 formed on the circuit forming region 101 remains on the side surface of the semiconductor device which is singulated after scribing. The remaining conductor layer 105 is the external connection terminal of the semiconductor device.

The conductor layer 105 on the side surface of the opening portion 104 is formed until the same height as the light receiving surface A of the sensor board 2. In the singulated semiconductor device by dicing, if the conductor layer 105 is formed up to the upper surface of the semiconductor device, there is a possibility that a problem arises due to contact between the conductor layer 105 on the upper surface and an external device. Therefore, the conductor layer 105 is provided up to a position lower than the upper surface.

In the semiconductor device 110 illustrated in FIG. 4, a state of being singulated after scribing is illustrated. In the semiconductor wafer 100 illustrated in FIG. 3, the pad electrode 103 and the conductor layer 105 are formed between the adjacent circuit forming regions 101. Therefore, the circuit board 9 and the wiring layer 9a, the pad electrode 103 and the conductor layer 105 which are formed in the scribe region 102 are removed. Then, the external connection terminal 108 of the semiconductor device 110 is formed from the conductor layer that remains on the side surface of the semiconductor device that is exposed by the scribing. In FIG. 4, the contact jig 109 of the external device is connected to the external connection terminal 108 of the semiconductor device 110.

Figure 5:
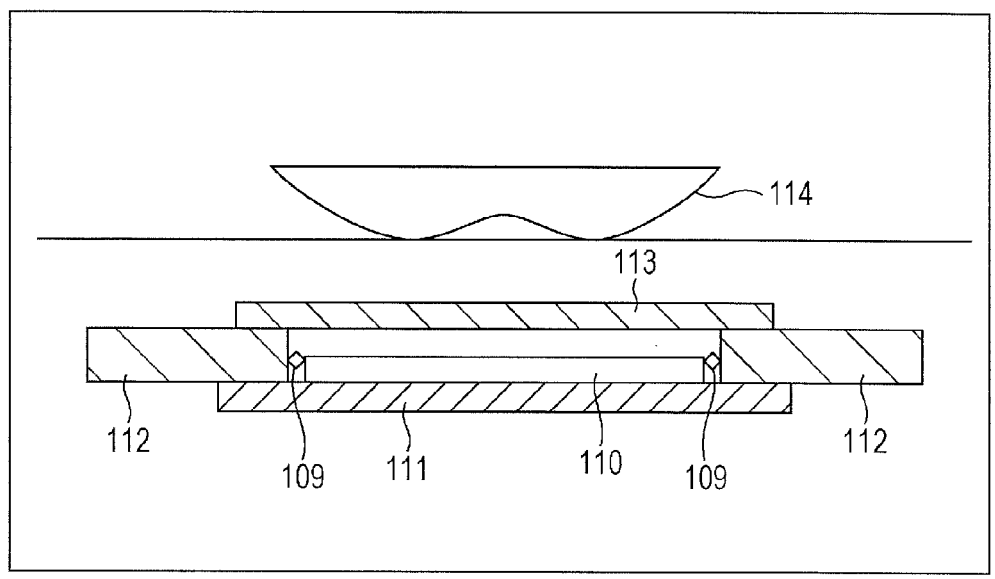
FIG. 5 is a schematic configuration diagram of a solid state imaging device module of the first embodiment.

FIG. 5 illustrates a schematic configuration of a solid state imaging device module, as an example of a semiconductor module on which the semiconductor device 110 described above is mounted.

In the semiconductor module illustrated in FIG. 5, the semiconductor device 110 is arranged on a mounting substrate 111. Then, the contact jig 109 is connected to the side surface of the semiconductor device 110, and the semiconductor device 110 is mounted in the package substrate 112 made of a ceramic package, and the like.

Further, a cover glass 113 covering the semiconductor device 110 is provided on the package substrate 112. Further, a lens 114 is provided on the semiconductor module.

The miniaturization of the semiconductor module is possible by the external connection terminal being provided on the side surface of the semiconductor device 110.

For example, as a general semiconductor device, if the external connection terminal is present on the upper surface of the semiconductor device, a package substrate is connected to the top of the semiconductor device. Therefore, the semiconductor module is configured in such a manner that the supporting substrate, the semiconductor device and the package substrate are laminated. Accordingly, the thickness of the semiconductor module is the total thickness of the supporting substrate, the semiconductor device and the package substrate.

In contrast, as illustrated in FIG. 5, if the external connection terminal is provided in the side surface of the semiconductor device 110, the package substrate 112 is connected to the side surface of the semiconductor device 110. Therefore, the semiconductor device 110 is arranged within the package substrate 112. Accordingly, the total thickness of the supporting substrate and the package substrate is the thickness of the semiconductor module, and thus the miniaturization of the semiconductor module is possible.

3. Manufacturing Method of Semiconductor Device and Semiconductor Wafer of First Embodiment Next, a manufacturing method of the semiconductor device and the semiconductor wafer of the first embodiment illustrated in FIG. 3 and FIG. 4 described above will be described.

Figure 6:
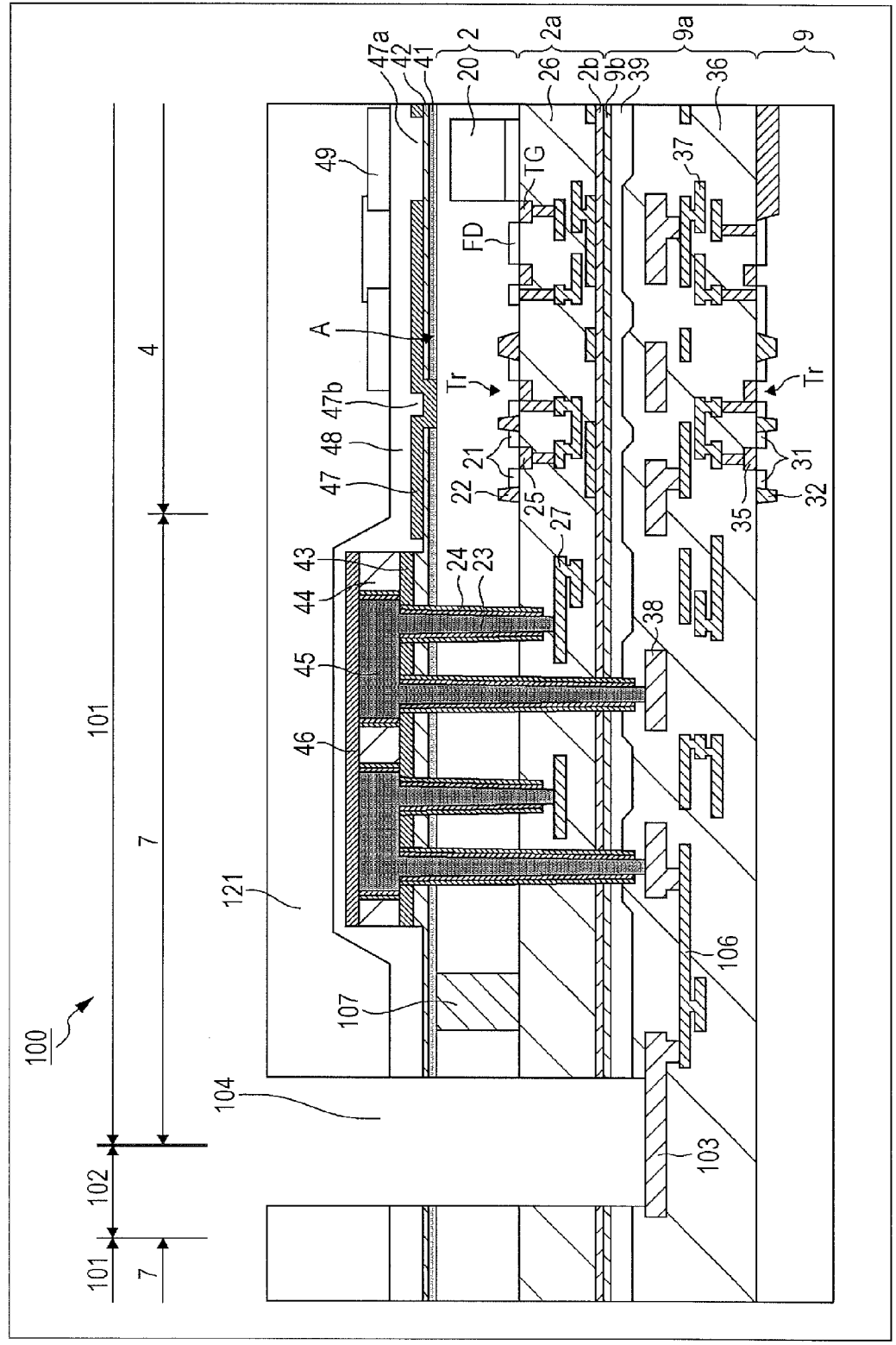
FIG. 6 is a manufacturing process diagram of the semiconductor wafer and the semiconductor device of the first embodiment.

First, as illustrated in FIG. 6, a plurality of photoelectric conversion units 20 are arranged and formed in the pixel regions 4 of the respective circuit forming regions 101 which are set in the sensor board 2, and an impurity layer and an element separator 22 in addition to the source/drain 21 and the floating diffusion FD are formed on the sensor board 2.

Further, the insulating portion 107 is formed in a predetermined position of the sensor board 2. The insulating portion 107 is formed, for example, by engraving the sensor board 2 up to a predetermined depth and by embedding a silicon oxide.

Then, the transfer gates TG and the gate electrodes 25 are formed on the surface of the sensor board 2 and the inter-layer insulating film 26 and the wirings 27 are formed, such that the wiring layer 2a is provided and the upper surface of the wiring layer 2a is covered with the protective film 2b.

Further, an impurity layer and an element separator 32 in addition to the source/drain 31 are formed in the respective circuit forming regions 101 of the circuit board 9. Then, the gate electrode 35 is formed on the surface of the circuit board 9, and then the inter-layer insulating film 36 and the wiring 37 are formed.

Subsequently, a wiring 38 connected to the wiring 37 is formed by vias and is covered with the inter-layer insulating film 36. At this time, in the scribe region 102, a part of the wiring 38 is a pad electrode 103. Further, the pad electrode 103 is provided in a state in which the wiring 106 extended to the scribe region 102 is connected thereto. Thereafter, the upper surface of the inter-layer insulating film 36 having an uneven surface is covered with the flattening film 39, and a wiring layer 9a is provided by flattening the surface and the upper surface of the wiring layer 9a is covered with a protective film 9b.

Next, the sensor board 2 and the circuit board 9 are bonded with the protective film 2b and the protective film 9b, respectively in such a manner that the sensor board 2 and the circuit board 9 face the protective film 2b and the protective film 9b, respectively. After the bonding is ended, the light receiving surface A of the sensor board 2 is thinned as necessary.

The manufacture of the sensor board 2, the manufacture of the circuit board 9, and the bonding process of the sensor board 2 and the circuit board 9 may be performed by methods known in the art.

Next, an anti-reflection film 41, an interface level suppressing film 42, an etching stop film 43, and a wiring groove forming film 44 are laminated and formed on the light receiving surface A of the sensor board 2 in this order. Subsequently, in the peripheral region 7 of the circuit forming region 101, wiring grooves are formed in the wiring groove forming film 44, and contact holes of respective depths of penetrating the sensor board 2 are formed on the lower surface thereof. Next, a separation insulating film 24 is formed in a state that covers the inner wall of the wiring groove and the contact hole, and after exposing the wiring 27 or the wiring 38 in the lower surface of each contact hole, the wiring groove and the contact hole are embedded integrally with a conductive material including, for example, copper. A plurality of penetrating electrodes 23 connected to the wiring 27 or the wiring 38, and wirings 45 connecting the penetrating electrodes 23 are formed through the above processes. Thereafter, a cap film 46 having an anti-diffusion effect for copper (Cu) constituting the wiring 45 is formed in a state in which the wiring 45 and the upper surface of the wiring groove forming film 44 are covered.

Next, in the pixel region 4 and the scribe region 102 of the circuit forming region 101, the cap film 46, the wiring groove forming film 44, and the etching stop film 43 are removed, and two layers including the anti-reflection film 41 and the interface level suppressing film 42 remain on the light receiving surface A.

Thereafter, in the pixel region 4 of the circuit forming region 101, in a position located away from the upper surface of the photoelectric conversion unit 20 on the light receiving surface A, an opening 47b is formed on two layers including the anti-reflection film 41 and the interface level suppressing film 42 so as to expose the sensor board 2. Next, the light shielding film 47, which is grounded in the sensor board 2 through the opening 47b, is patterned on the light receiving surface A in the pixel region 4 of the circuit forming region 101. At this time, the light shielding film 47 is formed using a conductive material film having a light shielding property such as aluminum (Al) or tungsten (W), and is patterned to have a light receiving opening 47a corresponding to the photoelectric conversion unit 20.

After the above process, a transparent protective film 48 made of a material having an optical transparency is formed on the circuit forming region 101 and the scribe region 102, that is, the entire surface of the light receiving surface A, in a state of covering the light shielding film 47 and the cap film 46. At this time, a transparent protective film 48 is formed by a coating method such as a spin coating method. Subsequently, a color filter 49 to each color corresponding to the photoelectric conversion units 20 is formed on the transparent protective film 48 in the pixel region 4 of the circuit forming region 101. Further, a lens material layer 121 is formed on the transparent protective film 48 and the color filter 49.

Next, as illustrated in FIG. 6, the opening portion 104 for exposing the pad electrode 103 is formed on the light receiving surface A, between the end of the circuit forming region 101 and the scribe region 102. In this case, using the resist pattern as a mask, the lens material layer 121, the transparent protective film 48, the interface level suppressing film 42, the anti-reflection film 41, the sensor board 2, the inter-layer insulating film 26, the protective film 2b, the protective film 9b, and the flattening film 39 are removed by being etched sequentially. Subsequently, the etching is ended by etching the inter-layer insulating film 36 and by exposing the pad electrode 103, and thus the opening portion 104 is completed.

Figure 7:
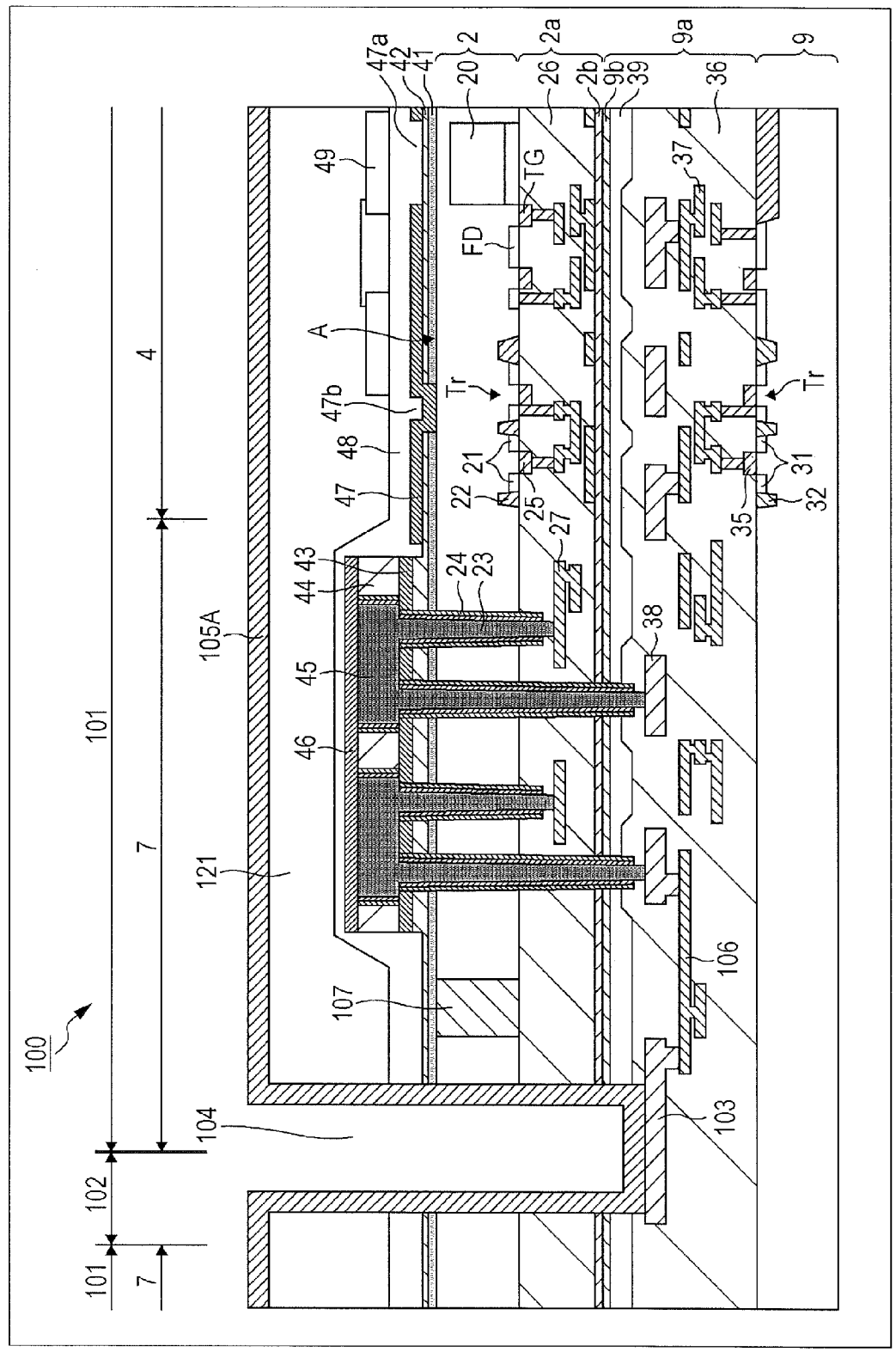
FIG. 7 is a manufacturing process diagram of the semiconductor wafer and the semiconductor device of the first embodiment.

Next, as illustrated in FIG. 7, a conductor layer 105A is formed on the entire surface of the semiconductor wafer 100. At this time, the conductor layer 105A is formed on the side and the lower surface, even in the opening portion 104. Then, the pad electrode 103 and the conductor layer 105A are electrically connected.

Figure 8:
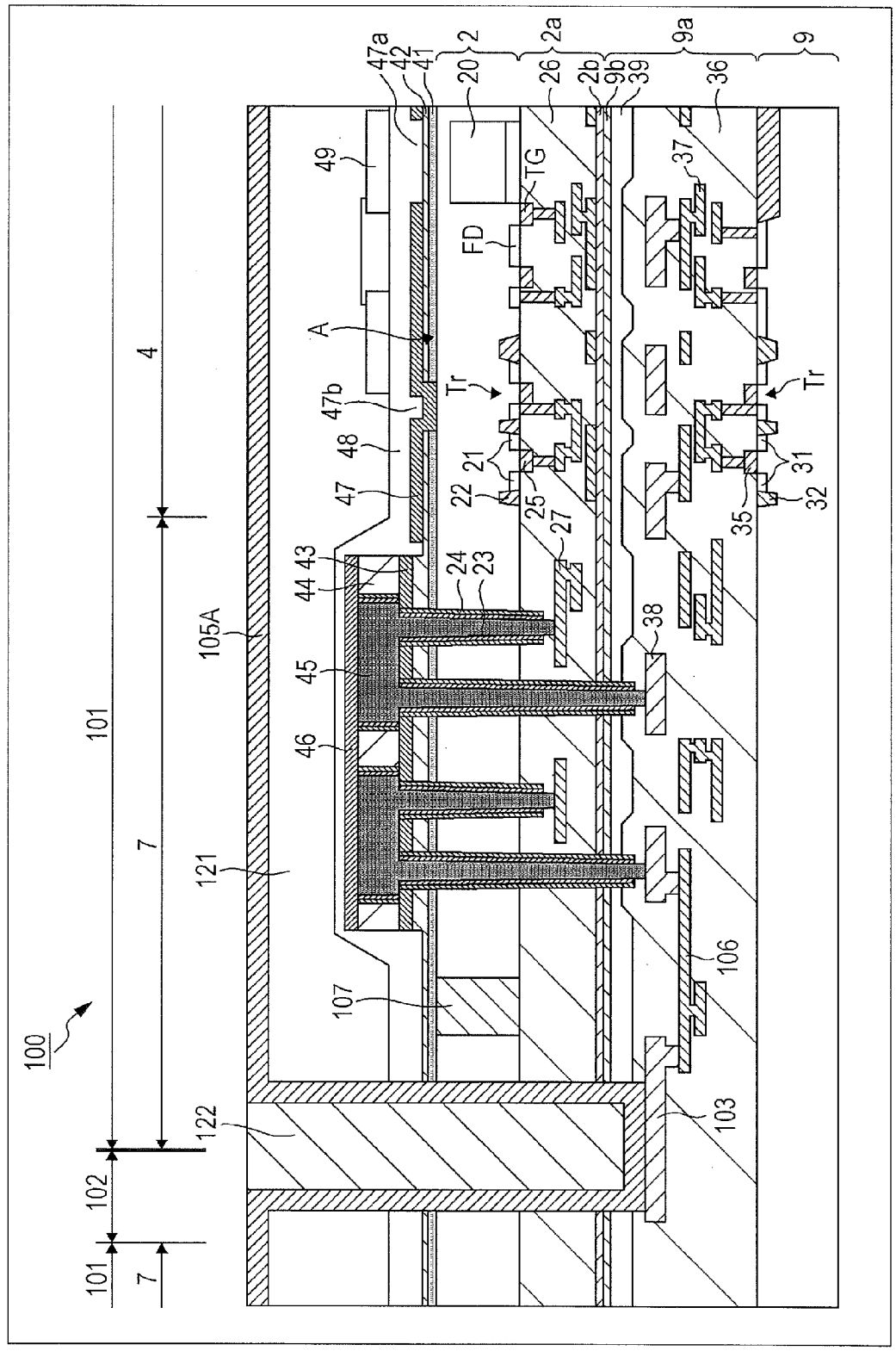
FIG. 8 is a manufacturing process diagram of the semiconductor wafer and the semiconductor device of the first embodiment.

Then, as illustrated in FIG. 8, a resist layer 122 is formed in the opening portion 104. With respect to the resist layer 122, a pattern of the resist layer 122 is formed in a position in which the conductor layer 105A formed on the semiconductor wafer 100 remains.

Figure 9:
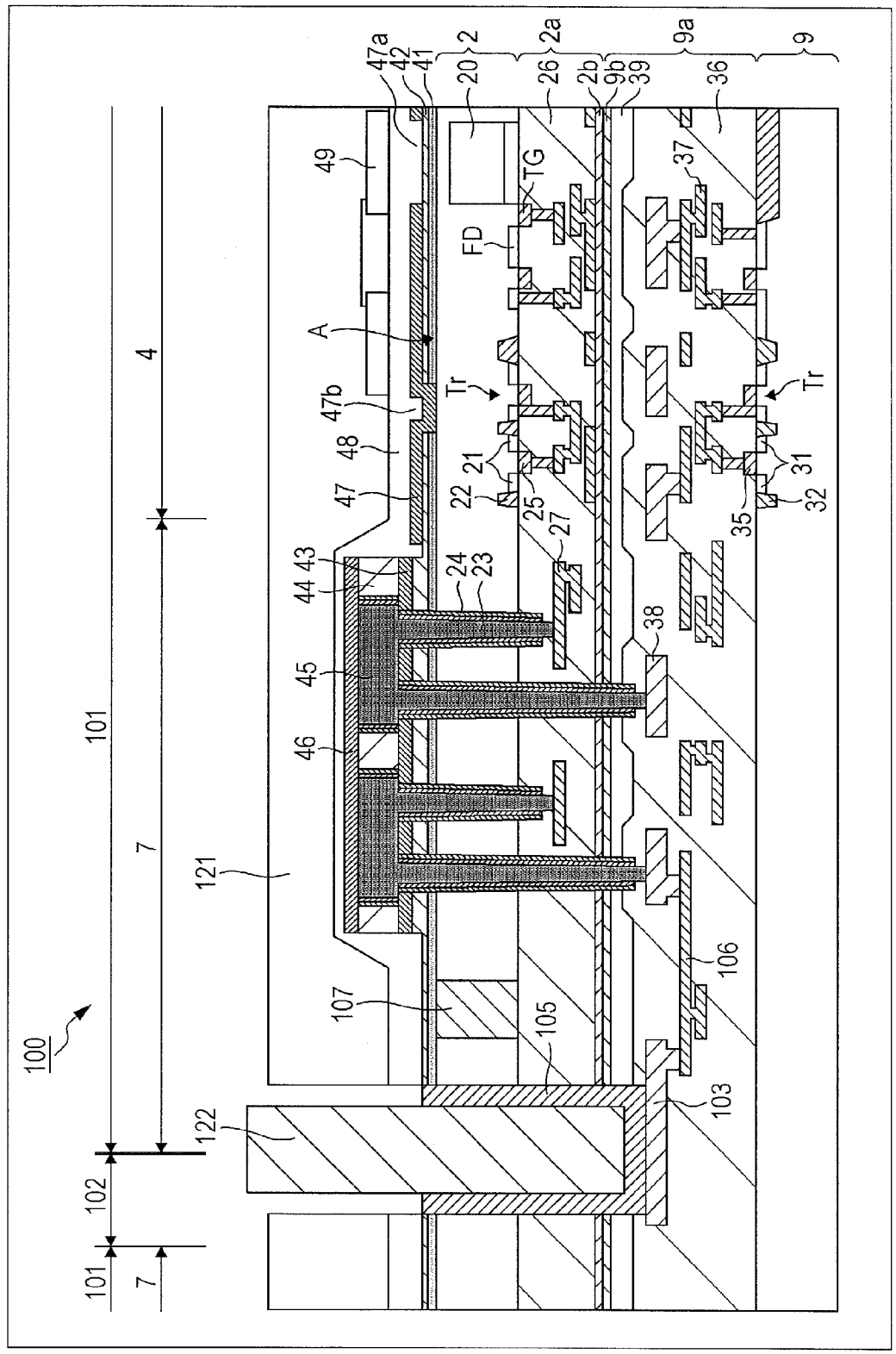
FIG. 9 is a manufacturing process diagram of the semiconductor wafer and the semiconductor device of the first embodiment.

Next, as illustrated in FIG. 9, the conductor layer 105A is removed by dry etching or wet etching, using the resist layer 122 as a pattern mask. The conductor layer 105 in the lower surface of the opening portion 104 in which the resist layer 122 is formed remains by etching. Further, by adjusting the etching time, after etching the conductor layer 105A formed on the lens material layer 121, the conductor layer 105A formed on the side surface of the opening portion 104 is etched to a predetermined depth. For example, the conductor layer is removed to a depth of the light receiving surface of the sensor board 2.

Figure 10:
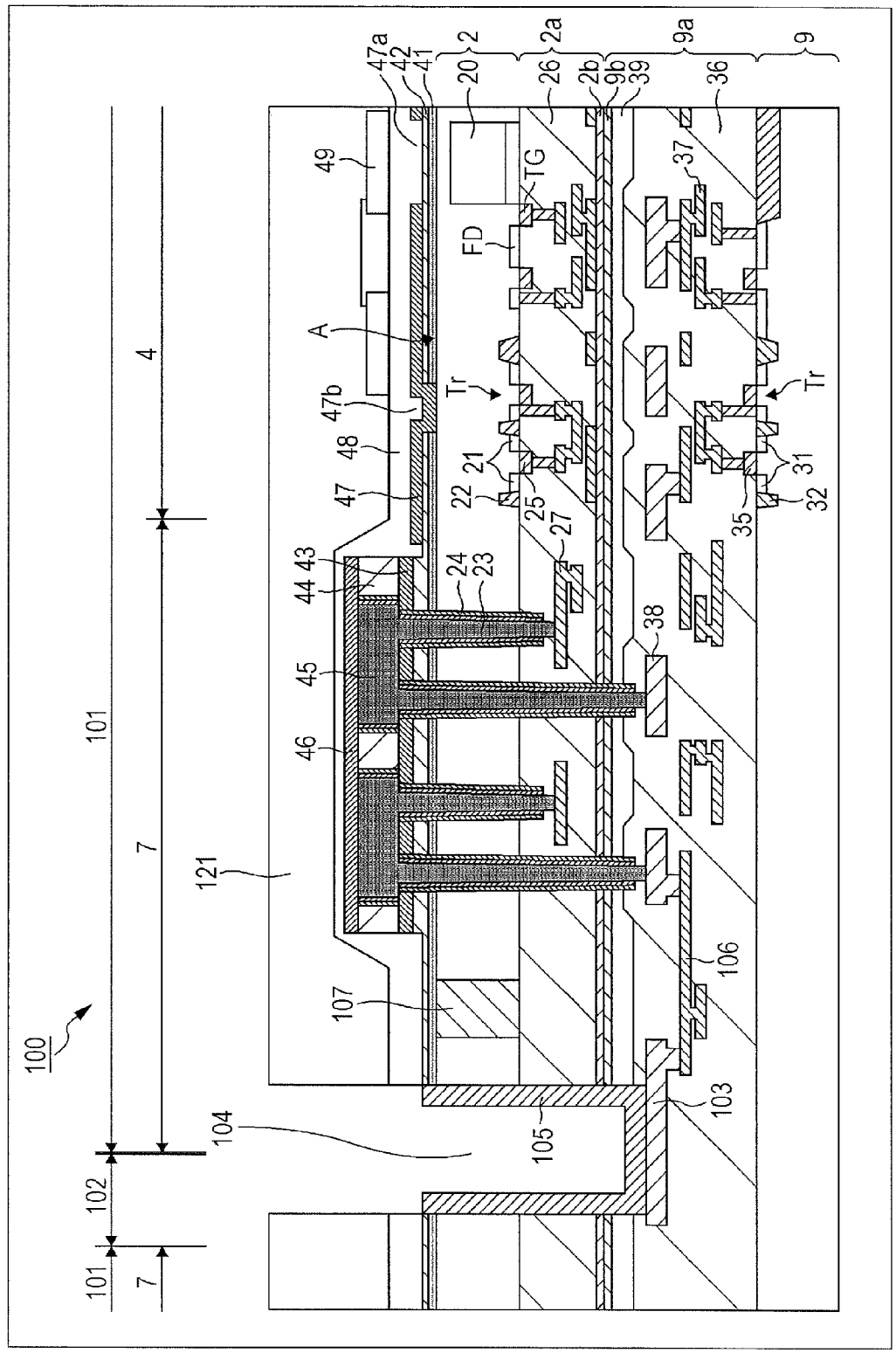
FIG. 10 is a manufacturing process diagram of the semiconductor wafer and the semiconductor device of the first embodiment.

Next, as illustrated in FIG. 10, the resist layer in the opening portion 104 is removed. Thus, the conductor layer 105 formed in the opening portion 104 is exposed. Further, the surface of the lens material layer 121 is smoothed using a CMP method.

Figure 11:
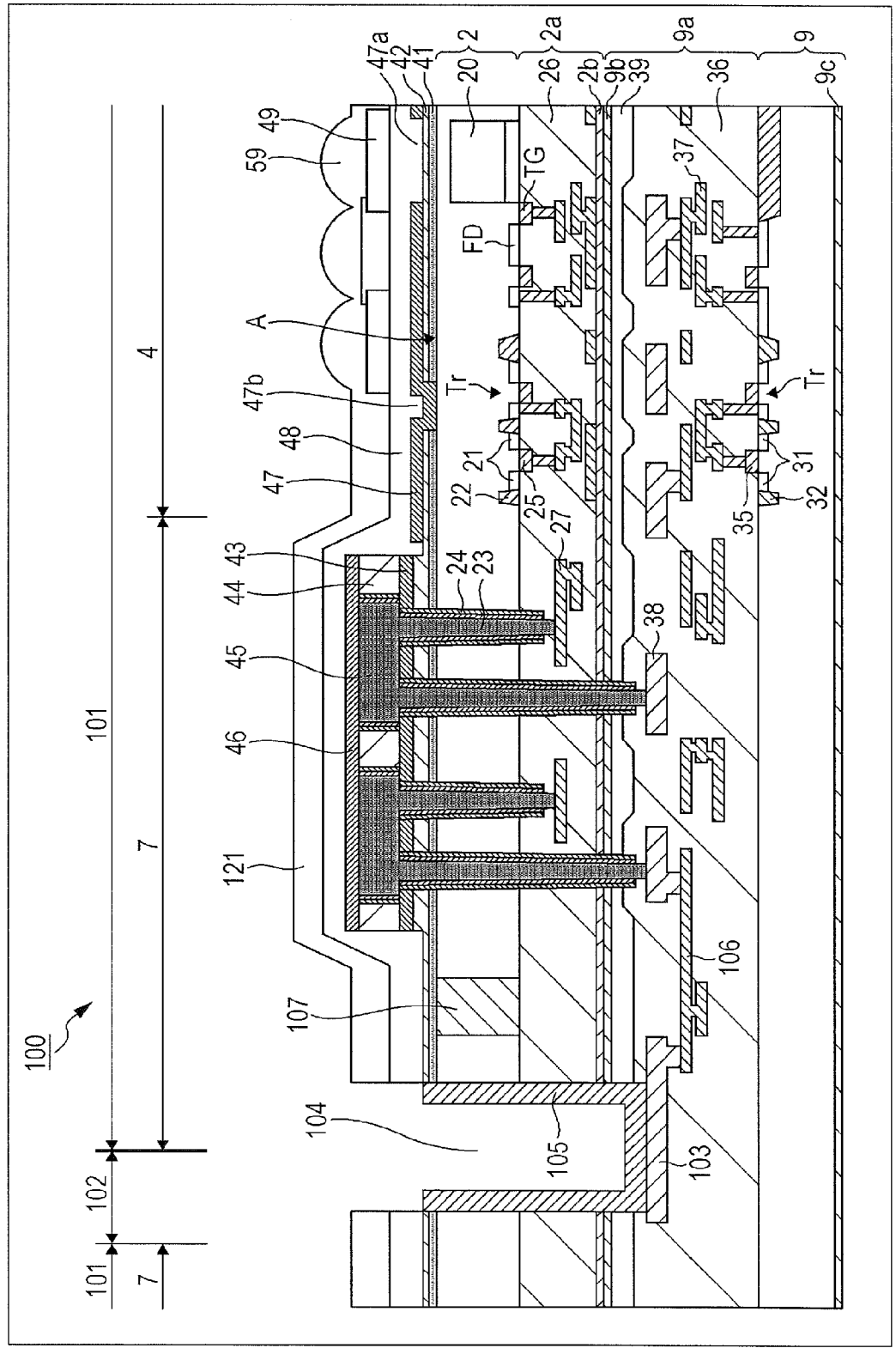
FIG. 11 is a manufacturing process diagram of the semiconductor wafer and the semiconductor device of the first embodiment.

Then, as illustrated in FIG. 11, an on-chip lens 59 corresponding to the photoelectric conversion unit 20 is formed from the smoothened lens material layer 121. When the on-chip lens 59 is formed, the lens material layer 121 which is integral with the on-chip lens 59 remains on the transparent protective film 48 in the peripheral region 7 and the scribe region 102 of the circuit forming region 101.

Further, the circuit board 9 is thinned by polishing the exposed surface of the circuit board 9. Then, a protective film 9c is formed on the back surface of the circuit board 9.

Next, a probe inspection is performed by inserting an inspection needle into the opening portion 104 from the light receiving surface A side and by using the conductor layer 105 formed on the pad electrode 103. The probe inspection is performed in the state of the semiconductor wafer 100 as described above, and an operation checking of the semiconductor devices which are formed in the plurality of circuit forming regions 101 in the semiconductor wafer 100 is performed.

Figure 12:
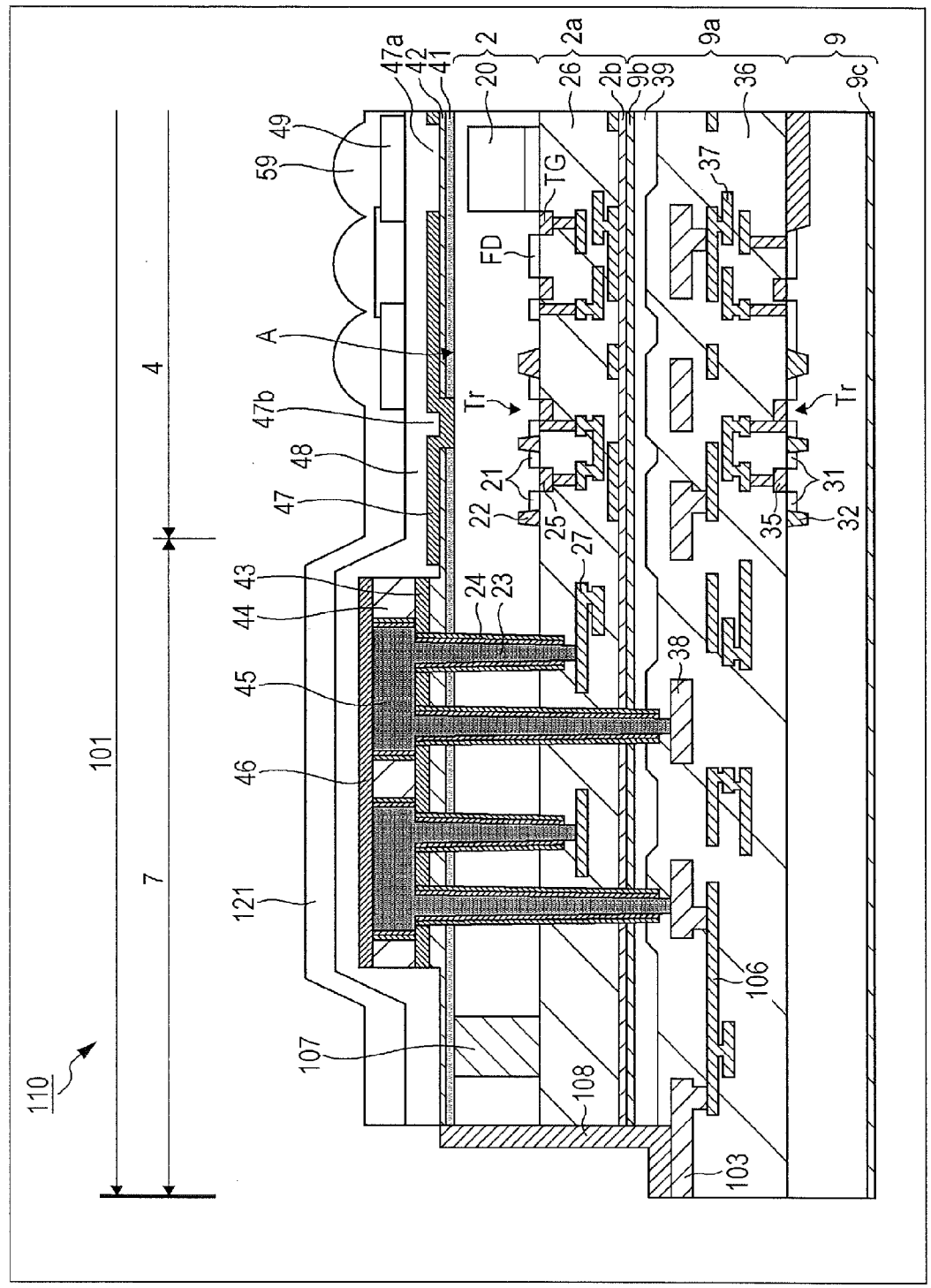
FIG. 12 is a manufacturing process diagram of the semiconductor device of the first embodiment.

Next, as illustrated in FIG. 12, after the probe inspection described above, the scribe region 102 of the wafer is removed by dicing and the circuit forming region 101 is singulated so as to manufacture the semiconductor device 110. The pad electrode 103, the conductor layer 105, and the circuit board 9, which are provided on the scribe region 102, are removed by the dicing. Then, the external connection terminal 108 of the semiconductor device 110 is formed, from the conductor layer 105 which remains on the side surface of the semiconductor device 110. Further, the pad electrode 103 is cut by dicing, and only a portion which has been located in the wiring layer 9a remains in the semiconductor device 110.

By the above-mentioned process, it is possible to manufacture the semiconductor device 110. Then, the process proceeds to the next assembly process using only the manufactured semiconductor devices 110 that pass the probe inspection as described above. By the assembly process, the external connection terminal 108 on the side surface of the semiconductor device 110 is connected to the external device so as to constitute a semiconductor module as illustrated in FIG. 5 described above.

According to the semiconductor wafer and the semiconductor device described above, the pad electrode for inspection is formed on the scribe region, and an opening portion for exposing the pad electrode is provided on the upper surface of the semiconductor wafer. Then, a conductor layer is formed on the lower surface and the side surface of the opening portion.

Further, an external connection terminal configured with a conductor layer is formed on the side surface of the semiconductor device that is singulated after the scribing, by dicing in the opening portion while leaving the conductor layer of the circuit forming region side in the opening portion.

In this manner, since the conductor layer connected to the pad electrode on the upper surface from the opening portion is exposed in the wafer state, the inspection of the semiconductor device is facilitated.

Further, since the external connection terminal is formed on the side surface of the semiconductor device by scribing, a region for providing terminals on the upper surface of the semiconductor device is not required and thus it is possible to increase the area ratio of the circuit forming region in the semiconductor chip.

4. Second Embodiment

Semiconductor Device and Semiconductor Wafer

Next, a second embodiment of the semiconductor device and the semiconductor wafer will be described. In the second embodiment, only the configuration regarding the external connection terminal of the semiconductor device is changed from the first embodiment. Therefore, in the following description of the second embodiment, only components different from those in the first embodiment described above will be described, and with respect to the respective components formed in the circuit forming region, the description regarding the same components as those of the first embodiment will be omitted.

Figure 13:
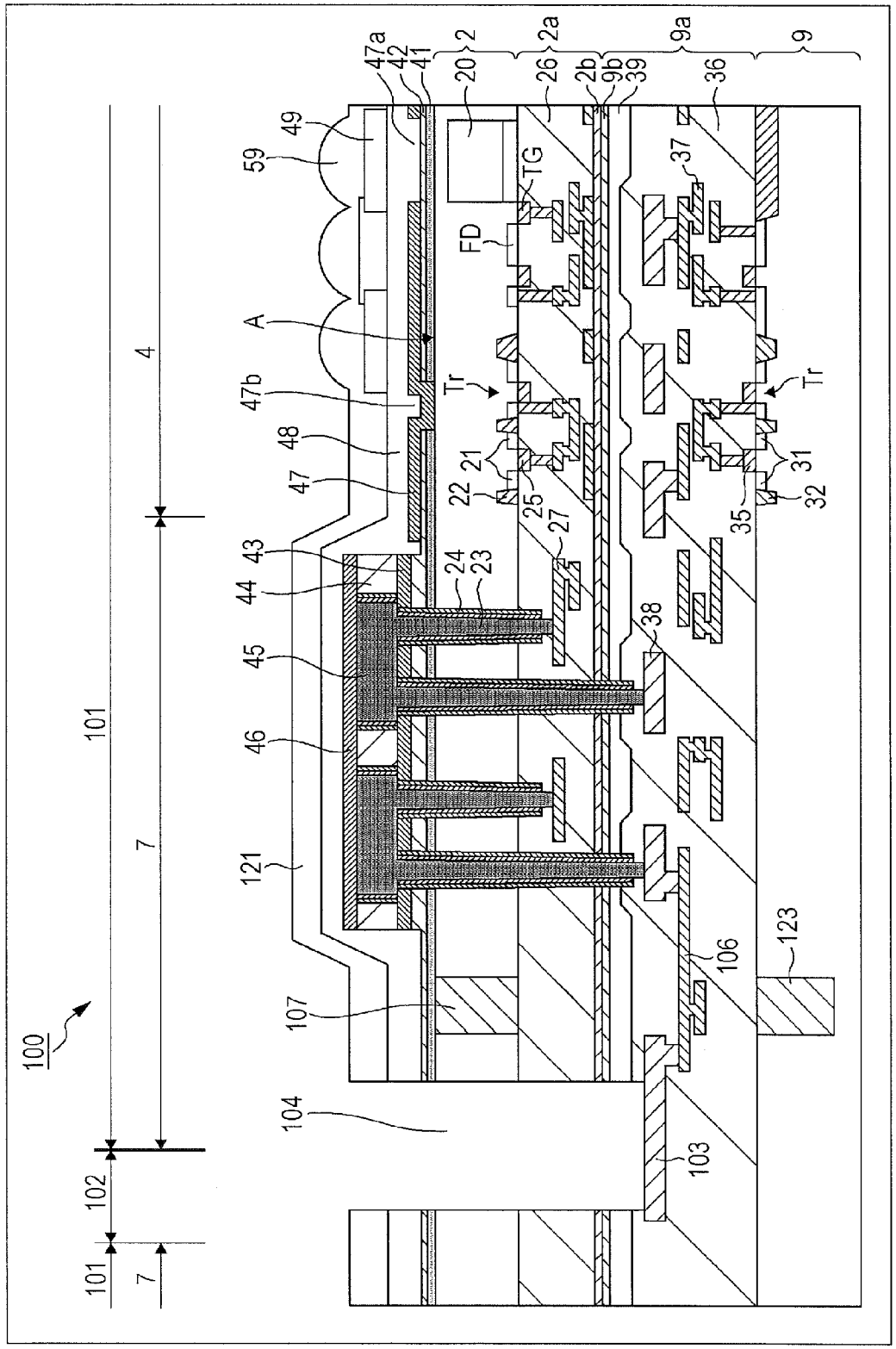
FIG. 13 is a diagram illustrating a configuration of the semiconductor wafer of a second embodiment.

FIG. 13 illustrates the configuration of the semiconductor wafer. Further, FIG. 14 illustrates the configuration of the semiconductor device.

The semiconductor wafer 100 illustrated in FIG. 13 is in a state in which the conductor layer formed in the opening portion 104 is removed from the semiconductor wafer of the first embodiment described above. In the semiconductor wafer 100 of the state, the pad electrode for inspection 103 is exposed to the light receiving surface A side of the semiconductor wafer 100 by the opening portion 104. Therefore, a probe inspection is performed in the state of the semiconductor wafer 100 by inserting an inspection needle from the light receiving surface A side, and thus it is possible to perform an operation checking of the semiconductor devices which are formed in the plurality of circuit forming regions 101 in the semiconductor wafer 100.

Further, in the semiconductor wafer 100, the insulating portion 123 is formed on the circuit board 9. The insulating portion 123 is provided on the outer peripheral side of the circuit configured with respective active elements configured in the circuit board 9 and wiring penetrating the sensor board 2, and the like. In the process of forming a semiconductor device, the insulating portion 123 is formed to a depth which is equal to or greater than the thickness of the circuit board 9 to be thinned. For example, it is formed to about 100 µm. The insulating portion 123 is continuously formed so as to surround the circuit board 9 in the peripheral region 7 of the circuit board 9.

Figure 14:
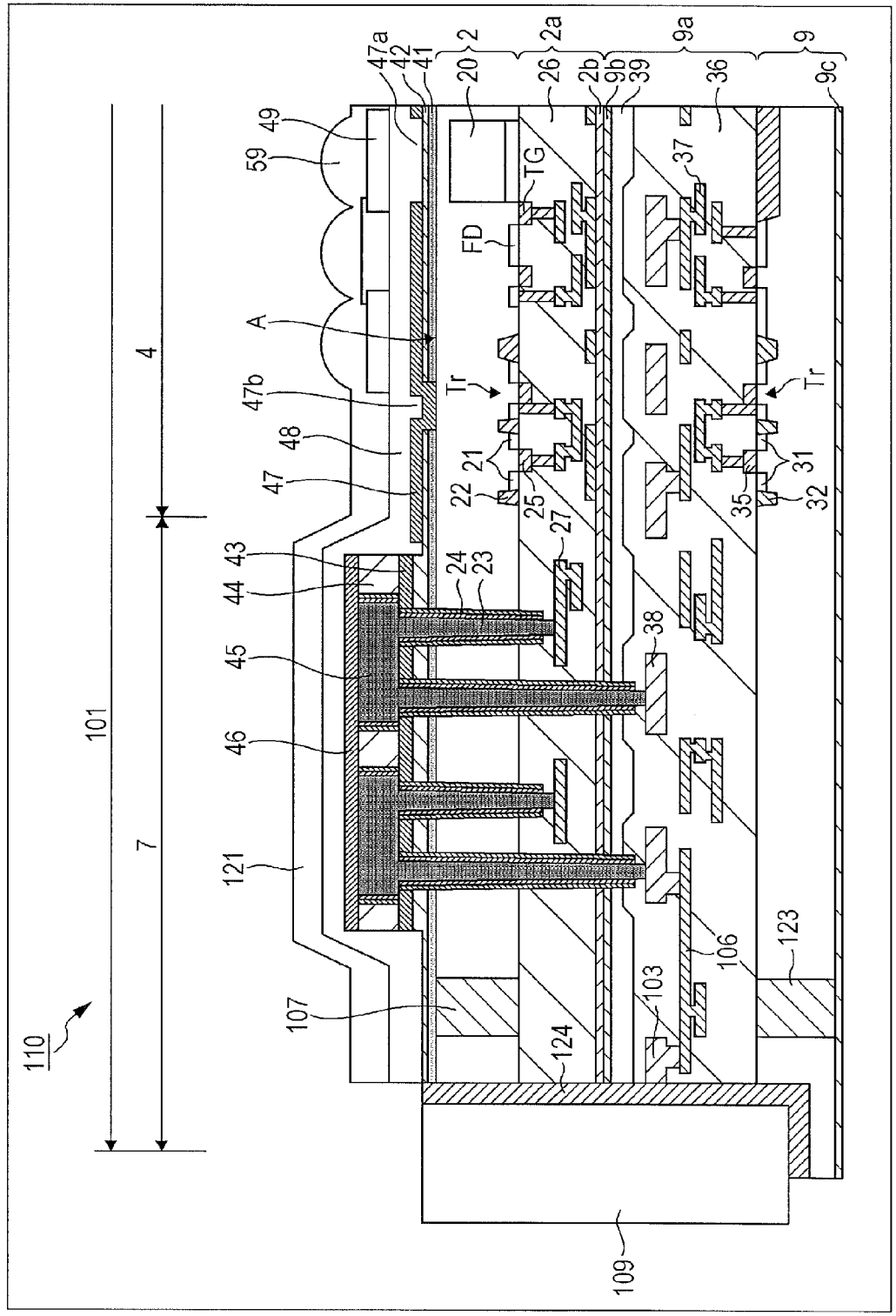
FIG. 14 is a diagram illustrating a configuration of the semiconductor device of the second embodiment.

The semiconductor device 110 illustrated in FIG. 14 is in a state in which the circuit forming region is singulated after the scribing of the semiconductor wafer 100 illustrated in FIG. 13.

The semiconductor device 110 includes the external connection terminal 124 on the side surface of the semiconductor device 110. The external connection terminal 124 is continuously formed in the light receiving surface A of the sensor board 2 to the inside of the circuit board 9, on the side surface of the semiconductor device 110. Further, the external connection terminal 124 is connected to the pad electrode 103 which is exposed from the side surface of the opening portion 126.

The external connection terminal 124, preferably, is formed close to the back surface side of the circuit board 9 such that the connected area is enlarged. However, in order to avoid contact with the outside unexpectedly, it is preferable to leave the circuit board 9 at the end portion of the back surface side, without completely covering the back surface.

Further, the semiconductor wafer illustrated in FIG. 13 is in a state of an inspection time when the semiconductor device is inspected in the wafer state. Therefore, in the semiconductor wafer 100 described above, the conductor layer constituting the external connection terminal 124 is not formed. In the semiconductor wafer 100 after the inspection in the wafer state, the opening portion 104 is engraved up to the circuit board 9 and the conductor layer is formed in the opening portion after engraving. The configuration of the semiconductor wafer 100 before dicing, in a state in which the conductor layer as the external connection terminal of the semiconductor device 110 is formed will be illustrated in the following description of the manufacturing method.

5. Manufacturing Method of Semiconductor Device and Semiconductor Wafer of Second Embodiment Next, a manufacturing method of the semiconductor device and the semiconductor wafer which are illustrated in FIG. 13 and FIG. 14 described above will be described.

Further, the manufacturing method of the second embodiment, up to the process of forming the opening portion 104 to expose the pad electrode for inspection 103 on the light receiving surface A side, is the same as that in the first embodiment described above, except for an addition of a process of forming the insulating portion 123 on the circuit board 9. Therefore the same description as that of the first embodiment will be omitted.

The sensor board 2 is formed by the same method as that of the first embodiment described above. The wiring layer 2a and the protective film 2b which are formed on the sensor board 2 are formed similarly.

Then, similarly to the first embodiment, an impurity layer and an element separator 32 in addition to the source/drain 31 are formed on each circuit forming region 101 of the circuit board 9. Further, the insulating portion 123 is formed in a predetermined position of the circuit board 9. The insulating portion 123 is formed, for example, by engraving the circuit board 9 up to a predetermined depth and by embedding a silicon oxide.

Then, the wiring layer 9a and the protective film 9b are formed similarly on the circuit board 9.

Next, the sensor board 2 and the circuit board 9 are bonded with the protective film 2b and the protective film 9b, respectively in such a manner that the sensor board 2 and the circuit board 9 face the protective film 2b and the protective film 9b, respectively. After the bonding is ended, the light receiving surface A side of the sensor board 2 is thinned as necessary. Then, similarly to the first embodiment, a penetrating electrode 23 which penetrates the sensor board 2 and a wiring 45 connecting the penetrating electrodes 23 are formed. Further, the light shielding film 47, the transparent protective film 48, the color filter 49, and the on-chip lens 59 are formed.

Next, as illustrated in FIG. 6, the opening portion 104 for exposing the pad electrode for inspection 103 is formed on the light receiving surface A side, between the end of the circuit forming region 101 and the scribe region 102. In this case, using the resist pattern as a mask, the lens material layer 121, the transparent protective film 48, the interface level suppressing film 42, the anti-reflection film 41, the sensor board 2, the inter-layer insulating film 26, the protective film 2b, the protective film 9b, and the flattening film 39 are removed by being etched sequentially. Subsequently, the etching is ended by etching the inter-layer insulating film 36 and by exposing the pad electrode 103, and thus the opening portion 104 is completed.

By the above process, a semiconductor wafer at a time of the inspection process illustrated in FIG. 13 described above is formed.

Next, a probe inspection is performed by inserting an inspection needle into the opening portion 104 from the light receiving surface A side and by using the pad electrode 103.

In this manner, the probe inspection is performed in the state of the semiconductor wafer 100, and an operation checking of the semiconductor devices which are formed in the plurality of circuit forming regions 101 in the semiconductor wafer 100 is performed.

Figure 15:
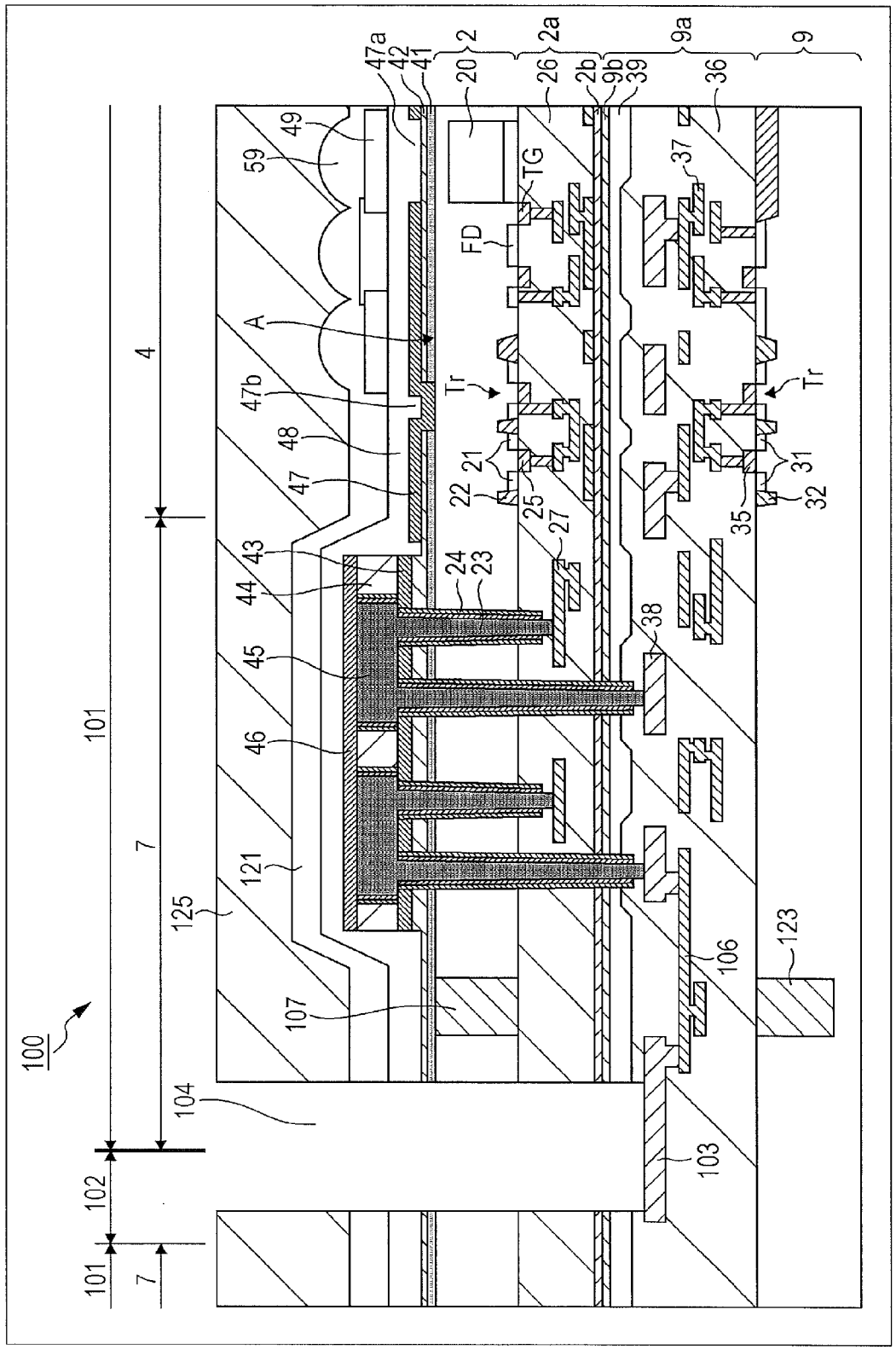
FIG. 15 is a manufacturing process diagram of the semiconductor wafer and the semiconductor device of the second embodiment.

Next, as illustrated in FIG. 15, a resist layer 125 is formed on the lens material layer 121. The resist layer 125 is formed to cover regions other than the opening portion 104, in the semiconductor wafer 100.

Figure 16:
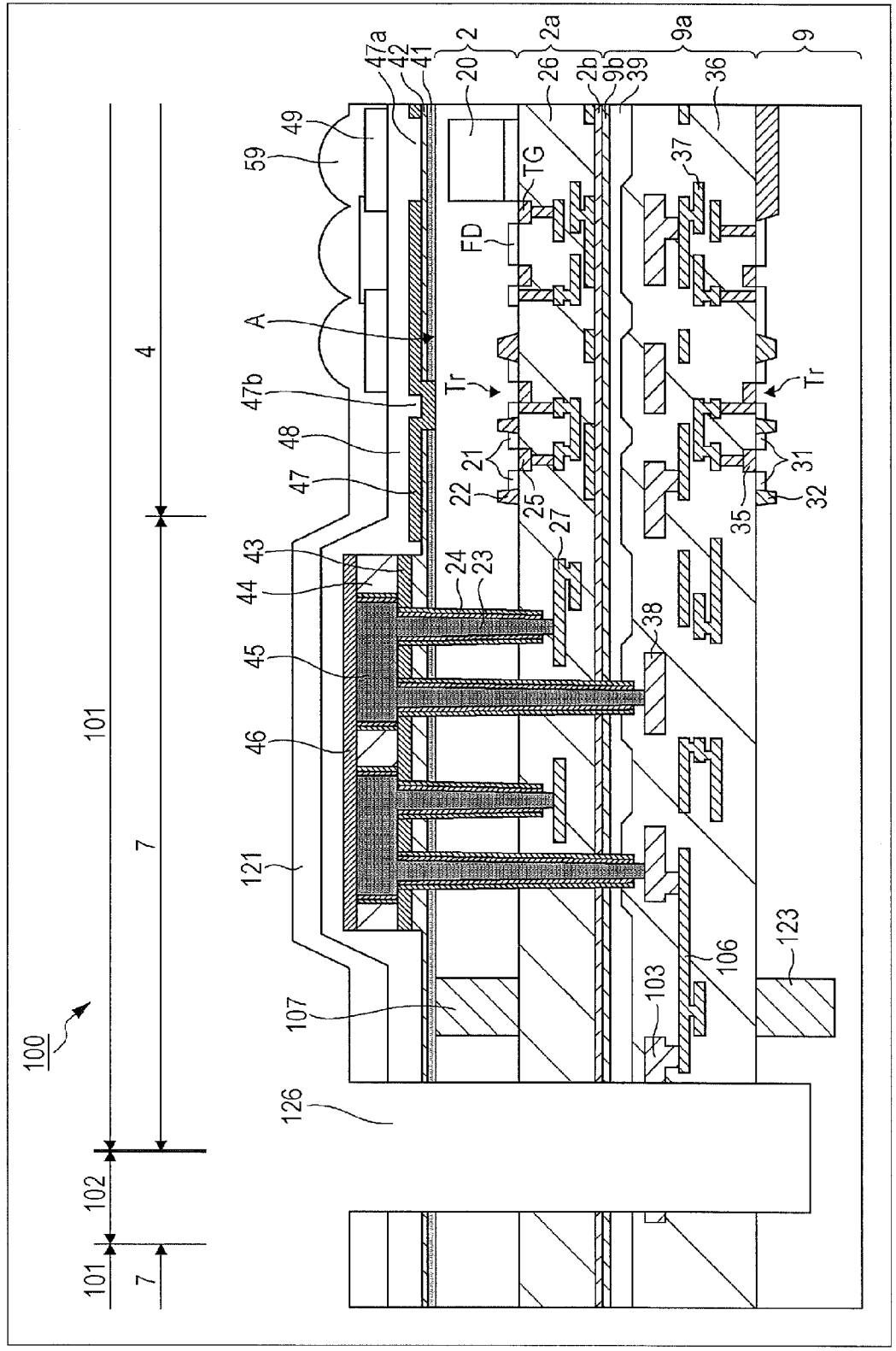
FIG. 16 is a manufacturing process diagram of the semiconductor wafer and the semiconductor device of the second embodiment.

Then, the opening portion 104 is further deeply engraved by using the resist layer 125 as a mask. At this time, the pad electrode 103, the wiring layer 9a, and the circuit board 9 which are exposed through the opening portion 104 are removed by wet etching or dry etching. Thus, as illustrated in FIG. 16, the opening portion 126 which has been further deeply engraved than the depth at the inspection time is formed. Further, after the formation of the opening portion 126, the resist layer 125 is removed.

The pad electrode 103 which is exposed through the opening portion 104 is removed by the formation of the opening portion 126. The pad electrode 103 which is embedded in the wiring layer 9a and is not exposed from the opening portion 104 remains in the circuit forming region 101. The remaining pad electrode 103 is exposed from the side surface of the opening portion 126.

Figure 17:
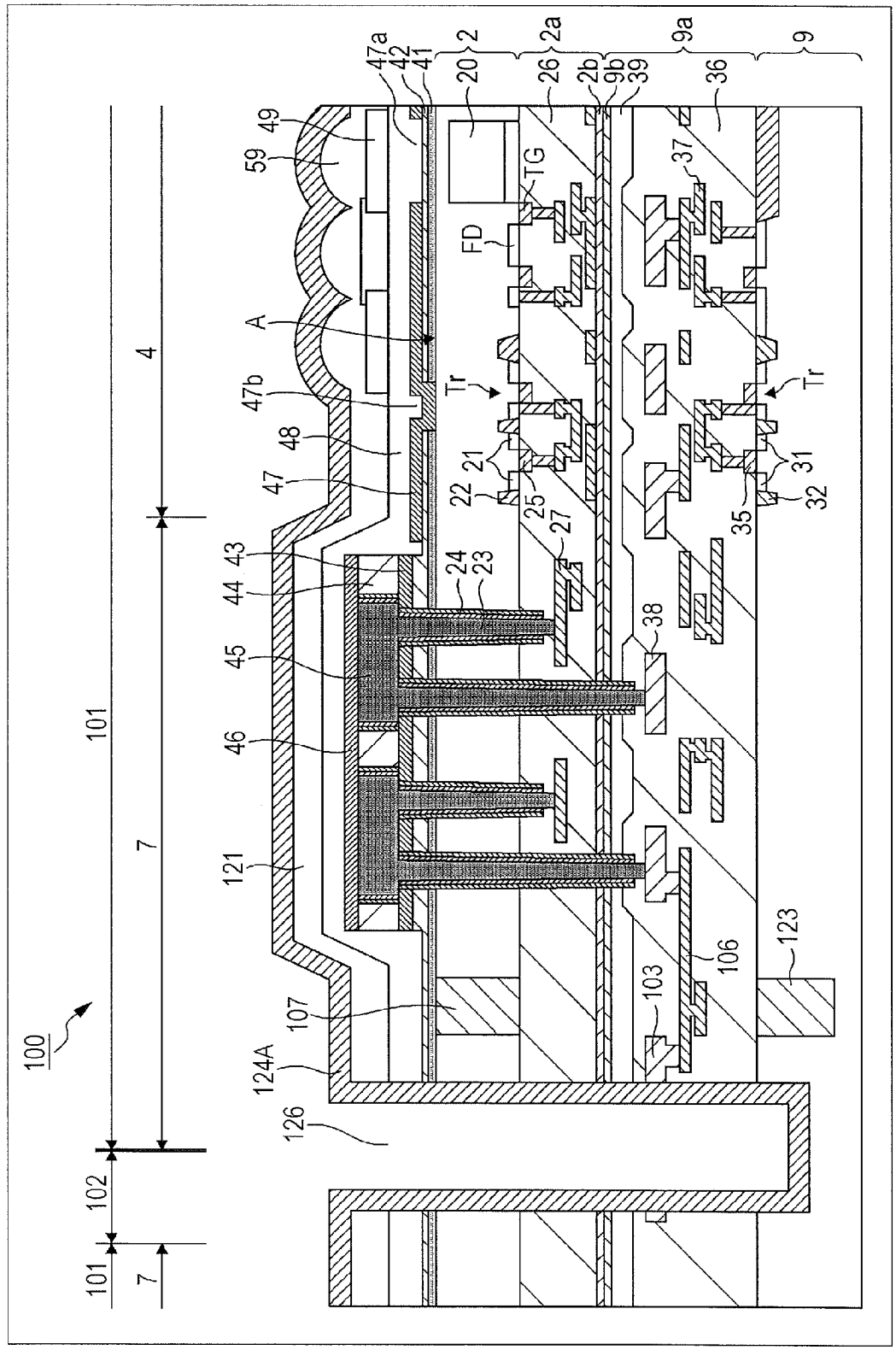
FIG. 17 is a manufacturing process diagram of the semiconductor wafer and the semiconductor device of the second embodiment.
Figure 18:
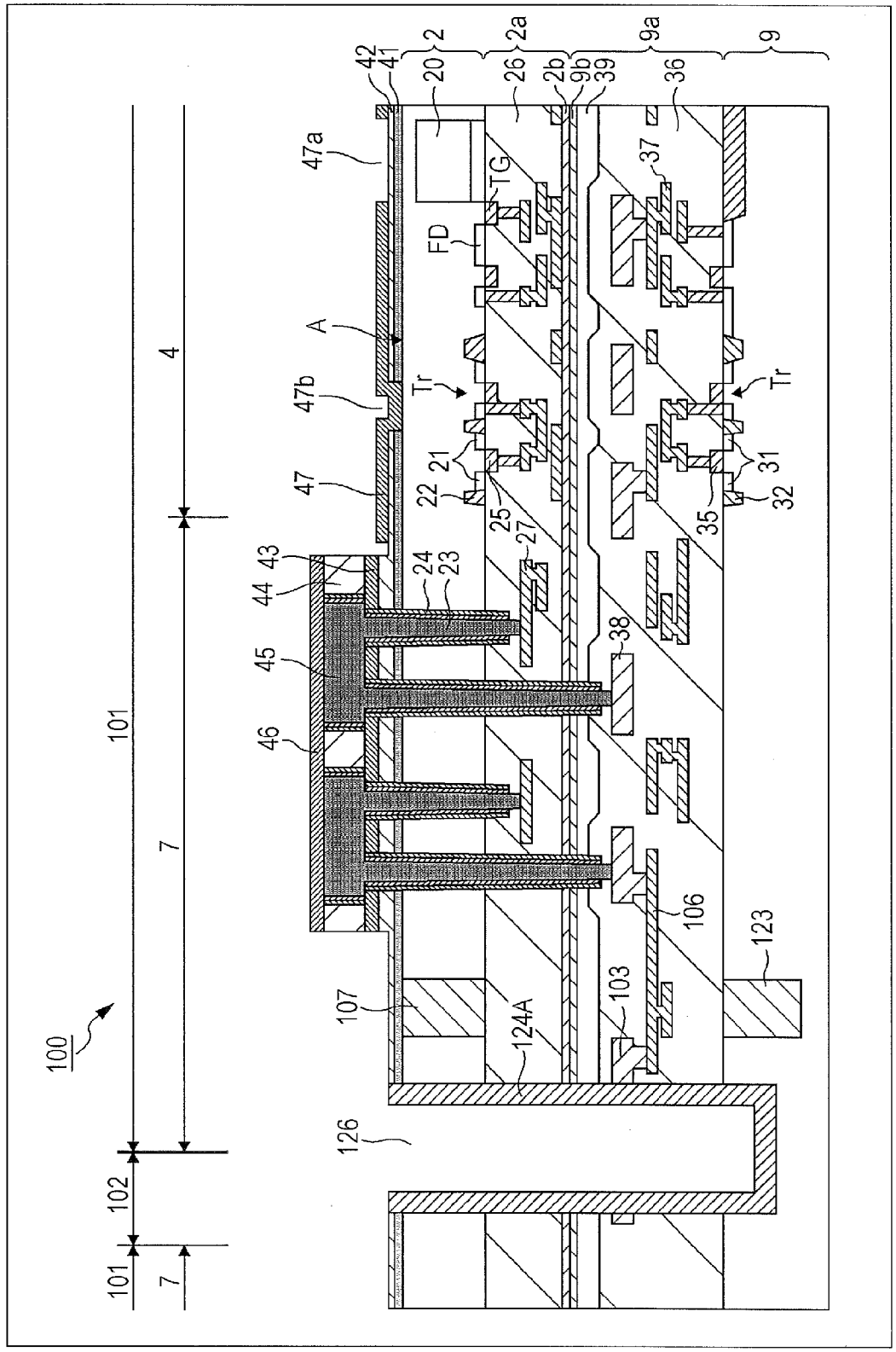
FIG. 18 is a manufacturing process diagram of the semiconductor wafer and the semiconductor device of the second embodiment.

Next, as illustrated in FIG. 17, a conductor layer 124A is formed on the entire surface of the semiconductor wafer 100. At this time, the conductor layer 124A is formed in the side surface and the lower surface of the opening portion 126. At this time, the pad electrode 103 and the conductor layer 124A which remain in the circuit forming region 101 are electrically connected. Then, as illustrated FIG. 18, similarly to the first embodiment, a resist layer is formed in the opening portion 126, and the conductor layer 124A is removed by dry etching or wet etching. The conductor layer 124A remains on the lower part and the side surface of the opening portion 126 by etching. Further, after etching the conductor layer 124A, the transparent protective film 48, the color filter 49, the lens material layer 121, and the on-chip lens 59 are removed.

The conductor layer 124A is directly formed on the lens material layer 121. Therefore, it is difficult to remove the conductor layer 124A, without damaging the on-chip lens 59 and the lens material layer 121. Therefore, the on-chip lens 59 and the color filter 49 which have been damaged are removed.

Further, the conductor layer 124A that is formed on the side surface of the opening portion 104 is etched to the same height as the lower surface of the film which is removed on the back surface side of the sensor board 2. In other words, in FIG. 18, the conductor layer 124A is etched to the same height as the interface level suppressing film 42 which is formed on the back surface of the sensor board 2.

Figure 19:
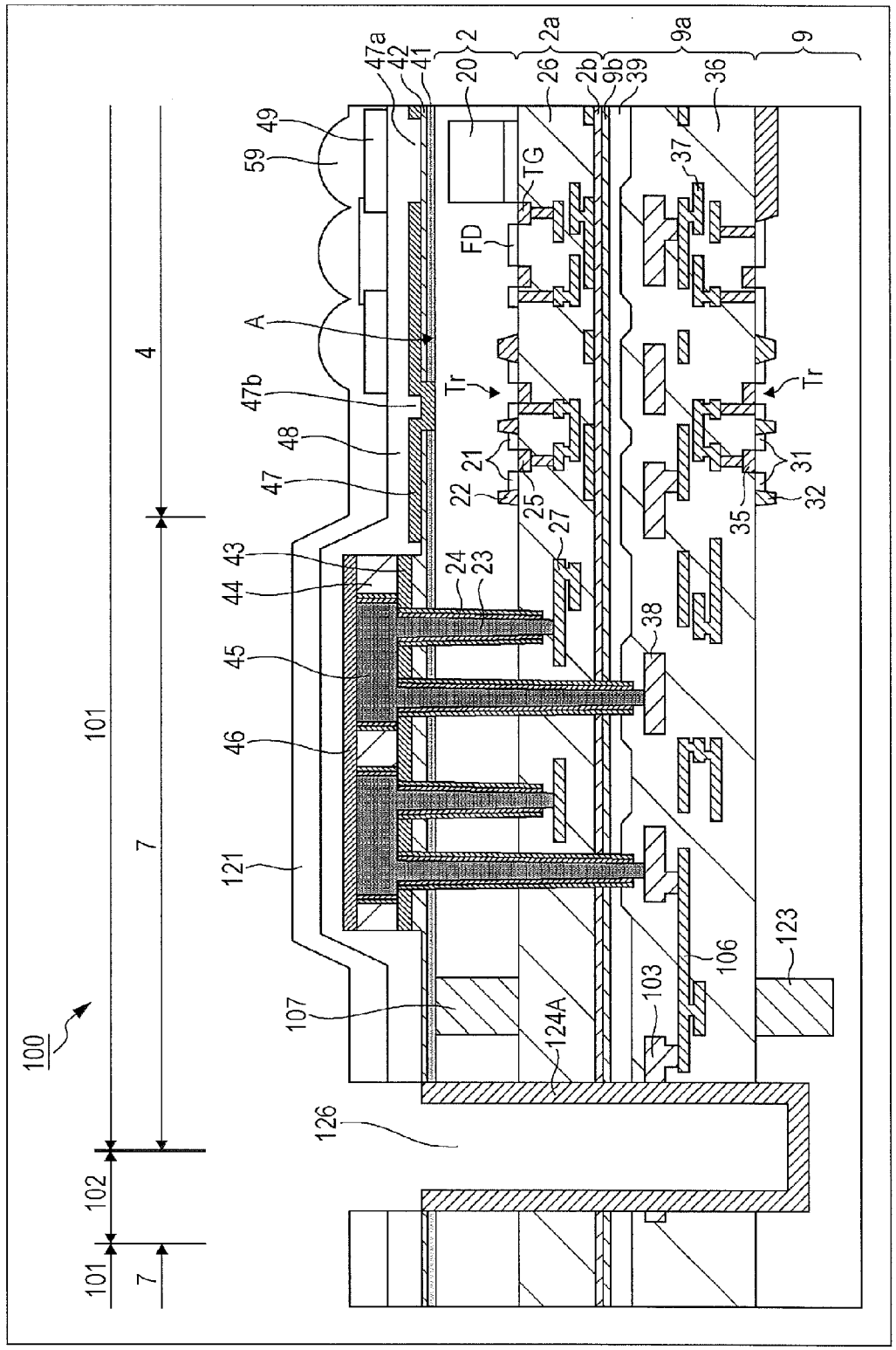
FIG. 19 is a manufacturing process diagram of the semiconductor wafer and the semiconductor device of the second embodiment.

Next, as illustrated in FIG. 19, an optical member such as the on-chip lens 59 and the color filter 49 which has been removed during the formation process of the conductor layer 124A is formed again. The manufacturing method herein is the same as the manufacturing method of the respective components described above. In the process, the same components as those before the formation of the conductor layer 124A are formed on the back surface of the sensor board 2.

In order to evaluate the characteristics of the semiconductor device, the optical member such as the on-chip lens 59 and the color filter 49 is required at the time of the inspection of the semiconductor device. Therefore, the optical member is required to be formed at the time of the inspection in the wafer state.

However, during the formation process of the external connection terminal, damage occurs in the optical member. Therefore, the damaged optical member is removed out of the optical members which are formed at the time of inspection. Then, after the external connection terminal is formed, a new optical member of the same configuration is formed.

Figure 20:
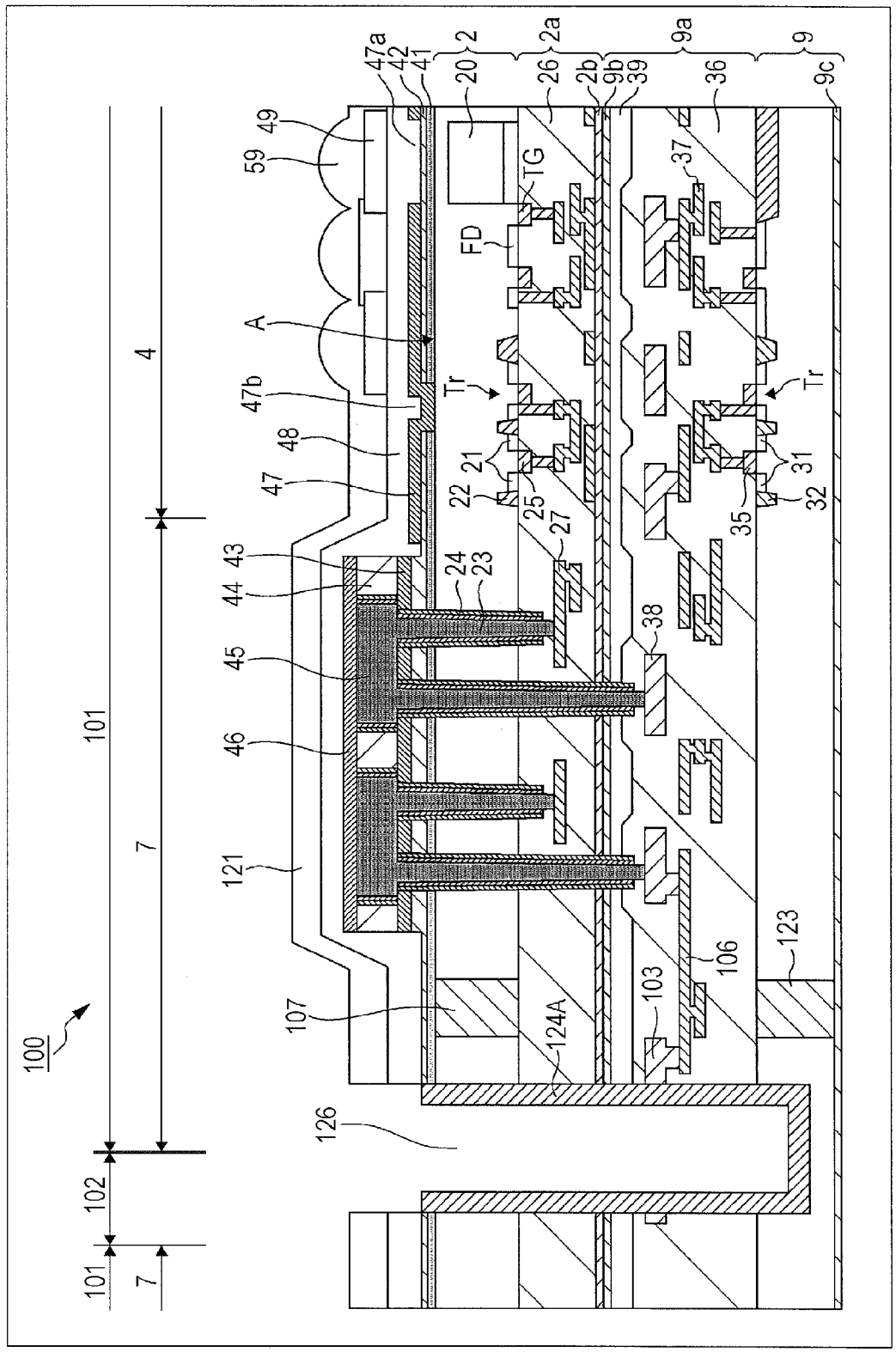
FIG. 20 is a manufacturing process diagram of the semiconductor wafer and the semiconductor device of the second embodiment.

Next, as illustrated in FIG. 20, the circuit board 9 is thinned by polishing the back surface. At this time, the circuit board 9 is thinned until the insulating portion 123 provided in the circuit board 9 is exposed up to the back surface of the circuit board 9. Then, the circuit board 9 is thinned up to a position at which the circuit board 9 remains below the conductor layer 124A, without the conductor layer 124A being exposed to the back surface.

By reducing the thickness of the circuit board 9 until the insulating portion 123 is exposed, the elements such as various transistors formed on the circuit board 9 and the conductor layer 124A are able to be insulated by the insulating portion 123.

Further, after the circuit board 9 is thinned, a protective film 9c is formed on the back surface of the circuit board 9.

Figure 21:
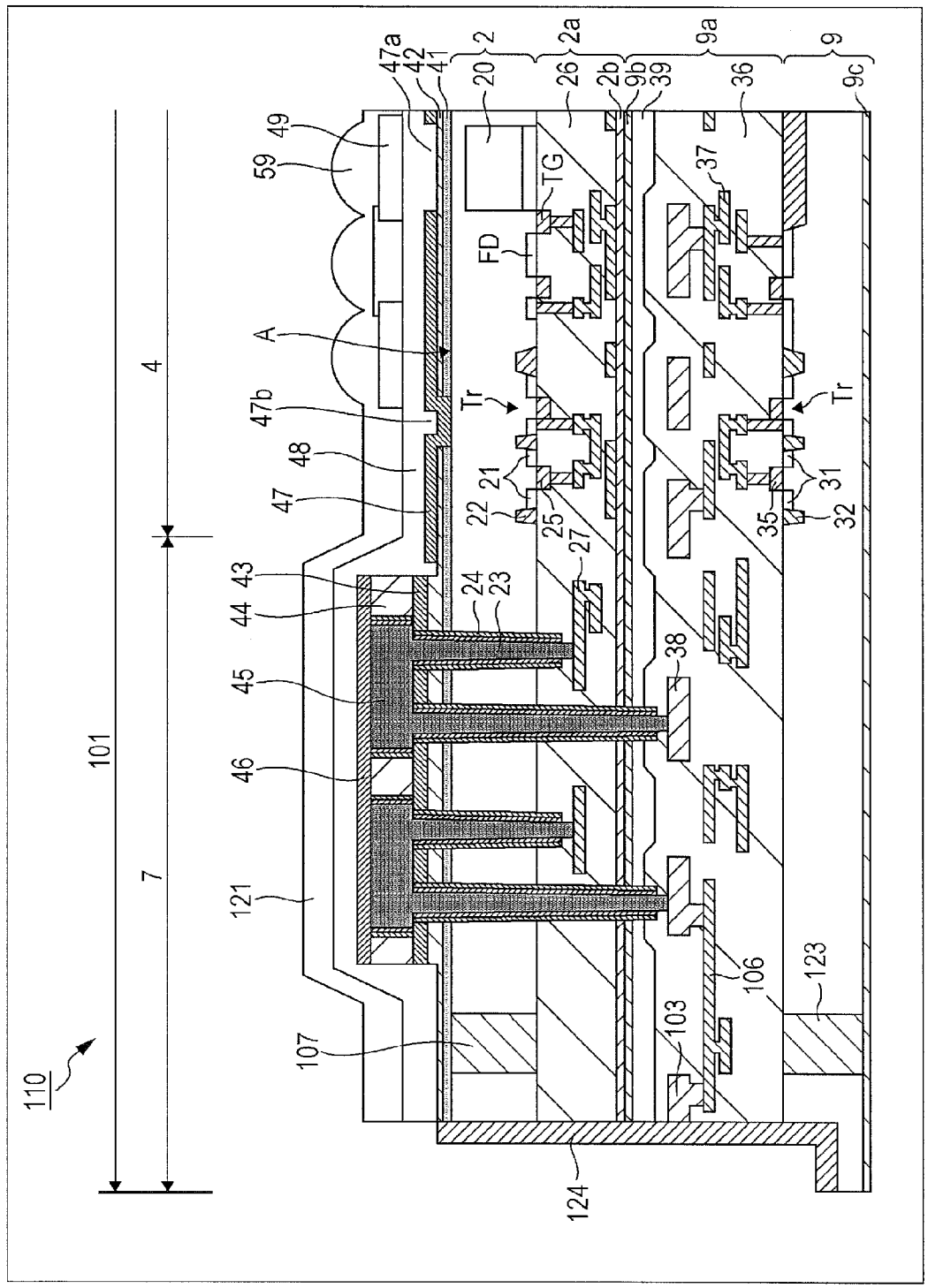
FIG. 21 is a manufacturing process diagram of the semiconductor device of the second embodiment.

Next, as illustrated in FIG. 21, the scribe region 102 of the wafer is removed by the dicing and the circuit forming region 101 is singulated so as to manufacture the semiconductor device 110.

By the dicing, the conductor layer 124A and the circuit board 9, formed on the scribe region 102, are removed. Then, an external connection terminal 124 of the semiconductor device 110 is formed from the conductor layer 124A which remains on the side surface of the semiconductor device 110.

It is possible to manufacture the semiconductor device 110 by the above-mentioned process. Then, the process proceeds to the next assembly process by using only the manufactured semiconductor devices 110 that pass the probe inspection as described above. The external connection terminal 124 on the side surface of the semiconductor device 110 is connected to an external device by the assembly process, and thus a semiconductor module as illustrated in FIG. 5 described above is configured.

According to the semiconductor wafer and the semiconductor device described above, the area of the external connection terminal is greater than in the first embodiment. Therefore, contact area with the contact jig of the external device increases, and connection reliability is improved. Therefore, in the semiconductor device of the second embodiment, it is possible to improve the reliability of the semiconductor device when a semiconductor module or the like is configured, in addition to the effect of the first embodiment.

In addition, in the semiconductor wafer of the second embodiment, the pad electrode on the upper surface of the wafer is exposed by the opening portion, and thus the inspection of the semiconductor device in the wafer state is possible, similarly to the first embodiment.

6. Third Embodiment

Semiconductor Device and Semiconductor Wafer

Next, the third embodiment of the semiconductor device and the semiconductor wafer will be described. The third embodiment is different from the second embodiment only in the configurations of the pad electrode and the external connection terminal and the configuration of the insulating portion formed in the circuit board. Therefore, in the description of the third embodiment, only components different from those in the second embodiment described above will be described and the description regarding the components which are the same as in the second embodiment, among the respective components formed on the circuit forming region will be omitted.

Figure 22:
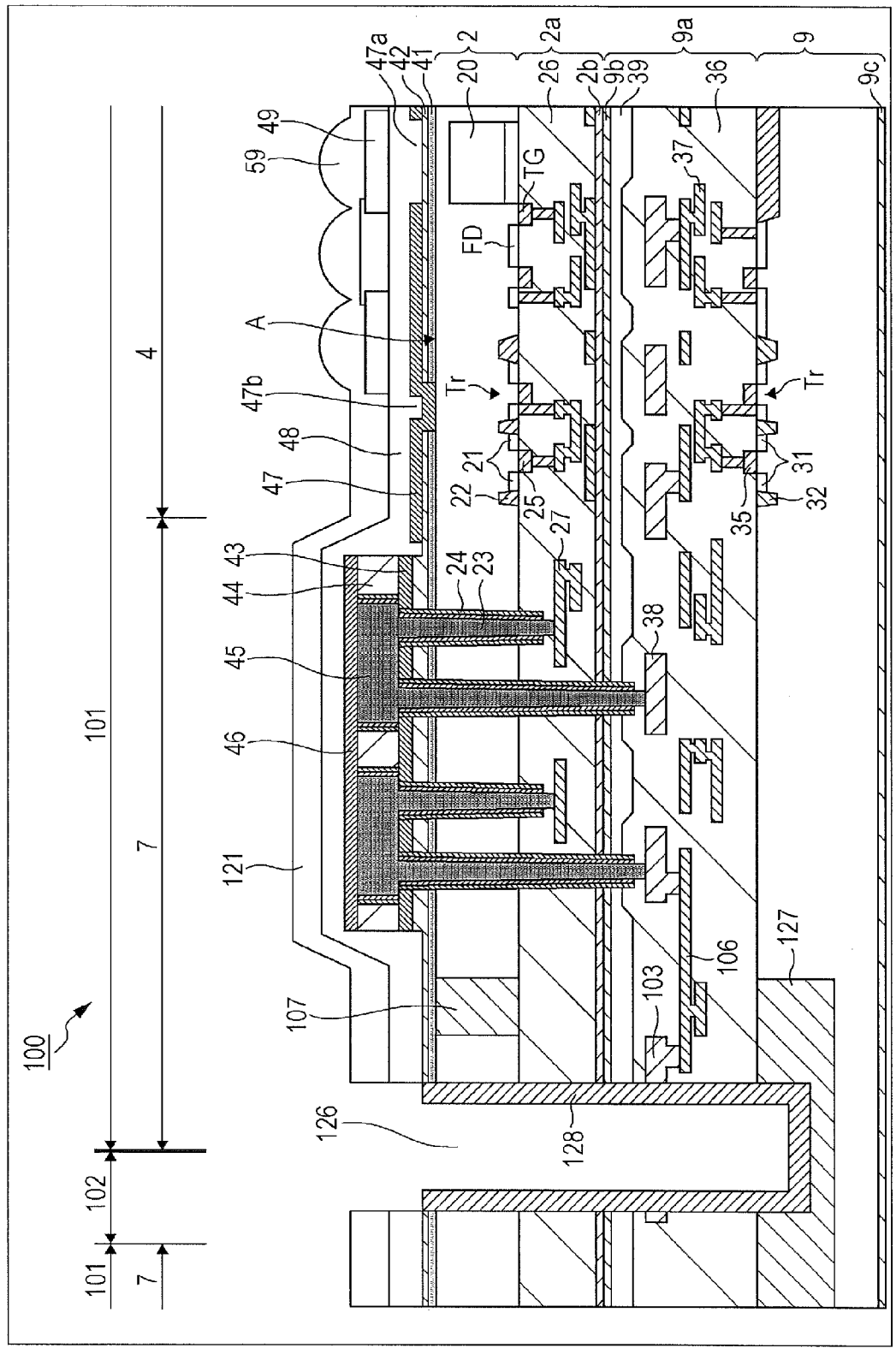
FIG. 22 is a diagram illustrating a configuration of the semiconductor wafer of a third embodiment.
Figure 23:
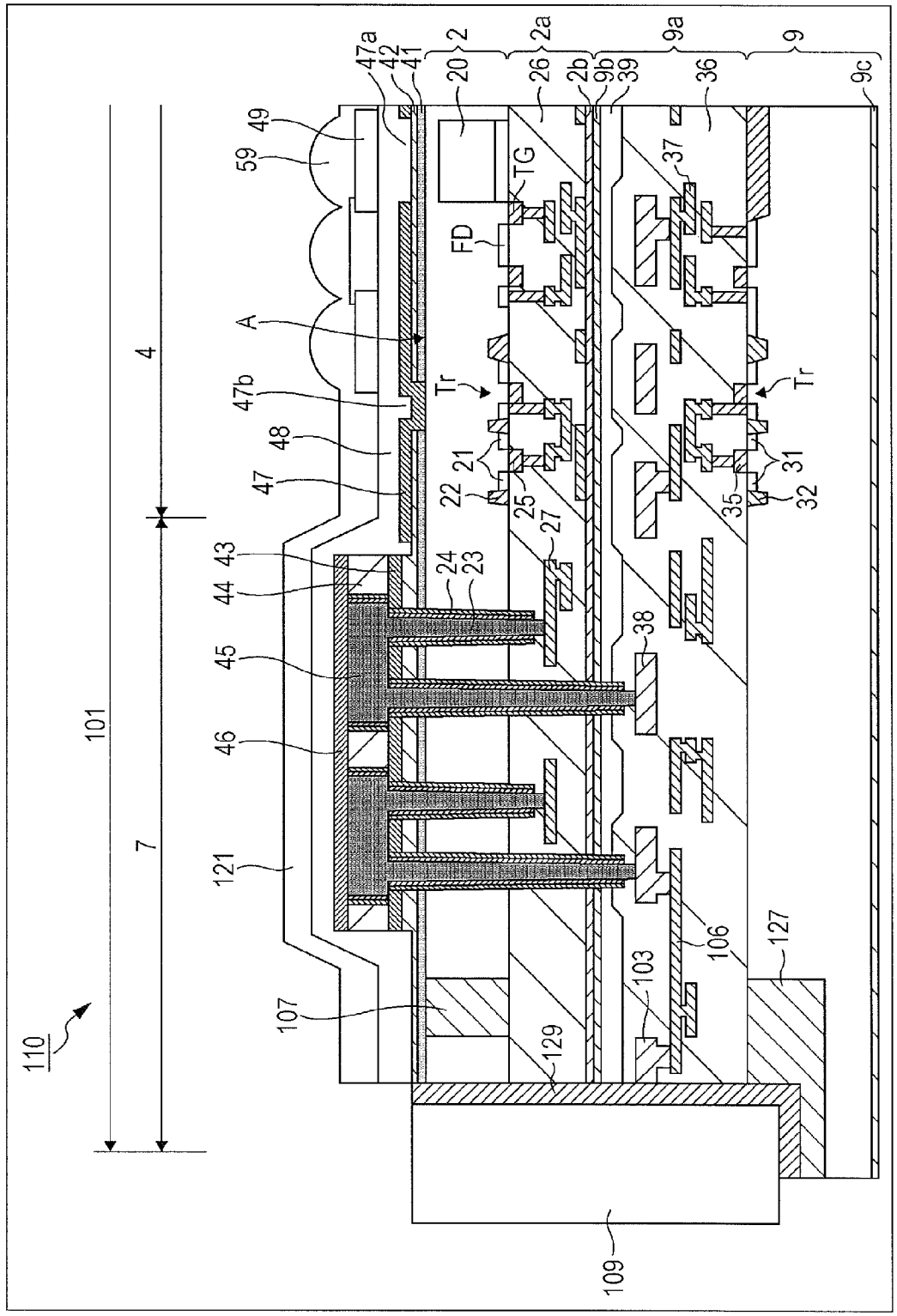
FIG. 23 is a diagram illustrating a configuration of the semiconductor device of the third embodiment.

FIG. 22 illustrates the configuration of a semiconductor wafer of the third embodiment. Further, FIG. 23 illustrates the configuration of a semiconductor device of the third embodiment.

The semiconductor wafer 100 illustrated in FIG. 22 and the semiconductor wafer 100 of the second embodiment described above are different mainly in the configurations of the insulating portion 127, the opening portion 126, the pad electrode 103, and the conductor layer 128, which are formed on the circuit board 9.

The semiconductor wafer of the third embodiment illustrated in FIG. 22 has the same configuration as that illustrated in FIG. 19 in a manufacturing process of the second embodiment described above, excluding the configuration of the insulating portion 127 formed on the circuit board 9. In other words, the semiconductor wafer has the same configuration as the state in which the conductor layer 128 is formed in the opening portion 126 and an optical member is formed on the back surface of the sensor board 2, in the manufacturing process of the second embodiment.

In the semiconductor wafer 100, an insulating portion 127 is formed in a portion in which the circuit board 9 and the conductor layer 128 are connected. The electrical connection between the conductor layer and the substrate is blocked by the insulating portion 127. Since the insulating portion 127 may be present only between the conductor layer 128 and the semiconductor layer of the circuit board 9, the insulating portion 127 may not be formed up to the back surface of the circuit board 9 as the aforementioned second embodiment. In addition, the insulating portion 127 is formed from the peripheral region 7 of the circuit forming region 101 in the outside of the circuit forming region 101, and formed to the scribe region 102.

The opening portion 126 of the semiconductor wafer 100 is formed from the surface of the semiconductor wafer 100 to the circuit board 9. A part of the surface of the circuit board 9 is removed by the opening portion 126. In other words, the opening portion 126 is formed in such a manner that it penetrates the respective layers formed on the back surface of the sensor board 2, the sensor board 2, the wiring layer 2a, the protective film 2b and 9b, and the wiring layer 9a and removes a part of the surface of the circuit board 9.

Then, the conductor layer 128 is formed in the side and the lower surface of the opening portion 126. The conductor layer 128 is electrically connected to the wiring 106 through the pad electrode 103, on the side surface of the opening portion 126.

In the semiconductor wafer 100 illustrated in FIG. 22, the conductor layer 128 is exposed by the opening portion 126 on the light receiving surface A side of the semiconductor wafer 100. Since the conductor layer 128 is electrically connected to the pad electrode 103, it is possible to perform the probe inspection in the state of the semiconductor wafer 100, using the conductor layer 128. Then, it is possible to perform an operation checking of the semiconductor device which is formed in the plurality of circuit forming regions 101 in the semiconductor wafer 100.

The semiconductor device 110 illustrated in FIG. 23 is in a state in which the circuit forming region 101 is singulated after the scribing of the semiconductor wafer 100 illustrated in FIG. 22.

The semiconductor device 110 includes the external connection terminal 129 on the side surface of the semiconductor device 110. The external connection terminal 129 is formed from the light receiving surface A of the sensor board 2 to the inside of the circuit board 9, in the side surface of the semiconductor device 110. Further, the external connection terminal 129 is connected to the pad electrode 103 which is exposed in the side surface of the opening portion 126.

The external connection terminal 129, preferably, is formed close to the back surface side of the circuit board 9 such that the connected area is enlarged. However, in order to avoid contact with the outside unexpectedly, it is preferable to leave the circuit board 9 at the end portion of the back surface side, without completely covering the back surface.

7. Manufacturing Method of Semiconductor Device and Semiconductor Wafer of Third Embodiment Next, a manufacturing method of the semiconductor device and the semiconductor wafer of the third embodiment which are illustrated in FIG. 22 and FIG. 23 will be described.

Further, the manufacturing method of the third embodiment, up to the process of forming the opening portion 126, is the same as those in the first and second embodiments described above, except for addition of a process of forming the insulating portion 127 on the circuit board 9. Therefore the same description as those of the first and second embodiments will be omitted.

Figure 24:
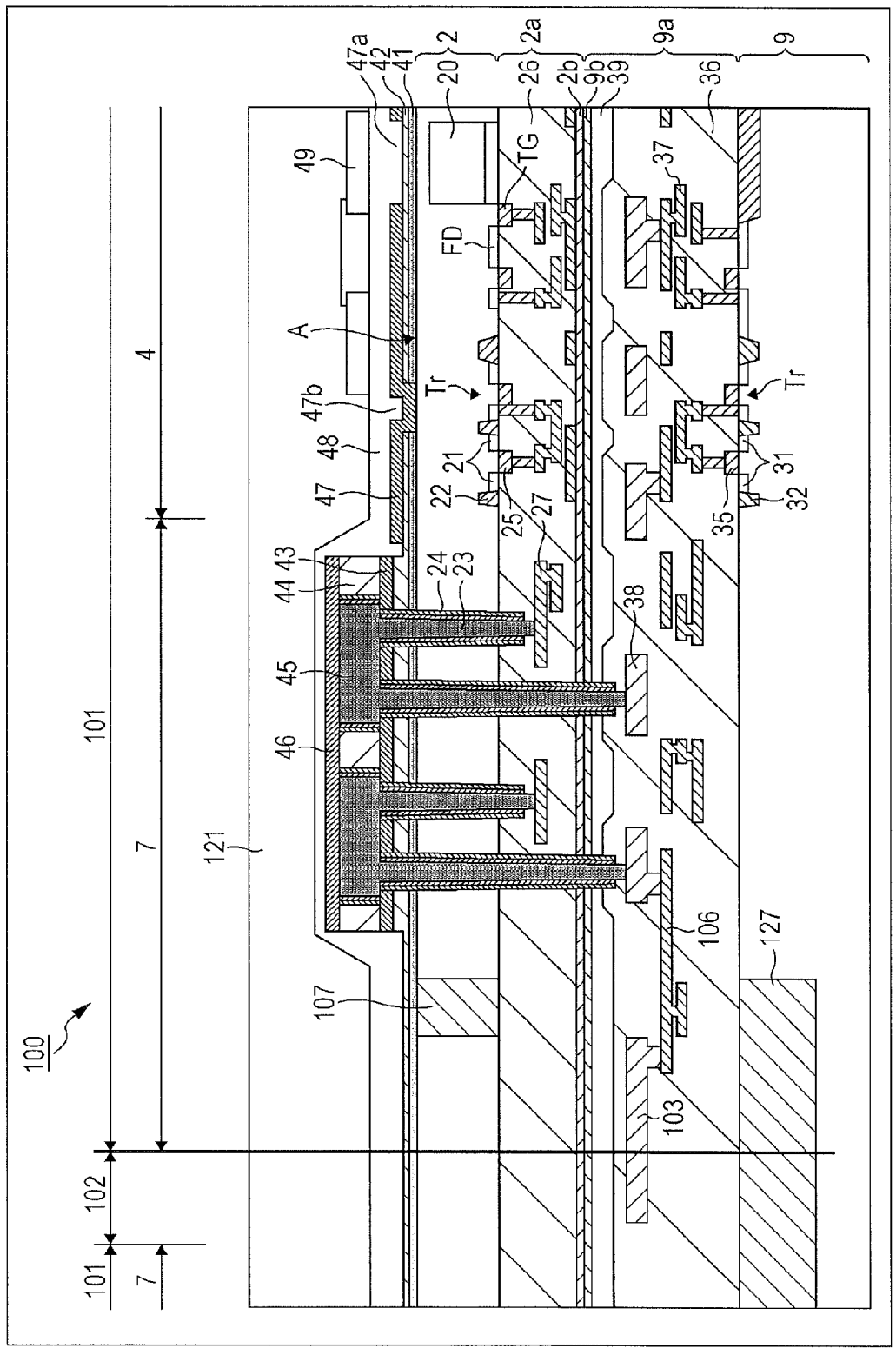
FIG. 24 is a manufacturing process diagram of the semiconductor wafer and the semiconductor device of the third embodiment.

As illustrated in FIG. 24, the sensor board 2 is formed by the same method as that of the first embodiment described above. The wiring layer 2a and the protective film 2b which are formed on the sensor board 2 are formed similarly.

Then, similarly to the first embodiment, an impurity layer and an element separator 32 in addition to the source/drain 31 are formed on each circuit forming region 101 of the circuit board 9. Further, the insulating portion 127 is formed in a predetermined position of the circuit board 9. The insulating portion 127 is formed, for example, by engraving the circuit board 9 up to a predetermined depth and by embedding a silicon oxide.

Then, the wiring layer 9a and the protective film 9b are formed similarly on the circuit board 9.

Next, the sensor board 2 and the circuit board 9 are bonded with the protective film 2b and the protective film 9b, respectively in such a manner that the sensor board 2 and the circuit board 9 face the protective film 2b and the protective film 9b, respectively. After the bonding is ended, the light receiving surface A side of the sensor board 2 is thinned as necessary. Then, similarly to the first embodiment, a penetrating electrode 23 which penetrates the sensor board 2 and a wiring 45 connecting the penetrating electrodes 23 are formed. Further, the light shielding film 47, the transparent protective film 48, the color filter 49, and the lens material layer 121 are formed.

Figure 25:
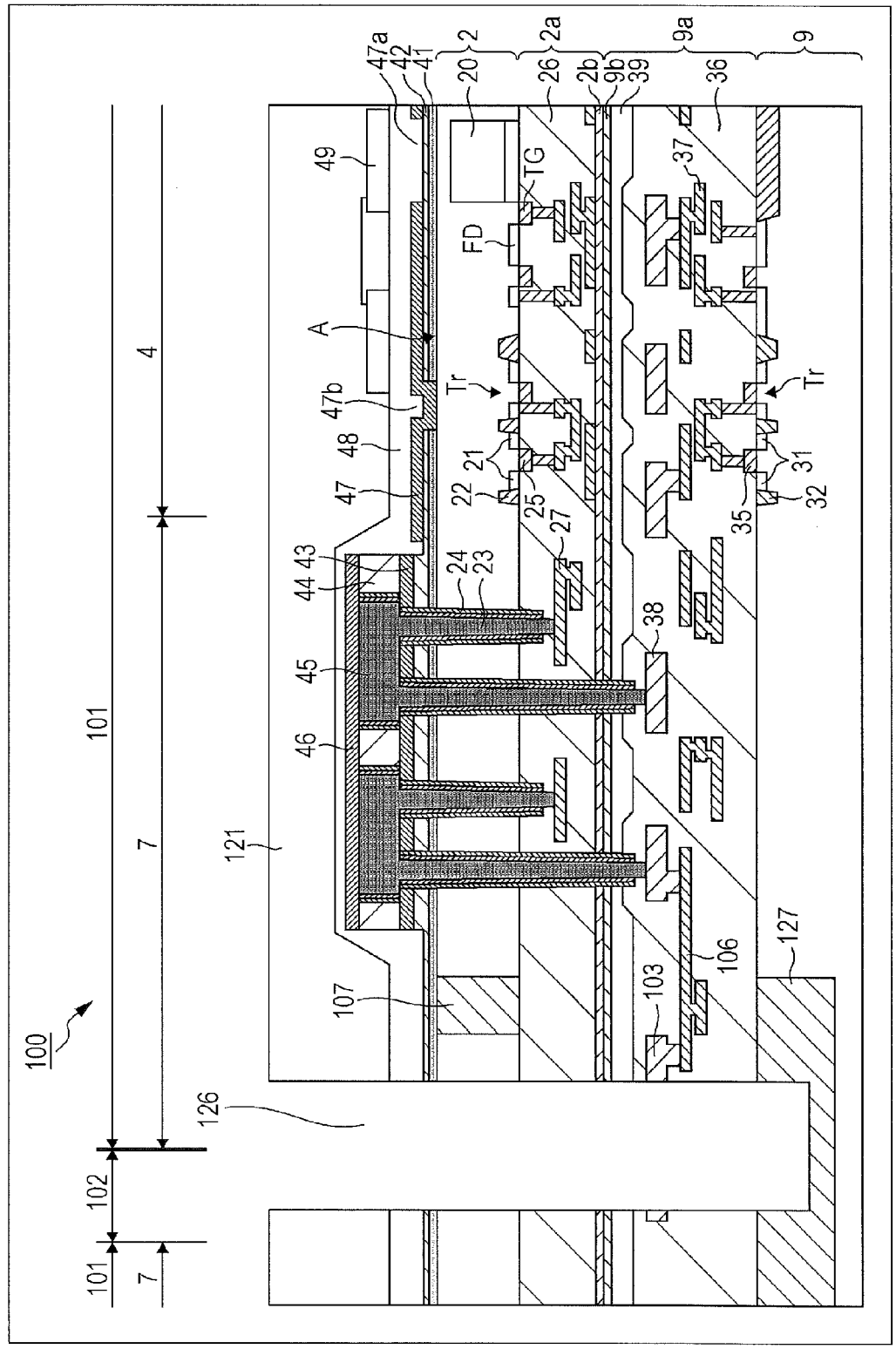
FIG. 25 is a manufacturing process diagram of the semiconductor wafer and the semiconductor device of the third embodiment.

Next, as illustrated in FIG. 25, an opening portion 126 for opening from the light receiving surface A side to the insulating portion 127 of the circuit board 9 is formed, from the end of the circuit forming region 101 to the scribe region 102. At this time, using the resist pattern as a mask, the lens material layer 121, the transparent protective film 48, the interface level suppressing film 42, the anti-reflection film 41, the sensor board 2, the inter-layer insulating film 26, the protective film 2b, the protective film 9b, and the flattening film 39, the inter-layer insulating film 36, the pad electrode 103, and the circuit board 9 are etched to complete the opening portion 126.

Figure 26:
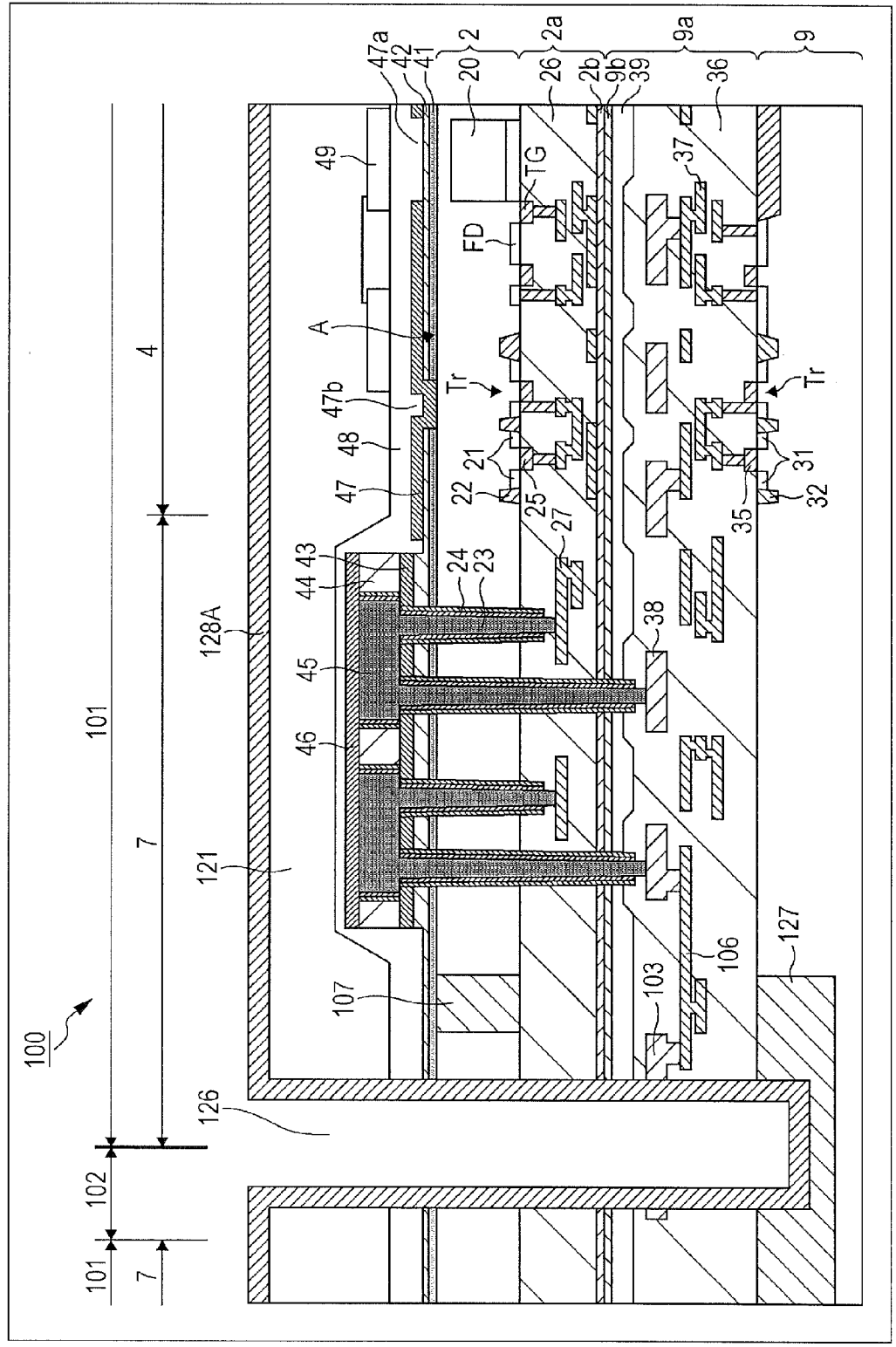
FIG. 26 is a manufacturing process diagram of the semiconductor wafer and the semiconductor device of the third embodiment.
Figure 27:
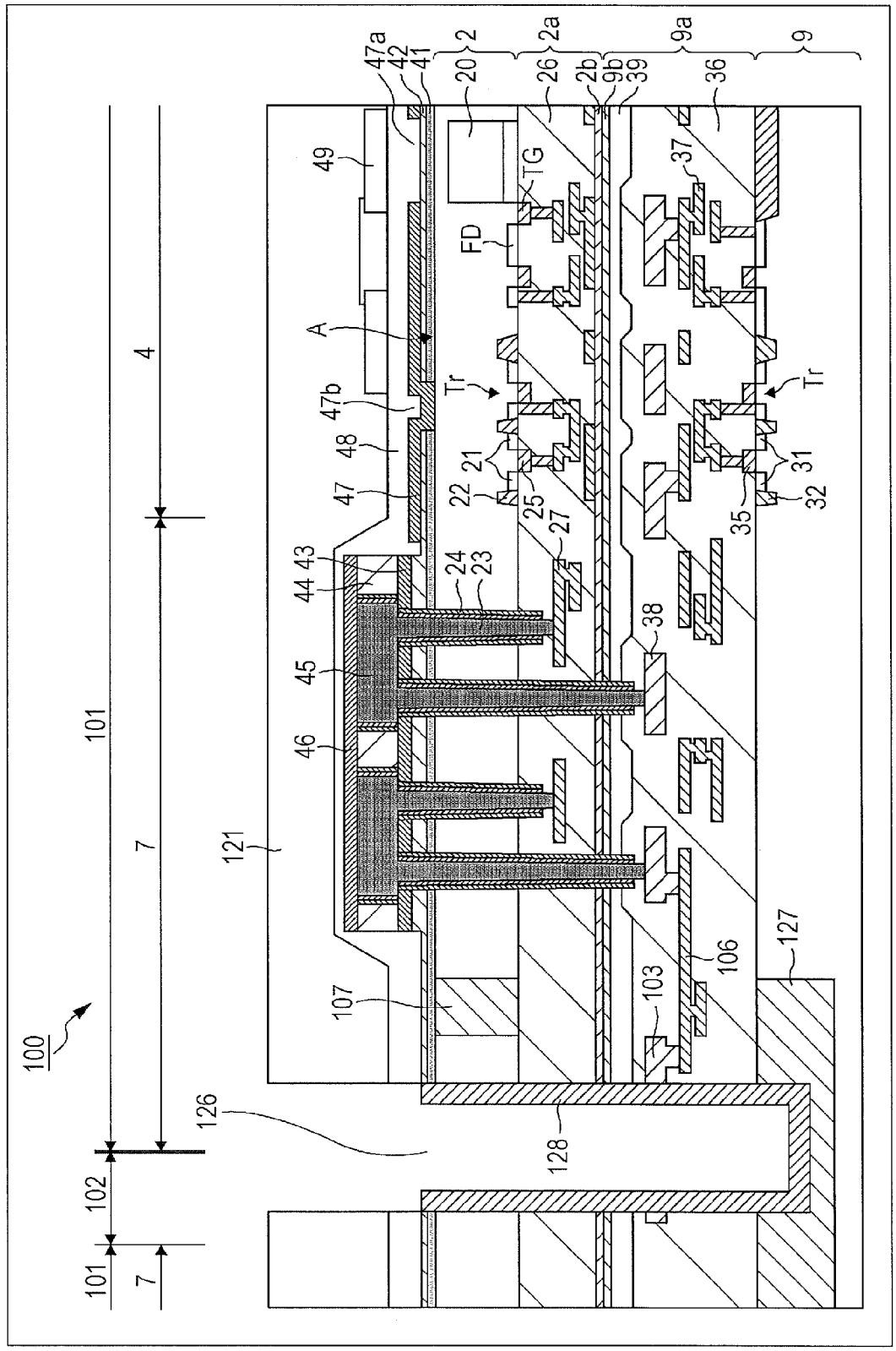
FIG. 27 is a manufacturing process diagram of the semiconductor wafer and the semiconductor device of the third embodiment.

Next, as illustrated in FIG. 26, a conductor layer 128A is formed on the entire surface of the semiconductor wafer 100. At this time, the conductor layer 128A is formed in the side surface and the lower surface of the opening portion 126. At this time, the pad electrode 103 and the conductor layer 128A which remain in the circuit forming region 101 are electrically connected. Then, similarly to the first embodiment, a resist layer is formed in the opening portion 126, and the conductor layer 128A is removed by dry etching or wet etching, such that as illustrated FIG. 27, the conductor layer 128 remains on the lower part and the side surface of the opening portion 126.

Figure 28:
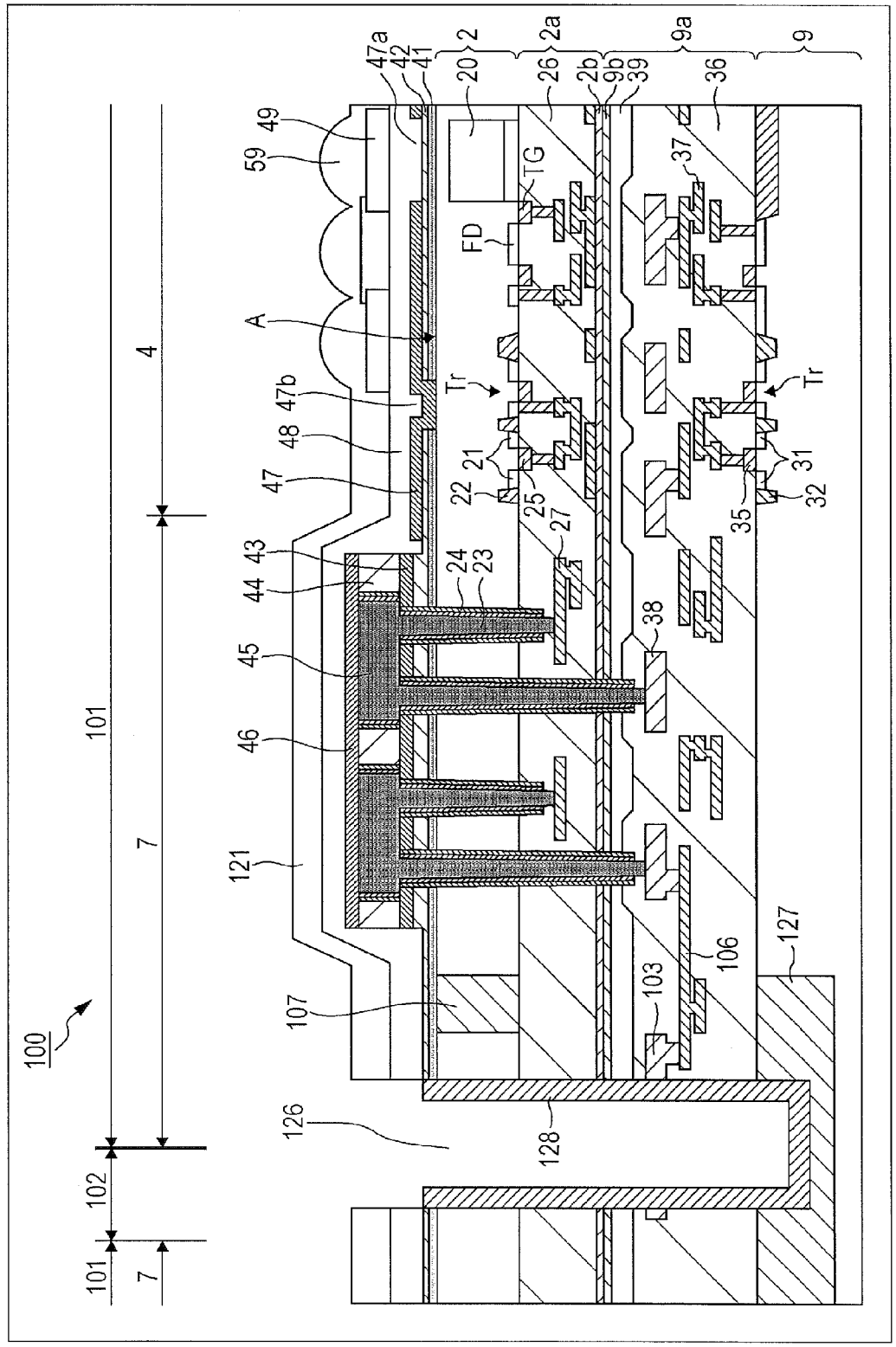
FIG. 28 is a manufacturing process diagram of the semiconductor wafer and the semiconductor device of the third embodiment.

Next, the surface of the lens material layer 121 is smoothed using a CMP method. Then, as illustrated in FIG. 28, the on-chip lens 59 corresponding to the photoelectric conversion unit 20 is formed, from the smoothened lens material layer 121. When the on-chip lens 59 is formed, the lens material layer 121 which is integral with the on-chip lens 59 remains on the transparent protective film 48 in the peripheral region 7 and the scribe region 102 of the circuit forming region 101.

Figure 29:
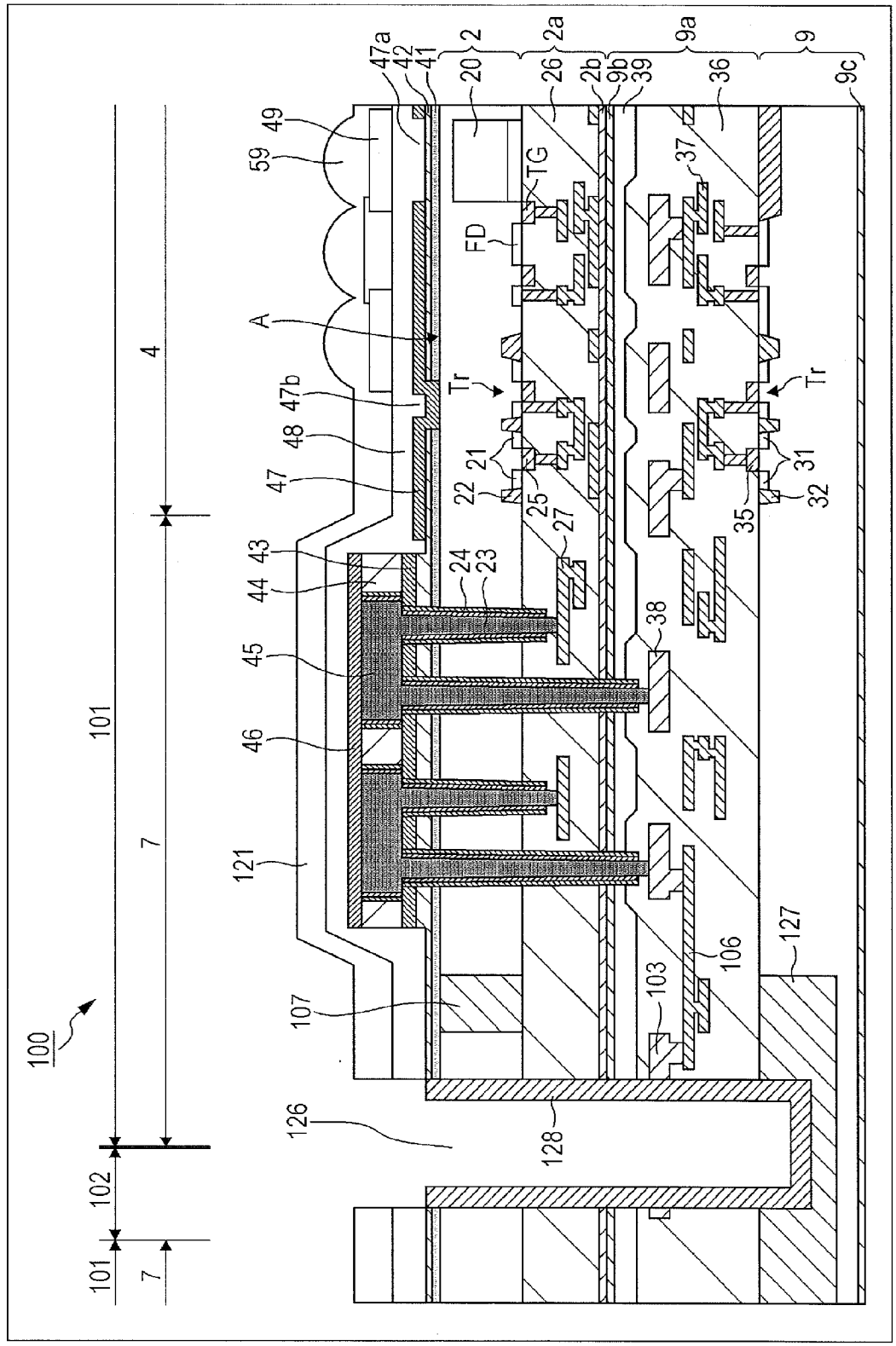
FIG. 29 is a manufacturing process diagram of the semiconductor wafer and the semiconductor device of the third embodiment.

Next, as illustrated in FIG. 29, the back surface side of the circuit board 9 is thinned by polishing. At this time, the circuit board 9 is thinned up to a position at which the circuit board 9 remains below the conductor layer 128, without the conductor layer 128 being exposed to the back surface.

Further, after the circuit board 9 is thinned, the protective film 9c is formed on the back surface of the circuit board 9.

Next, the probe inspection is performed by inserting an inspection needle into the opening portion 126 from the light receiving surface A side and by using the conductor layer 128. In this manner, the probe inspection is performed in the state of the semiconductor wafer 100, and an operation checking of the semiconductor devices which are formed in the plurality of circuit forming regions 101 in the semiconductor wafer 100 is performed.

Figure 30:
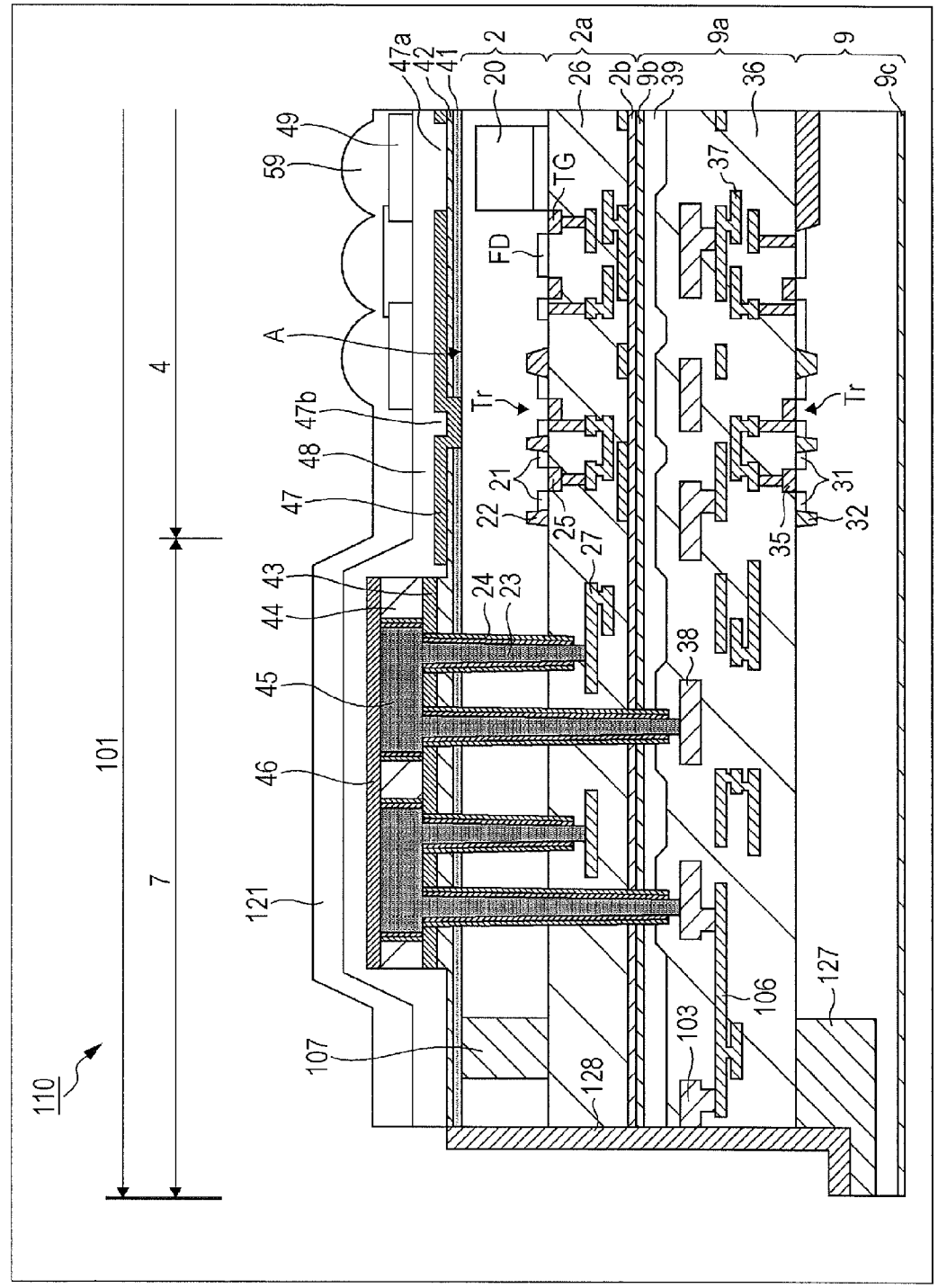
FIG. 30 is a manufacturing process diagram of the semiconductor device of the third embodiment.

Next, as illustrated in FIG. 30, the scribe region 102 of the wafer is removed by the dicing and the circuit forming region 101 is singulated so as to manufacture the semiconductor device 110.

By the dicing, the conductor layer 128 and the circuit board 9, which are formed on the scribe region 102, are removed. Then, an external connection terminal 129 of the semiconductor device 110 is formed, from the conductor layer 128 which remains on the side surface of the semiconductor device 110.

It is possible to manufacture the semiconductor device 110 by the above-mentioned process. Then, the process proceeds to the next assembly process by using only the manufactured semiconductor devices 110 that pass the probe inspection as described above. The external connection terminal 129 on the side surface of the semiconductor device 110 is connected to an external device by the assembly process, and thus a semiconductor module as illustrated in FIG. 5 described above is configured.

In the semiconductor wafer and the semiconductor device described above, similarly to the second embodiment, the area of the external connection terminal is greater than in the first embodiment. Therefore, a contact area with the contact jig of the external device increases, and connection reliability is improved. Therefore, in the semiconductor device of the third embodiment, it is possible to improve the reliability of the semiconductor device when a semiconductor module or the like is configured, in addition to the effect of the first embodiment.

In addition, in the semiconductor wafer of the third embodiment, the conductor layer connected to the pad electrode on the upper surface of the wafer is exposed by the opening portion, and thus the inspection of the semiconductor device in the wafer state is possible, similarly to the first embodiment.

Further, in the manufacturing method of the semiconductor wafer and the semiconductor device in the third embodiment, it is possible to reduce the number of manufacturing processes, as compared to the second embodiment.

In the second embodiment described above, after the inspection of the semiconductor device is performed in the pad electrode, an opening portion is engraved, and the formation of a conductor layer and etching is performed. Then, at the time of etching the conductor layer, the optical member such as the on-chip lens and the color filter is removed and the optical member is formed again after the formation of the conductor layer.

In contrast, in the third embodiment, an opening portion is engraved after the inspection and the conductor layer is formed. Then, after the conductor layer is formed, the on-chip lens is formed from the lens material layer and the inspection of the semiconductor device is performed. Since the inspection is not performed before the formation of the conductor layer, it is not necessary to form the optical member such as the on-chip lens before the formation of the conductor layer. Therefore, after the conductor layer is formed, the optical member is formed and then it is possible to perform the inspection in the conductor layer. Accordingly, in the third embodiment, as compared to the second embodiment, it is possible to reduce a process of forming the opening portion and a process of forming the optical member again.

8. Fourth Embodiment

Semiconductor Device and Semiconductor Wafer

Next, a fourth embodiment of the semiconductor device and the semiconductor wafer will be described. The fourth embodiment is different from the first embodiment in that the pad electrode and the external connection terminal which are formed on the wiring layer on the circuit board in the first embodiment is configured on the wiring layer on the sensor board and in the structure of the wiring connected to the pad electrode. Therefore, in the following description of the fourth embodiment, only components different from those in the first embodiment described above will be described, and the description regarding the same components as those of the first embodiment will be omitted.

Figure 31:
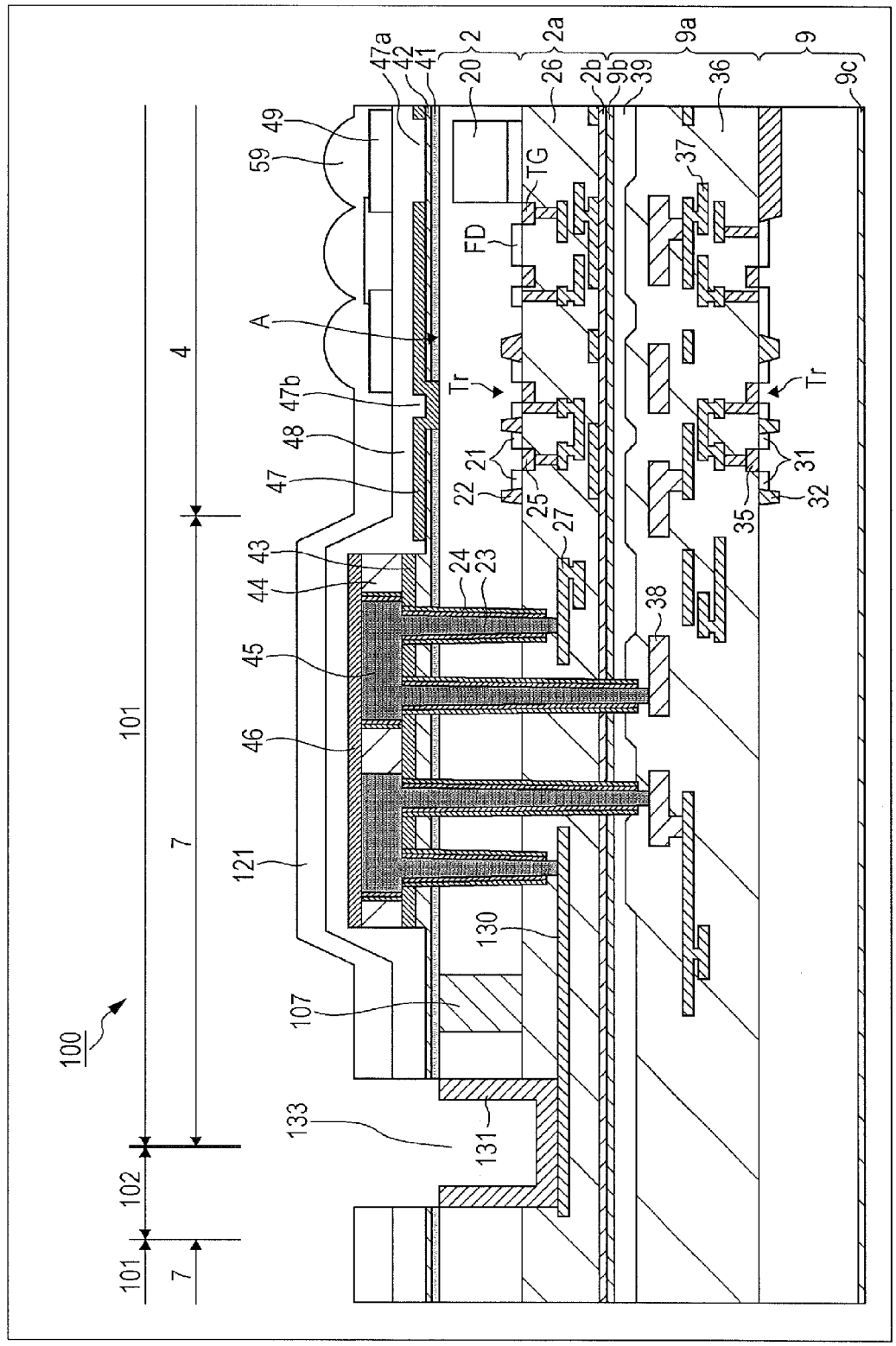
FIG. 31 is a diagram illustrating a configuration of the semiconductor wafer of a fourth embodiment.
Figure 32:
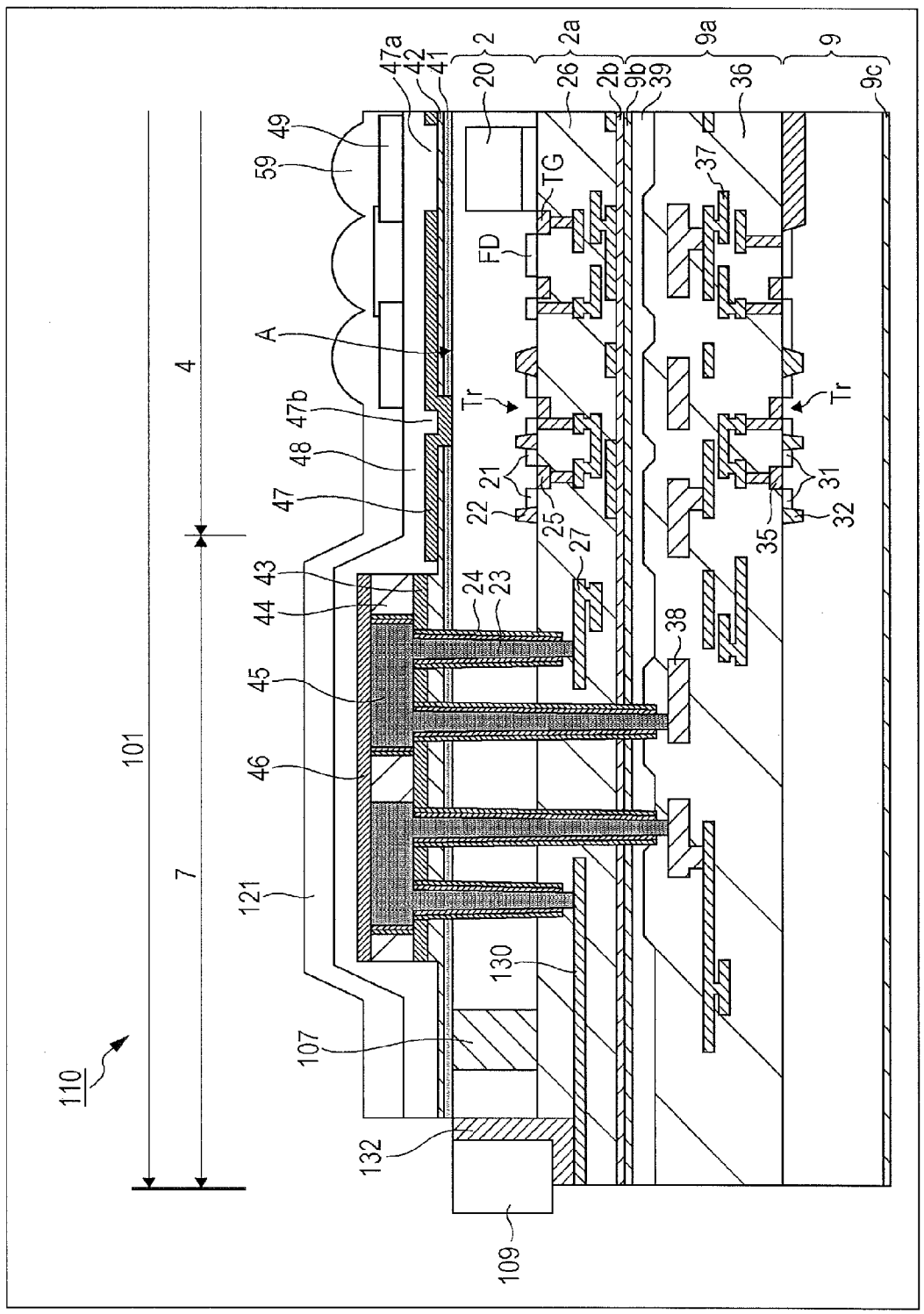
FIG. 32 is a diagram illustrating a configuration of the semiconductor device of the fourth embodiment.

FIG. 31 illustrates the configuration of the semiconductor wafer. Further, FIG. 32 illustrates the configuration of the semiconductor device.

In the semiconductor wafer 100 illustrated in FIG. 31, a pad electrode for inspection 130 is formed in the wiring layer 2a of the sensor board 2. In the wiring layer 2a of the sensor board 2 of the circuit forming region 101, a wiring 27 is formed as a multilayer wiring. Then, a pad electrode 130 connected to the wiring 27 is provided in the wiring layer 9a. The pad electrode 130 is formed from the circuit forming region 101 to the scribe region 102. The pad electrode 130 is extended to the circuit forming region 101 and connected to the penetrating electrode 23. Then, the pad electrode 130 is connected to the wiring 38 of the wiring layer 9a of the circuit board 9 through the penetrating electrode 23. In addition, the pad electrode 130 extended to the circuit forming region 101 may be connected to the wiring 27 constituting the drive circuit of the sensor board 2.

The pad electrode 130 is covered with the inter-layer insulating film 26. Then, the protective film 2b is provided on the inter-layer insulating film 26, and the sensor board 2 is bonded to the circuit board 9 in the surface of the protective film 2b.

The opening portion 133 of the semiconductor wafer 100 is formed from the surface of the semiconductor wafer 100 to the pad electrode 130. By the opening portion 133, the pad electrode for inspection 130 is exposed in the surface of the semiconductor wafer 100. Further, the conductor layer 131 is formed in the lower surface and the side surface of the opening portion 133. The conductor layer 131 is connected to the pad electrode 130 in the lower surface of the opening portion 133. Therefore, the conductor layer 131 is connected to the drive circuit of the circuit forming region 101, through the pad electrode 130.

The semiconductor device 110 illustrated in FIG. 32 is in a state in which the circuit forming region 101 is singulated after the scribing of the semiconductor wafer 100 illustrated in FIG. 31.

The semiconductor device 110 includes the external connection terminal 132 on the side surface of the semiconductor device 110. The external connection terminal 132 is formed from the light receiving surface A of the sensor board 2 to the position of the pad electrode 130 of the wiring layer 2a of the sensor board 2, in the side surface of the semiconductor device 110. Further, the external connection terminal 132 is connected to the pad electrode 130 in the lower surface of the opening portion 133.

9. Manufacturing Method of Semiconductor Device and Semiconductor Wafer of Fourth Embodiment Next, a manufacturing method of the semiconductor device and the semiconductor wafer of the fourth embodiment which are illustrated in FIG. 31 and FIG. 32 will be described.

Further, the manufacturing method of the fourth embodiment, up to the process of forming the pad electrode 130 and the process of forming the opening portion 133, is the same as those in the first embodiment described above. Therefore the same description as those of the first embodiment will be omitted.

First, a plurality of photoelectric conversion units 20 are arranged and formed in the pixel regions 4 of the circuit forming regions 101 in the sensor board 2, and an impurity layer and an element separator 22 in addition to the source/drain 21 and the floating diffusion FD are formed on the sensor board 2. Then, the transfer gates TG and the gate electrodes 25 are formed on the surface of the sensor board 2 and the inter-layer insulating film 26 and the wirings 27 are formed.

Next, the pad electrode 130 is formed in the wiring layer 9a and the pad electrode 130 is further covered with the inter-layer insulating film 26. The pad electrodes 130 are continuously formed in the end of the circuit forming region 101 to the scribe region 102.

Hereinafter, similarly to the first embodiment, the circuit board 9 is formed, and the sensor board 2 is bonded with the circuit board 9. Then, after the back surface of the sensor board 2 is thinned by polishing, the penetrating electrode 23, a color filter, and the like are formed. Then, the lens material layer 121 is formed in the entire surface of the back surface of the sensor board 2.

Figure 33:
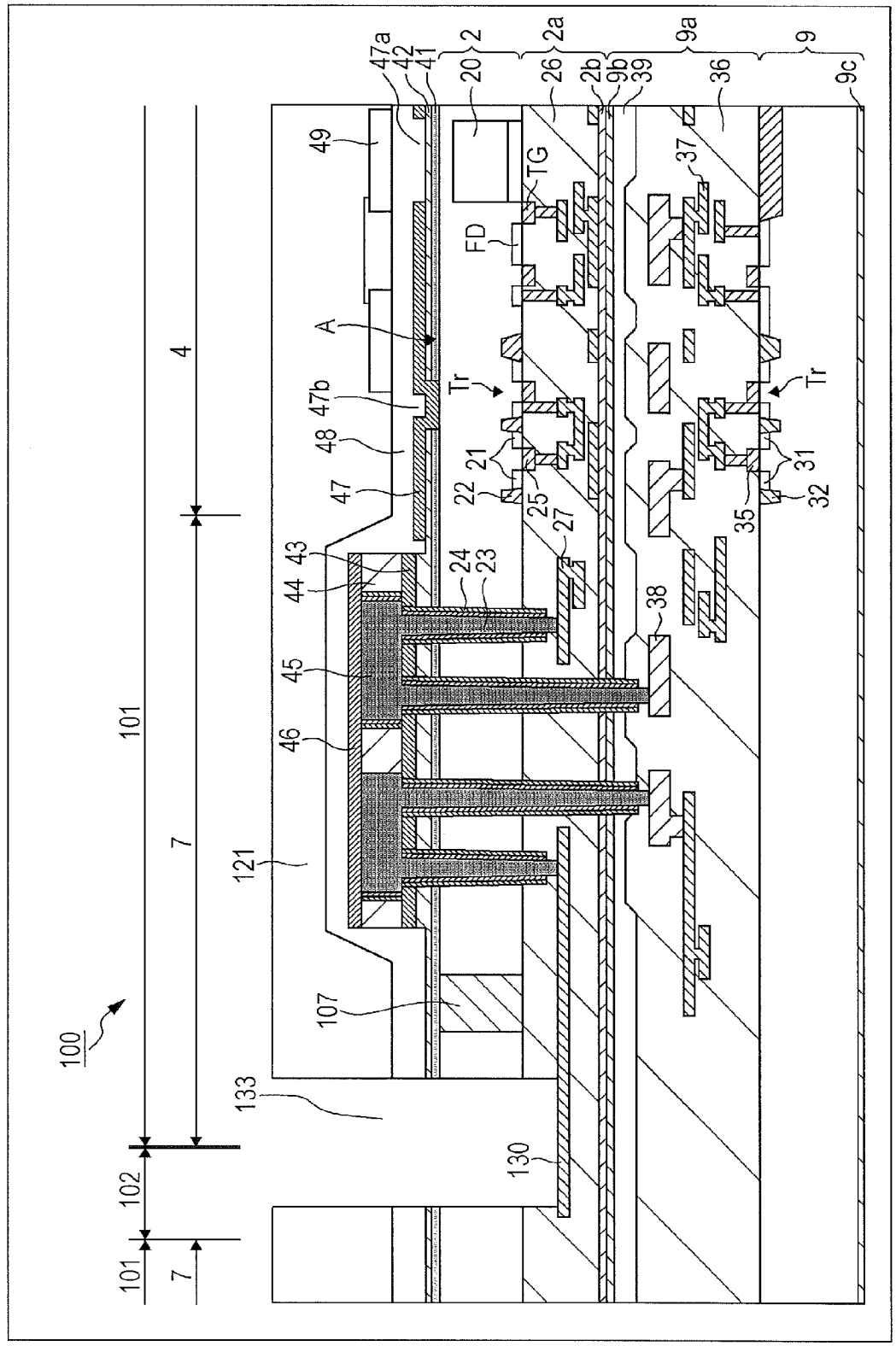
FIG. 33 is a manufacturing process diagram of the semiconductor wafer and the semiconductor device of the fourth embodiment.

Next, as illustrated in FIG. 33, an opening portion 133 for exposing the pad electrode 130 is formed from the end of the circuit forming region 101 to the scribe region 102. At this time, using the resist pattern as a mask, the lens material layer 121, the transparent protective film 48, the interface level suppressing film 42, the anti-reflection film 41, the sensor board 2, and the inter-layer insulating film 26 are removed by being etched sequentially, and the etching is ended by exposing the pad electrode 130.

Figure 34:
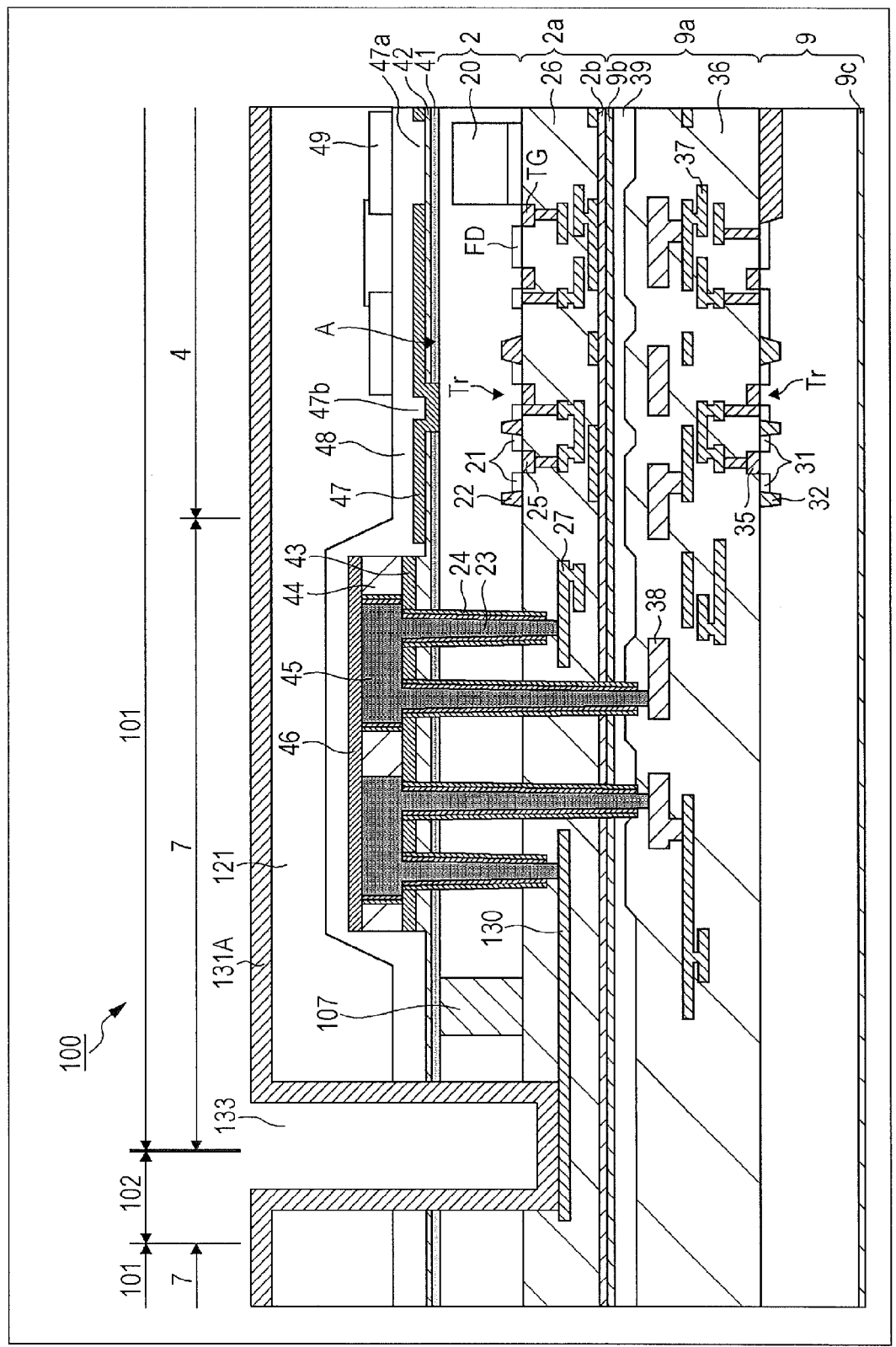
FIG. 34 is a manufacturing process diagram of the semiconductor wafer and the semiconductor device of the fourth embodiment.

Next, as illustrated in FIG. 34, a conductor layer 131A is formed on the entire surface of the semiconductor wafer 100.

At this time, the conductor layer 131A is formed in the side surface and the lower surface of the opening portion 133. At this time, the pad electrode 130 and the conductor layer 131A which remain in the circuit forming region 101 are electrically connected.

Figure 35:
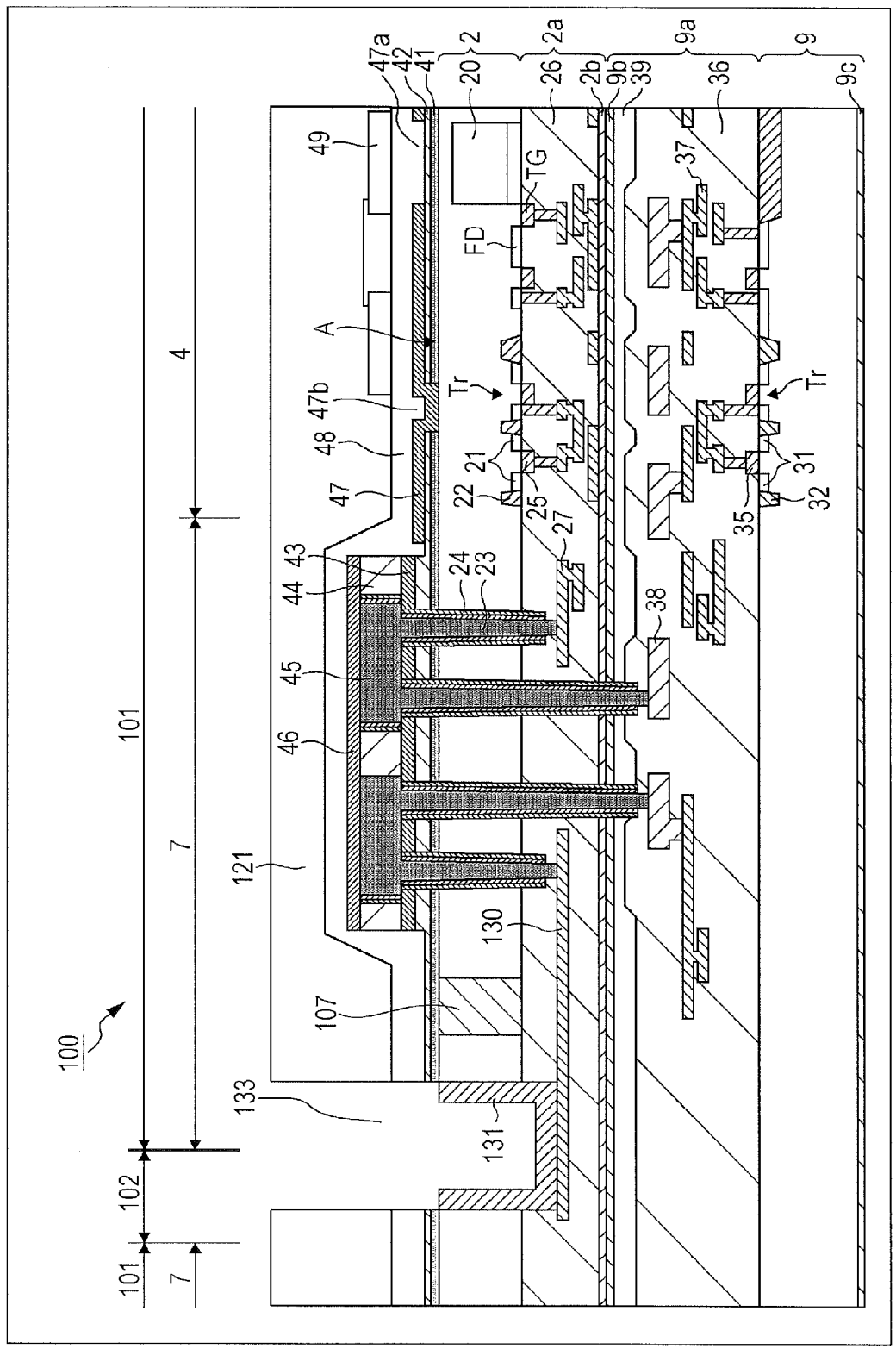
FIG. 35 is a manufacturing process diagram of the semiconductor wafer and the semiconductor device of the fourth embodiment.

Then, as illustrated in FIG. 35, similarly to the first embodiment, a resist layer is formed in the opening portion 133, and the conductor layer 131A is removed by dry etching or wet etching. The conductor layer 131 remains on the lower part and the side surface of the opening portion 133 by etching.

Figure 36:
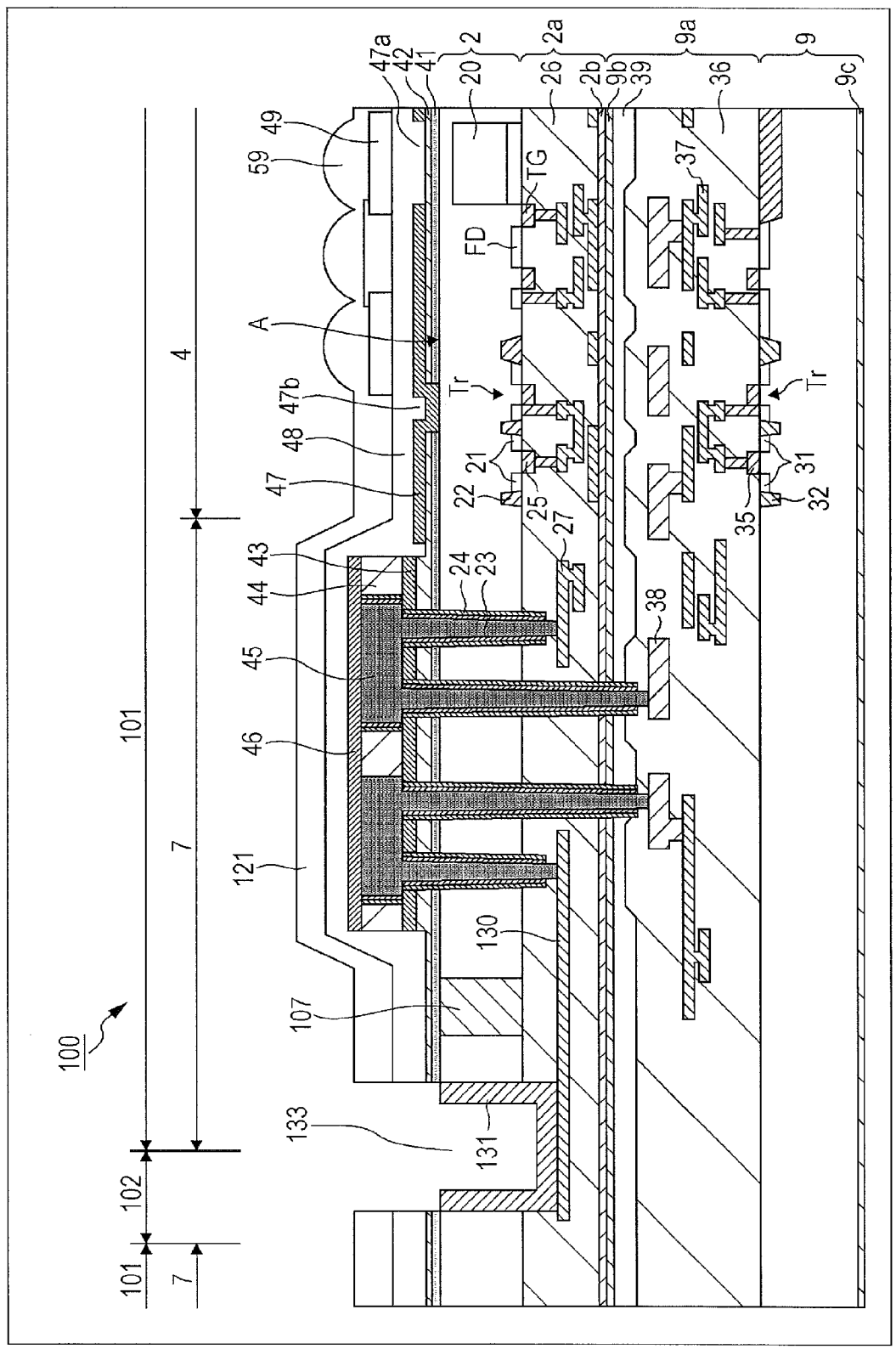
FIG. 36 is a manufacturing process diagram of the semiconductor wafer and the semiconductor device of the fourth embodiment.

Next, the surface of the lens material layer 121 is smoothed using a CMP method. Then, as illustrated in FIG. 36, the on-chip lens 59 corresponding to the photoelectric conversion unit 20 is formed, from the smoothed lens material layer 121. When the on-chip lens 59 is formed, the lens material layer 121 which is integral with the on-chip lens 59 remains on the transparent protective film 48 in the peripheral region 7 and the scribe region 102 of the circuit forming region 101.

Next, a probe inspection is performed by inserting an inspection needle into the opening portion 133 from the light receiving surface A side and by using the conductor layer 131. The probe inspection is performed in the state of the semiconductor wafer 100 as described above, and an operation checking of the semiconductor devices which are formed in the plurality of circuit forming regions 101 in the semiconductor wafer 100 is performed.

Figure 37:
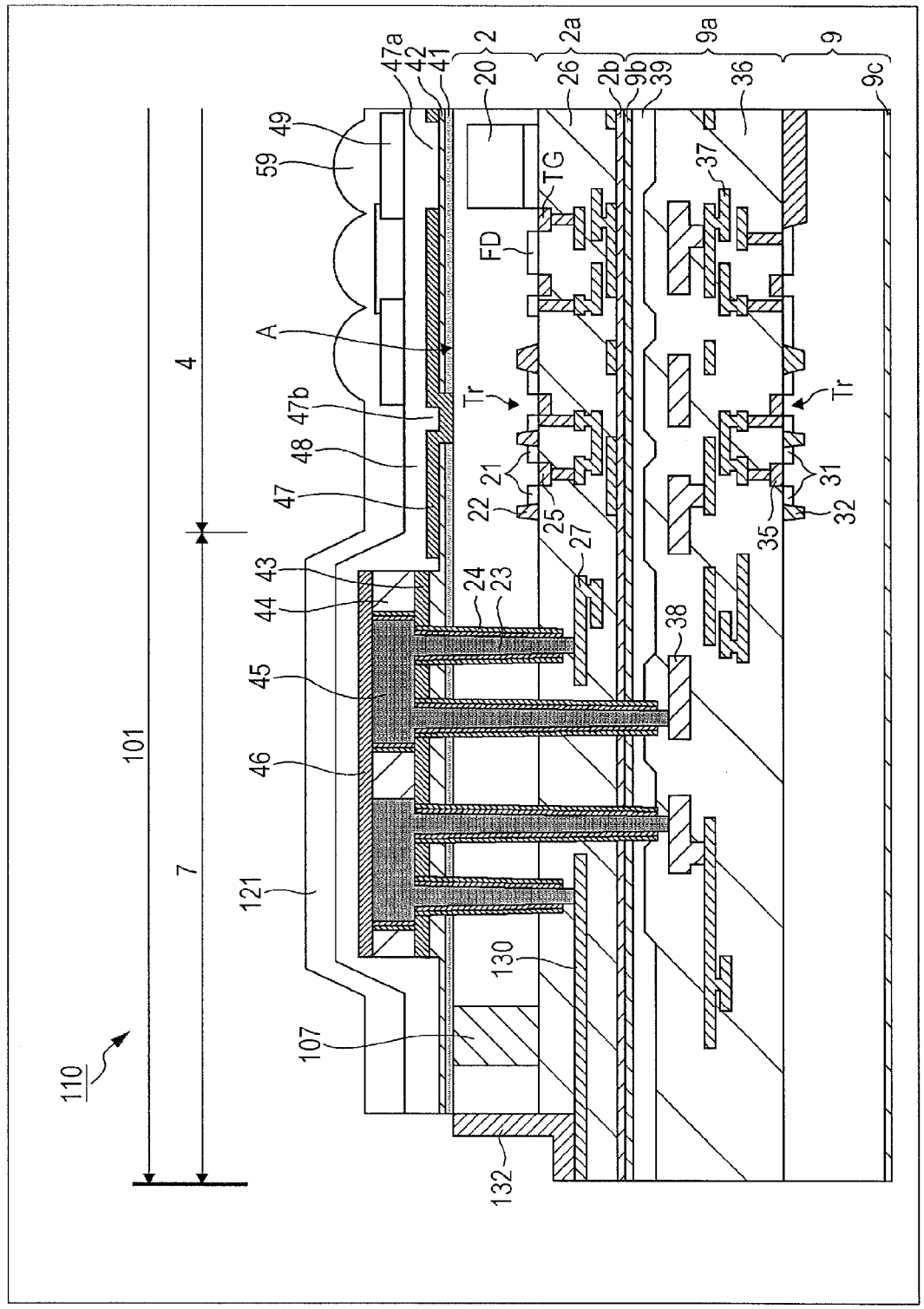
FIG. 37 is a manufacturing process diagram of the semiconductor device of the fourth embodiment.

Next, as illustrated in FIG. 37, the scribe region 102 of the wafer is removed by dicing and the circuit forming region 101 is singulated so as to manufacture the semiconductor device 110.

The conductor layer 131, the pad electrode 130, the wiring layer 9a, and the circuit board 9, which are provided on the scribe region 102, are removed by the dicing. Then, the external connection terminal 132 of the semiconductor device 110 is formed, from the conductor layer 131 which remains on the side surface of the semiconductor device 110.

By the above-mentioned process, it is possible to manufacture the semiconductor device 110. Then, the process proceeds to the next assembly process using only the manufactured semiconductor devices 110 that pass the probe inspection as described above. By the assembly process, the external connection terminal 132 on the side surface of the semiconductor device 110 is connected to the external device so as to constitute a semiconductor module as illustrated in FIG. 5 described above.

10. Fifth Embodiment

Semiconductor Device and Semiconductor Wafer

Next, a fifth embodiment of the semiconductor device and the semiconductor wafer will be described. The fifth embodiment is different mainly from the first embodiment in that the configuration of the conductor layer which is formed on the side surface of the opening portion has the same configuration of the penetrating electrode. Therefore, in the following description of the fifth embodiment, only components different from those in the first embodiment described above will be described, and the description regarding the same components as those of the first embodiment will be omitted.

Figure 38:
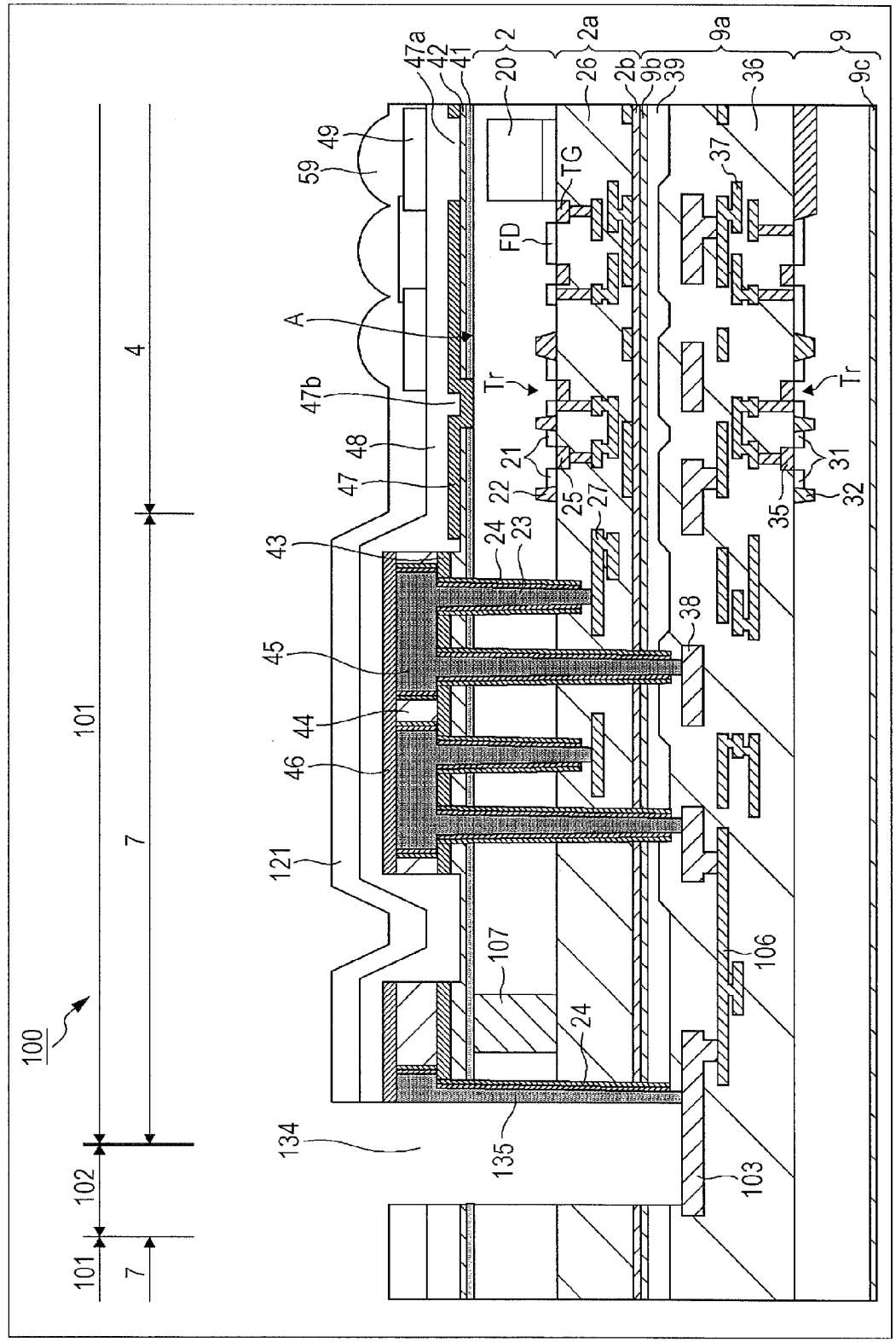
FIG. 38 is a diagram illustrating a configuration of the semiconductor wafer of a fifth embodiment.
Figure 39:
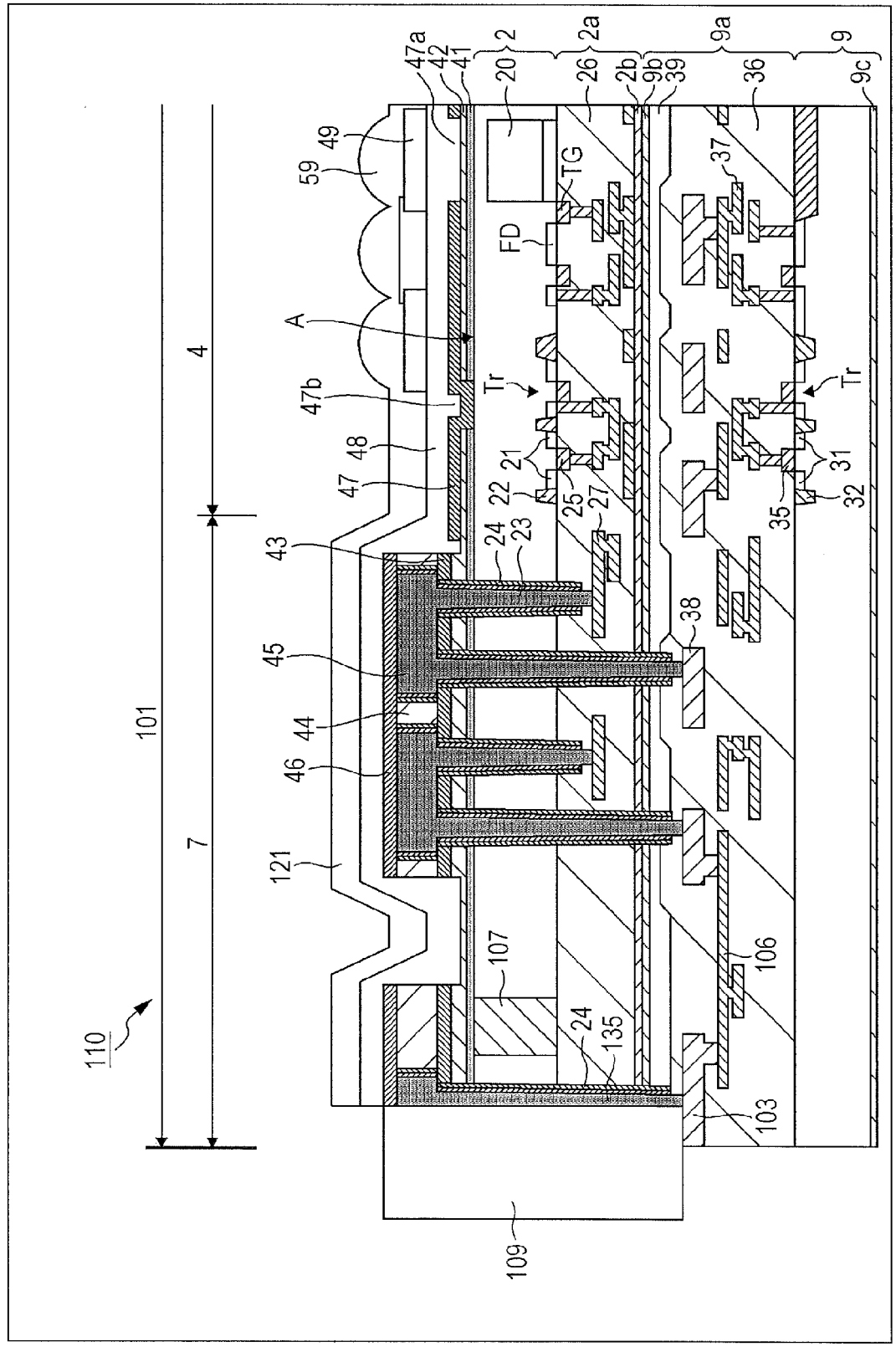
FIG. 39 is a diagram illustrating a configuration of the semiconductor device of the fifth embodiment.

FIG. 38 illustrates the configuration of the semiconductor wafer. Further, FIG. 39 illustrates the configuration of the semiconductor device.

In the semiconductor wafer 100 illustrated in FIG. 13, the pad electrode for inspection 103 is formed in the wiring layer 9a of the circuit board 9. Then, the pad electrode 103 is exposed in the light receiving surface A side of the semiconductor wafer 100, by the opening portion 134.

Therefore, the probe inspection is performed in the state of semiconductor wafer 100, by inserting an inspection needle from the light receiving surface A side, and an operation checking of the semiconductor devices which are formed in the plurality of circuit forming regions 101 in the semiconductor wafer 100 can be performed.

Further, in the semiconductor wafer 100, the conductor layer 135 is formed on the side surface of the opening portion 134. The conductor layer 135 has the same structure as that of the penetrating electrode 23 which is formed in the circuit forming region 101. Furthermore, the conductor layer 135 is configured in such a manner that it is cut by the opening portion 134 in the center of the penetrating electrode, and the conductor layer constituting the penetrating electrode is exposed from the side surface of the opening portion 134.

Further, the conductor layer 135 is embedded with the sensor board 2, the wiring layer 2a on the sensor board 2, and the wiring layer 9a on the circuit board 9, excluding the surface exposed from the opening portion 134. Further, the lens material layer 121 and the transparent protective film 48 are formed on the conductor layer 135.

The lower portion of the conductor layer 135 is connected to the pad electrode 103. Therefore, the conductor layer 135 is electrically connected to the drive circuit of the circuit forming region 101 through the pad electrode 103. Further, a probe inspection can be performed in the state of the semiconductor wafer 100 by using the pad electrode 103. Then, it is possible to perform an operation checking of the semiconductor devices which are formed in the plurality of circuit forming regions 101 in the semiconductor wafer 100.

The semiconductor device 110 illustrated in FIG. 39 is in a state in which the circuit forming region is singulated after the scribing of the semiconductor wafer 100 illustrated in FIG. 38.

The semiconductor device 110 includes the conductor layer 135 which is the external connection terminal on the side surface of the semiconductor device 110. In FIG. 39, the contact jig 109 of the external device is connected to the conductor layer 135 which is the external connection terminal of the semiconductor device 110.

11. Manufacturing Method of Semiconductor Device and Semiconductor Wafer of Fifth Embodiment Next, a manufacturing method of the semiconductor device and the semiconductor wafer of the fifth embodiment which are illustrated in FIG. 38 and FIG. 39 will be described.

Further, the manufacturing method of the fifth embodiment can employ the same method as that of the first embodiment described above. Therefore, in the following description, the same description as that of the first embodiment will be omitted.

Figure 40:
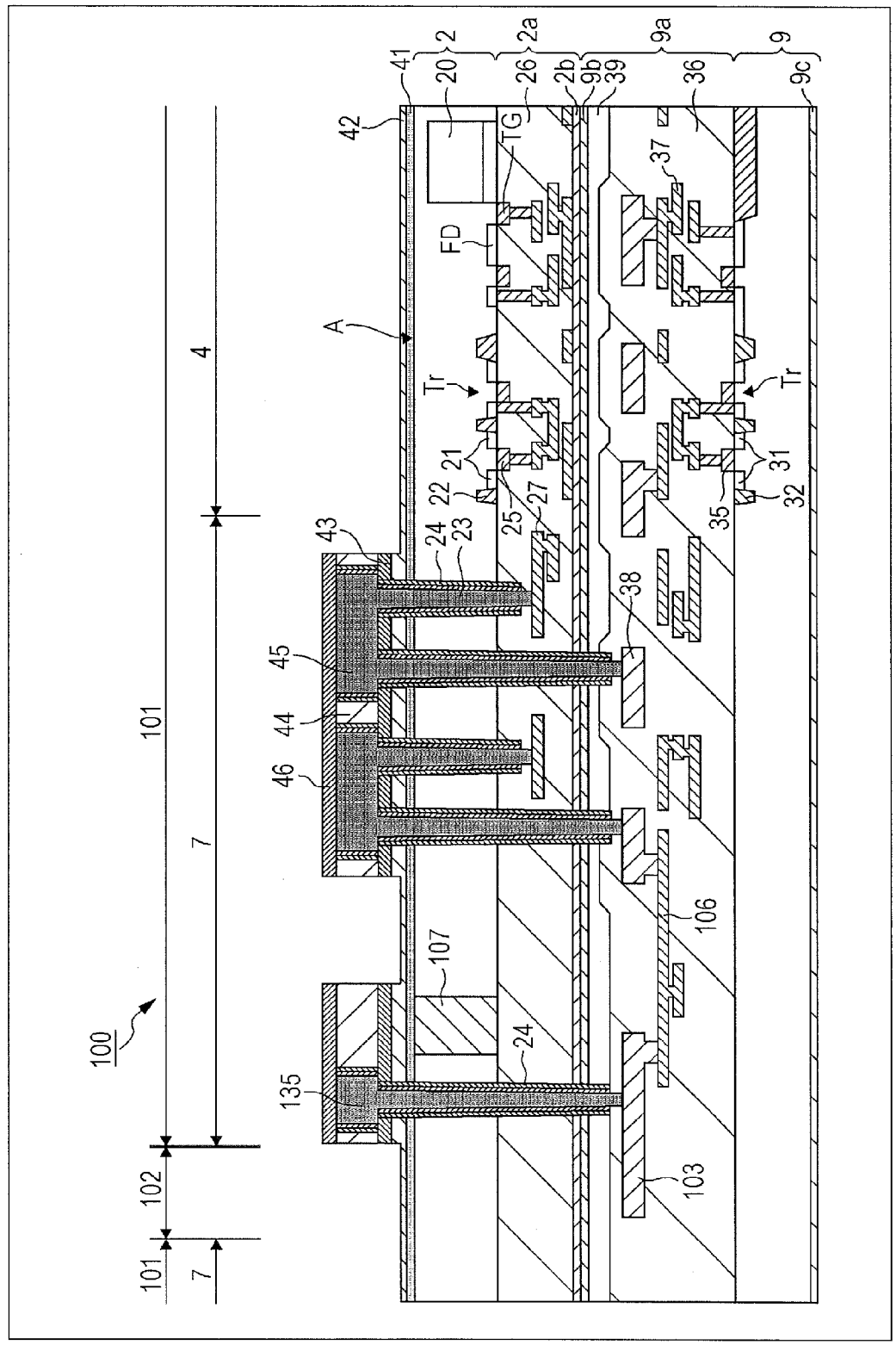
FIG. 40 is a manufacturing process diagram of the semiconductor wafer and the semiconductor device of the fifth embodiment.

First, processes up to a process of forming the penetrating electrode 23 illustrated in FIG. 40 are performed by the same method as that of the first embodiment. In the process of forming the penetrating electrode 23, the conductor layer 135 is formed similarly to the penetrating electrode 23. The conductor layer 135 is formed to be connected to the pad electrode 103 which is formed on the wiring layer 9a of the circuit board 9, from the upper surface of the sensor board 2.

Further, the formation position of the conductor layer 135 is the end of the circuit forming region 101, and is the position in which the formation position of the conductor layer 135 and the formation position of the opening portion for exposing the pad electrode 103 overlap in part.

Figure 41:
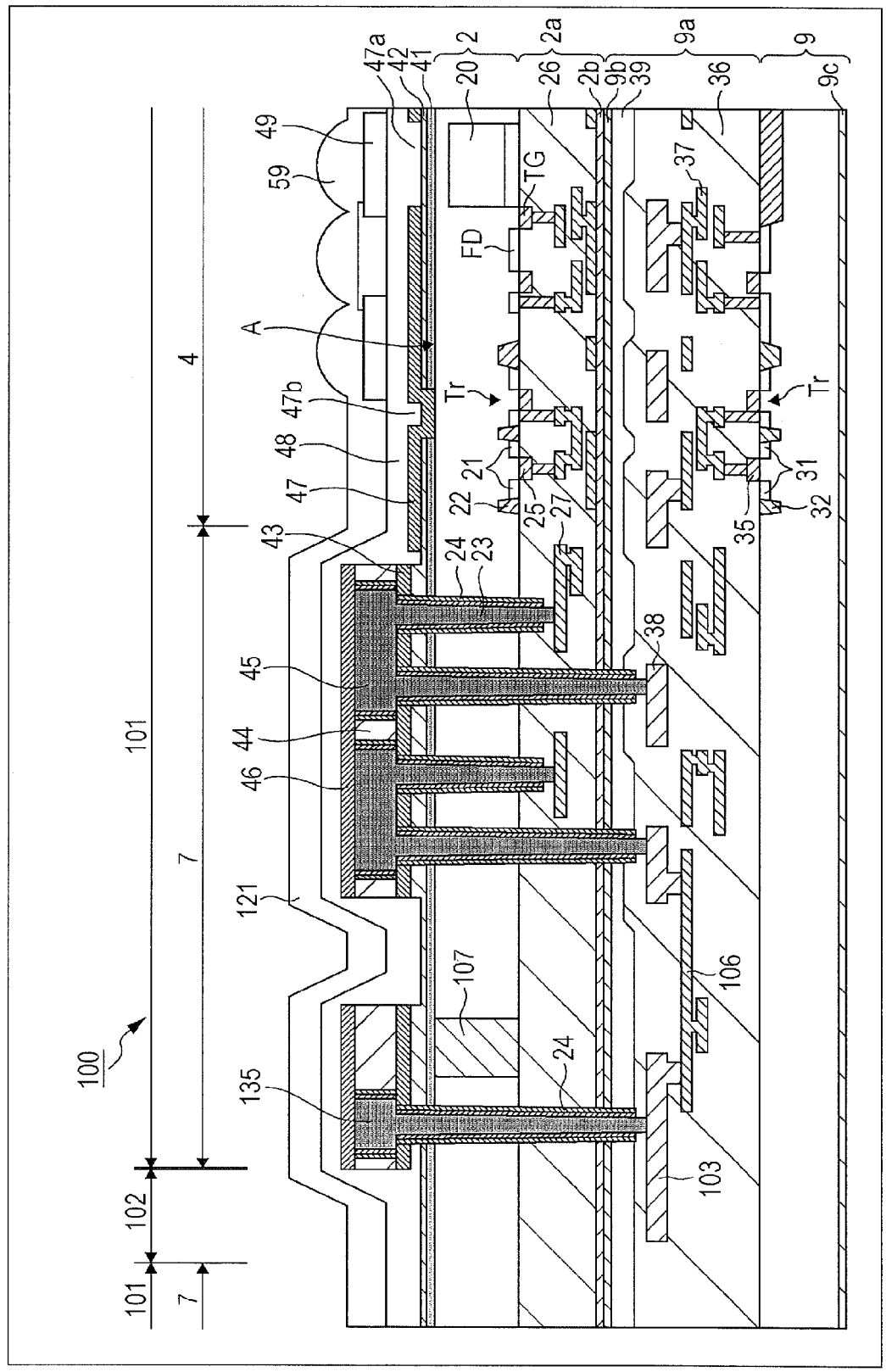
FIG. 41 is a manufacturing process diagram of the semiconductor wafer and the semiconductor device of the fifth embodiment.

Next, as illustrated in FIG. 41, the light shielding film 47, the transparent protective film 48, the color filter 49, the lens material layer 121, and the on-chip lens 59 are formed by the same method as that of the first embodiment.

Figure 42:
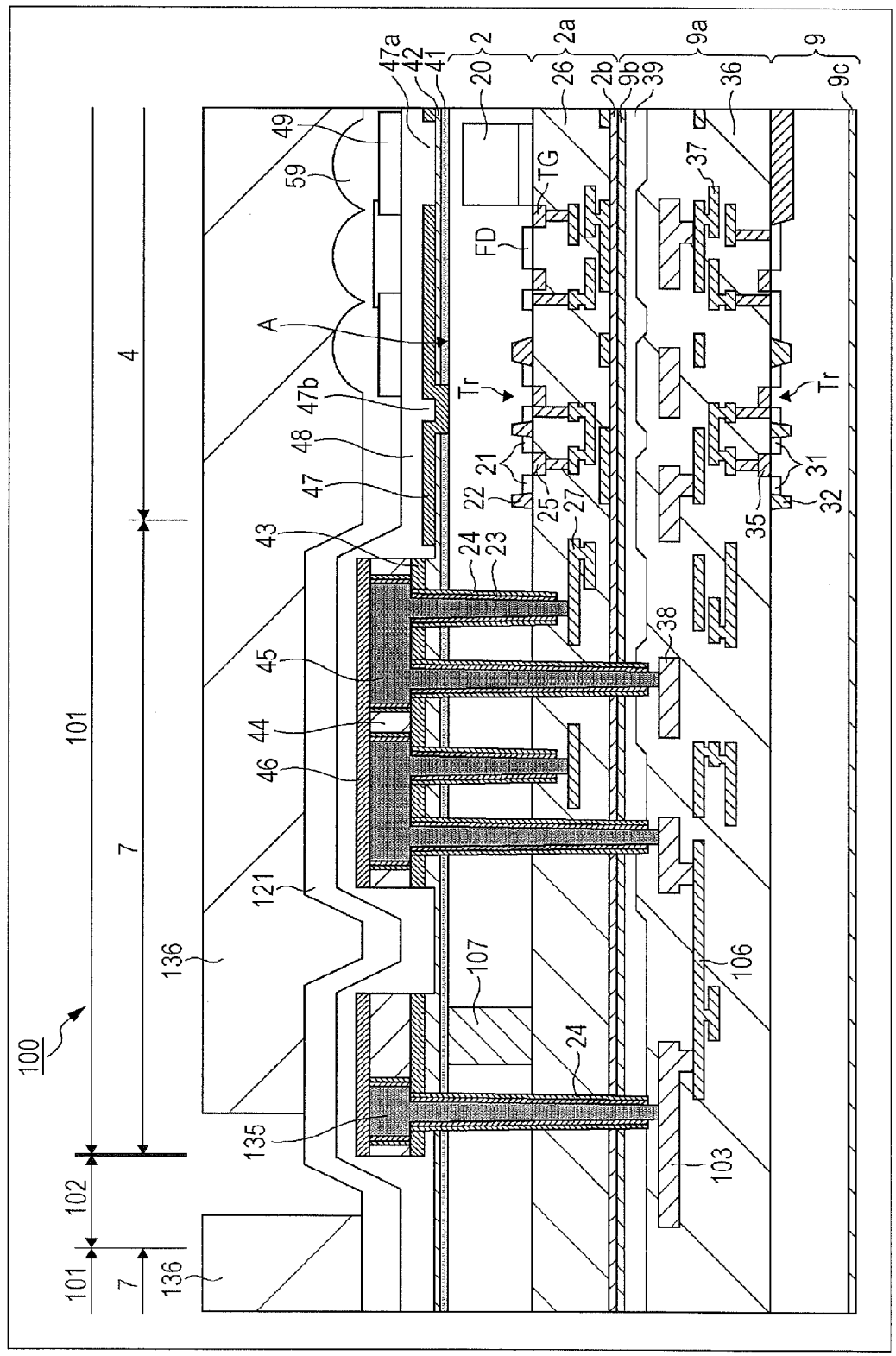
FIG. 42 is a manufacturing process diagram of the semiconductor wafer and the semiconductor device of the fifth embodiment.

Then, as illustrated in FIG. 42, the resist layer 136 is formed on the lens material layer 121 and the on-chip lens 59. The resist layer 136 is patterned over the entire surface of the semiconductor wafer 100 excluding the opening portion for exposing the pad electrode 103 in the surface of the semiconductor wafer 100.

Figure 43:
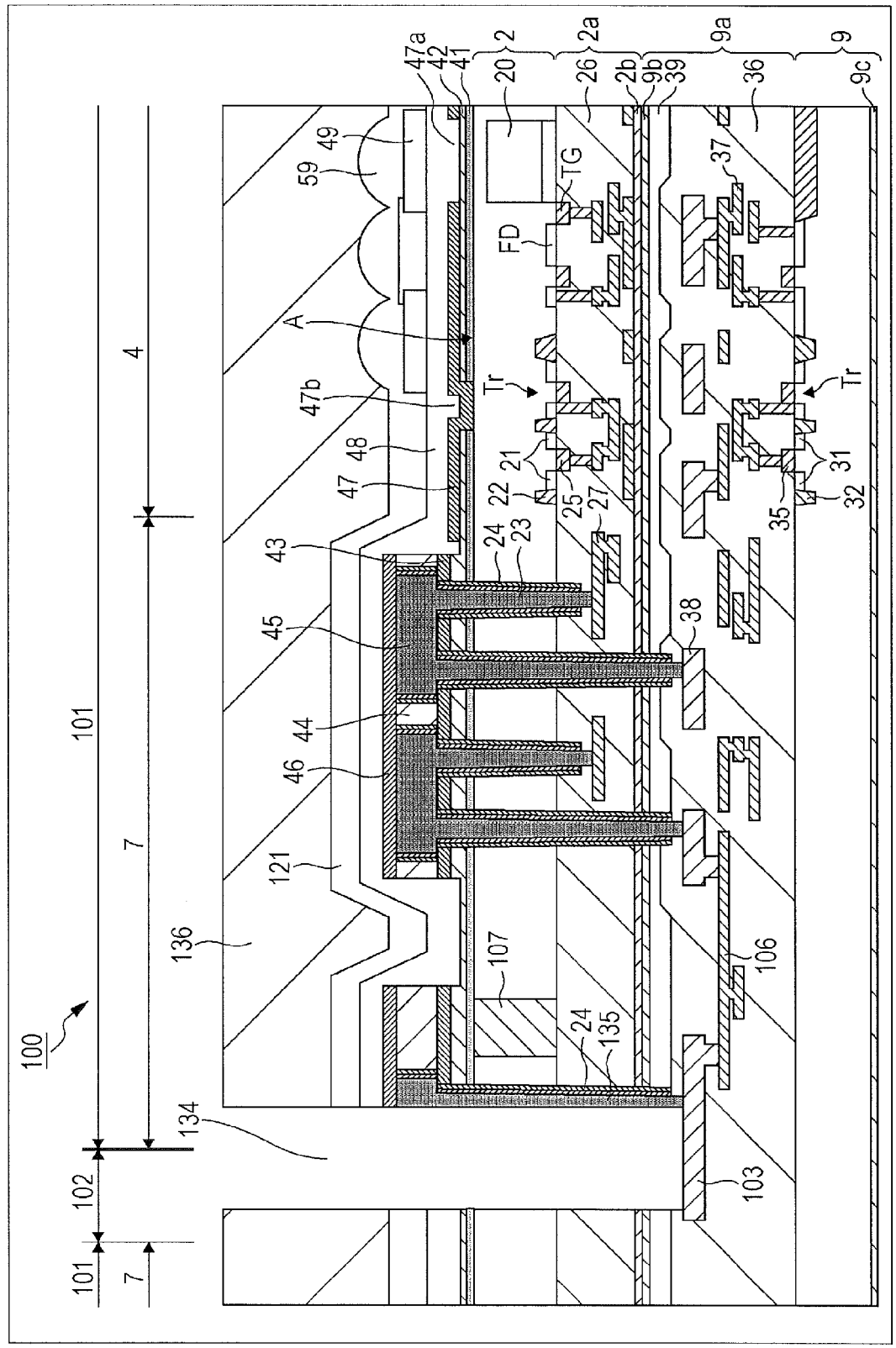
FIG. 43 is a manufacturing process diagram of the semiconductor wafer and the semiconductor device of the fifth embodiment.

Next, as illustrated in FIG. 43, the opening portion 134 is formed, using the resist layer 136 as a mask. The opening portion 134 is formed in a position for opening from the light receiving surface A side to the pad electrode 103 of the circuit board 9, from the end of the circuit forming region 101 to the scribe region 102. In other words, the lens material layer 121, the transparent protective film 48, the interface level suppressing film 42, the anti-reflection film 41, the sensor board 2, the inter-layer insulating film 26, the protective film 2b, the protective film 9b, the flattening film 39, and the inter-layer insulating film 36 are etched, and thus the opening portion 134 is completed. Further, the conductor layer 135 which is provided in the position overlapping the formation position of the opening portion 134 in part and the separation insulating film 24 which is formed in the side surface of the conductor layer 135 are removed simultaneously. Thus, the conductor layer 135 which is exposed in the side surface of the opening portion 134 by the formation of the opening portion 134 is formed by the penetrating electrode of the sensor board 2.

Next, a probe inspection is performed by inserting an inspection needle into the opening portion 134 from the light receiving surface A side and by using the pad electrode 103 for inspection. The probe inspection is performed in the state of the semiconductor wafer 100 as described above, and an operation checking of the semiconductor devices which are formed in the plurality of circuit forming regions 101 in the semiconductor wafer 100 is performed.

Figure 44:
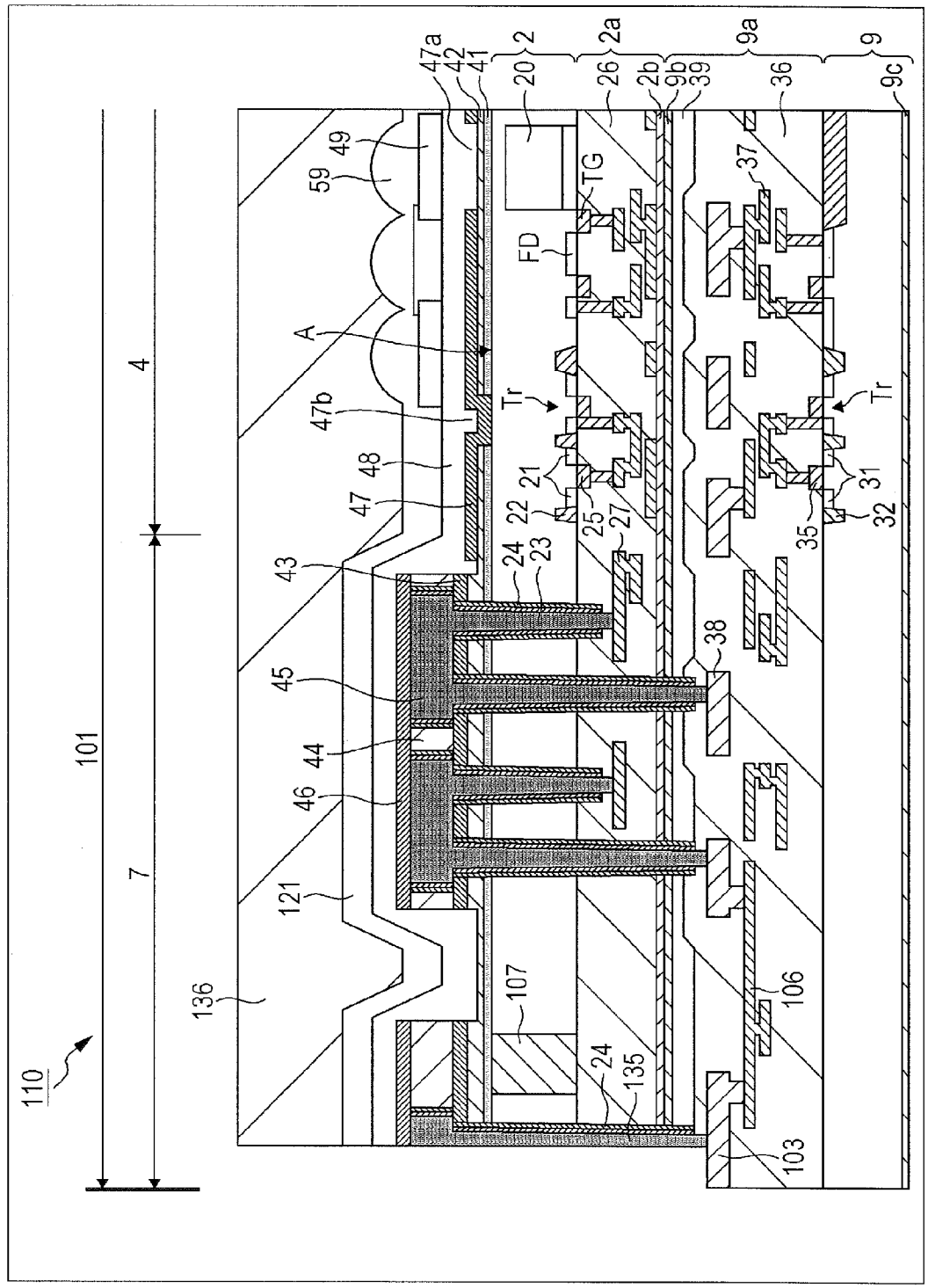
FIG. 44 is a manufacturing processing diagram of the semiconductor device of the fifth embodiment.

Next, as illustrated in FIG. 44, after the probe inspection described above, the scribe region 102 of the wafer is removed by dicing and the circuit forming region 101 is singulated so as to manufacture the semiconductor device 110.

The pad electrode 103, the circuit board 9, and the wiring layer 9a which are provided on the scribe region 102, are removed by the dicing. Then, the conductor layer 135 which remains on the side surface of the semiconductor device 110 is the external connection terminal of the semiconductor device 110. Further, the pad electrode 103 is cut by dicing, and only a portion which has been located in the wiring layer 9a remains in the semiconductor device 110.

By the above-mentioned process, it is possible to manufacture the semiconductor device 110. Then, the process proceeds to the next assembly process using only the manufactured semiconductor devices 110 that pass the probe inspection as described above. By the assembly process, the conductor layer 135 which is the external connection terminal on the side surface of the semiconductor device 110 is connected to the external device so as to constitute the semiconductor module as illustrated in FIG. 5 described above.

According to the semiconductor wafer and the semiconductor device described above, the conductor layer 135 which is the external connection terminal of the semiconductor device 110 is formed by the same process as that of the penetrating electrode 23 which is formed in the peripheral region 7. Then, the conductor layer 135 configured with the penetrating electrode is exposed in the side surface of the circuit forming region 101 of the semiconductor device 110, by forming the opening portion 134 so as to remove a part of the conductor layer 135. Therefore, in the fifth embodiment, a process of forming the conductor layer in the side surface of the opening portion after the opening portion is formed is not required. Accordingly, it is possible to reduce the number of manufacturing processes of the semiconductor wafer and the semiconductor device.

12. Sixth Embodiment

Semiconductor Device and Semiconductor Wafer

[Schematic Configuration of Solid State Imaging Device]

Next, the sixth embodiment of the semiconductor device and the semiconductor wafer will be described.

Figure 47:
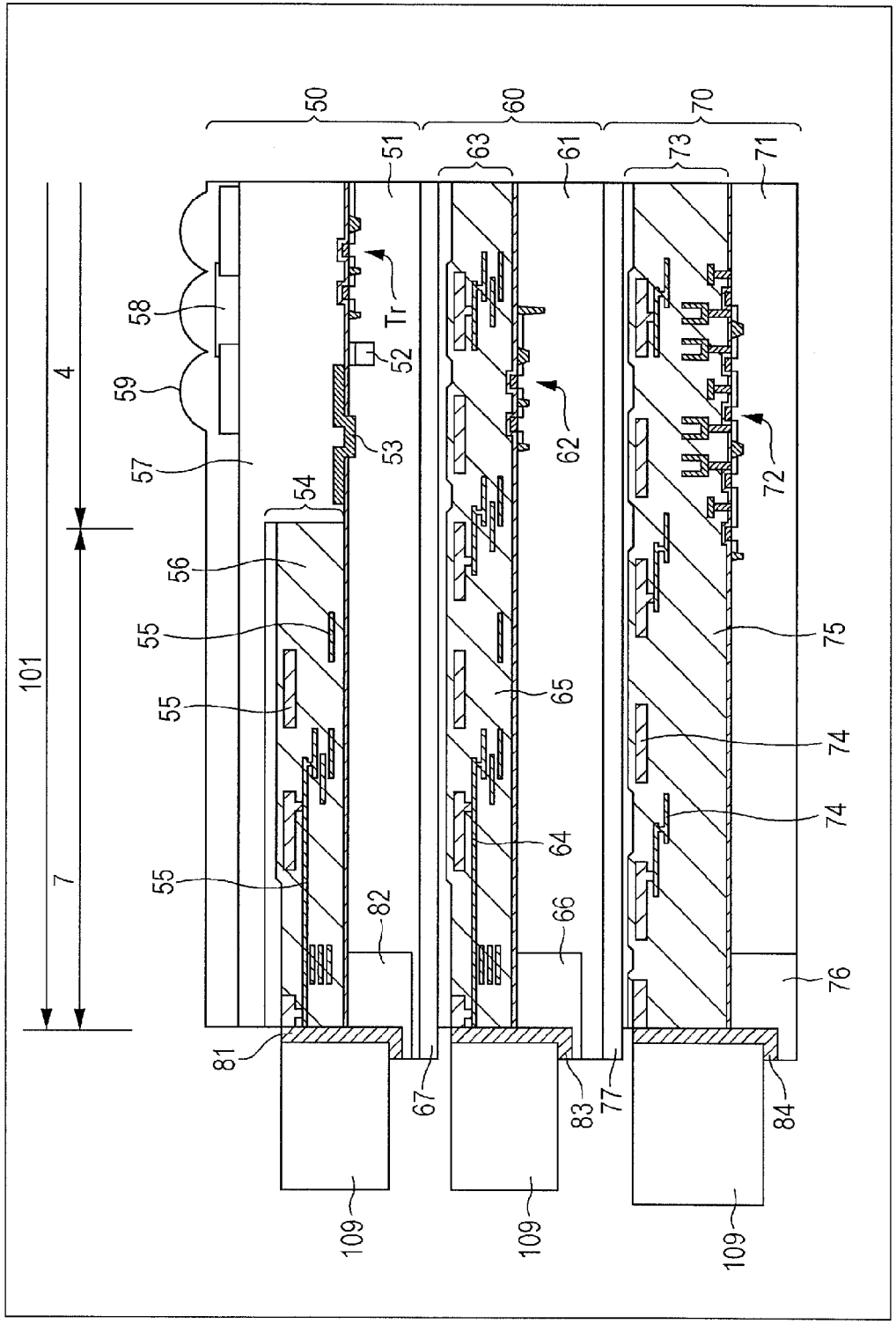
FIG. 47 is a diagram illustrating a configuration of the semiconductor device of a sixth embodiment.

FIG. 47 illustrates a schematic configuration of a front side illumination type solid state imaging device of a three-dimensional structure, as an example of a semiconductor device to which the present technology is applied. The solid state imaging device illustrated in FIG. 47 has a configuration in which a sensor board 50 in which photoelectric conversion units are arranged and formed, a circuit board 60, and a memory board 70 are laminated.

The sensor board 50, the circuit board 60 and the memory board 70 respectively include wiring layers 54, 63, 73 on semiconductor substrates 51, 61, 71. Then, the circuit board 60 is laminated on the memory board 70, and the sensor board 50 is laminated on the circuit board 60. In other words, the semiconductor substrate 61 of the circuit board 60 is laminated on the wiring layer 73 of the memory board 70, and the semiconductor substrate 51 of the sensor board 50 is laminated on the wiring layer 63 of the circuit board 60.

The sensor board 50 includes the semiconductor substrate 51, and a transistor unit Tr including a photoelectric conversion unit 52 provided on the surface of the semiconductor substrate 51. Then, the sensor board 50 includes a light shielding film 53, a wiring layer 54, a transparent protective film 57, a color filter 58, and an on-chip lens 59 on the surface of the semiconductor substrate 51. The wiring layer 54 includes a plurality of conductor layers 55 which are laminated, and an inter-layer insulation layer 56 which is formed between the conductor layers 55.

The sensor board 50 is a so-called front side illumination type solid state imaging device, in which a surface on one side (surface) is a light receiving surface A, including pixel regions in which a plurality of pixels including a photoelectric conversion unit 52 are two-dimensionally arranged with respect to the light receiving surface A. The photoelectric conversion unit 52, a charge storage portion, and a transistor unit Tr as a pixel circuit configured with a plurality of transistors (so-called MOS transistor or the like) are provided in the pixel region. Further, a part of the pixel circuit is provided in the circuit board 60. Furthermore, a plurality of pixels may share a part of the pixel circuit.

In the circuit board 60, a drive circuit 62 configured with the transistor unit Tr is provided in the surface of the semiconductor substrate 61. The drive circuit 62 includes a vertical drive circuit for driving the photoelectric conversion unit 52 provided in the sensor board 50, a column signal processing circuit, a horizontal drive circuit, a system control circuit, and the like. The drive circuit 62 is connected to the photoelectric conversion unit 52 and the transistor unit Tr on the sensor board 50 through wirings which are not illustrated.

Further, the circuit board 60 includes a wiring layer 63 covering the drive circuit 62, on the semiconductor substrate 61. The wiring layer 63 is configured with a conductor layer 64 and an inter-layer insulation layer 65. Further, it includes a protective layer 67 covering the top of the wiring layer 63. Then, in the protective layer 67, the circuit board 60 is bonded with the back surface of the sensor board 50.

The memory board 70 includes a storage unit 72 on the surface of the semiconductor substrate 71. The storage unit 72 is configured with a storage element such as a DRAM which stores signals which are processed in the circuit board 60. The storage unit 72 is connected to the drive circuit 62 on the circuit board 60 side by wirings which are not shown.

Further, the memory board 70 includes a wiring layer 73 covering the storage unit 72, on the semiconductor substrate 71. The wiring layer 73 is configured with a conductor layer 74 and an inter-layer insulation layer 75. Further, it includes a protective layer 77 covering the top of the wiring layer 73. Then, in the protective layer 77, the memory board 70 is bonded with the back surface of the circuit board 60.

In the sensor board 50, the conductor layer 81 as the external connection terminal is provided in a part of the side surface from the wiring layer 54 to the semiconductor substrate 51. Further, an insulating portion 82 is provided in the semiconductor substrate 51 which is in contact with the conductor layer 81, and the semiconductor substrate 51 and the conductor layer 81 are insulated. Furthermore, the conductor layer 81 is connected to the conductor layer 55 of the wiring layer 54. Therefore, the conductor layer 81 is the external connection terminal of the sensor board 50.

In the circuit board 60, the conductor layer 83 as the external connection terminal is provided in a part of the side surface from the wiring layer 63 to the semiconductor substrate 61. Further, an insulating portion 66 is provided in the semiconductor substrate 61 which is in contact with the conductor layer 83, and the semiconductor substrate 61 and the conductor layer 83 are insulated. Furthermore, the conductor layer 83 is connected to the conductor layer 64 of the wiring layer 63. Therefore, the conductor layer 83 is the external connection terminal of the circuit board 60.

In the memory board 70, the conductor layer 84 as the external connection terminal is provided in a part of the side surface from the wiring layer 73 to the semiconductor substrate 71. Further, an insulating portion 76 is provided in the semiconductor substrate 71 which is in contact with the conductor layer 84, and the semiconductor substrate 71 and the conductor layer 84 are insulated. Furthermore, the conductor layer 84 is connected to the conductor layer 74 of the wiring layer 73. Therefore, the conductor layer 84 is the external connection terminal of the memory board 70.

Figure 48:
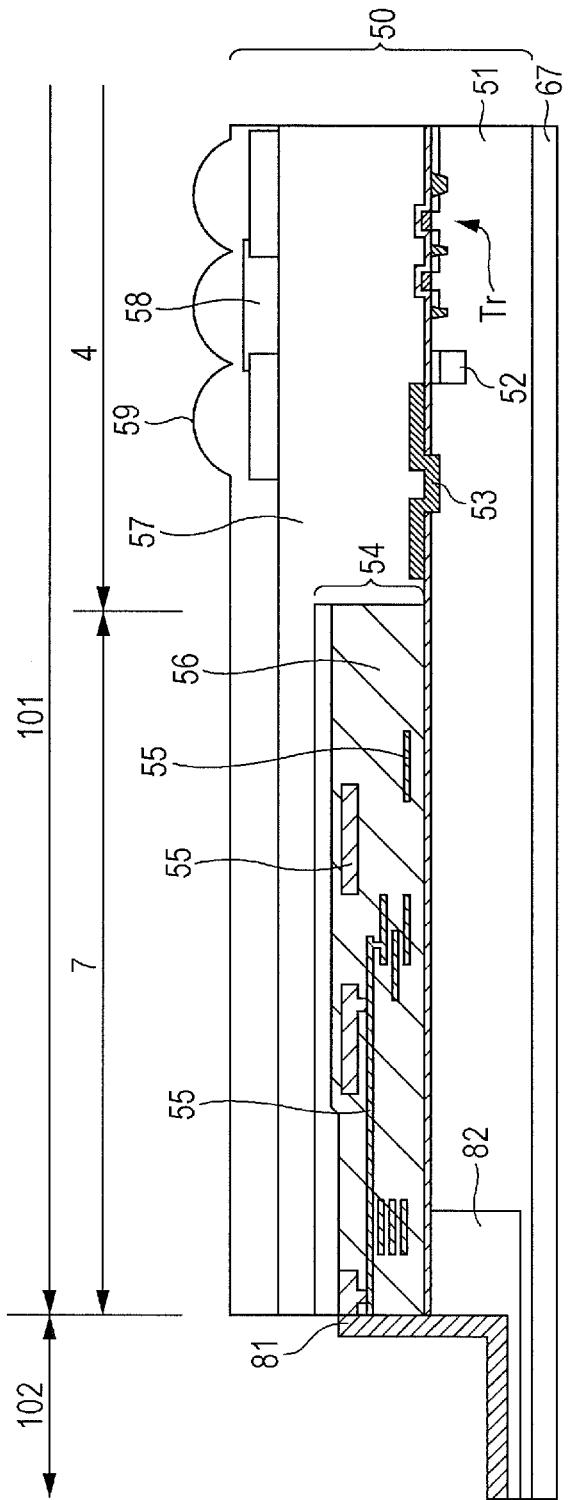
FIG. 48 is a diagram illustrating a configuration of the semiconductor wafer of the semiconductor device of the sixth embodiment.

In addition, FIG. 47 illustrates the semiconductor device in a state of being singulated after the scribing. In the wafer state of the semiconductor device, as illustrated in FIG. 48, there is an opening portion 104 which is formed from the surface side of the sensor board 50 (see FIG. 2) in the scribe region 102. Then, the conductor layer 81 is provided in the opening portion 104.

Further, it is possible to inspect the sensor board 50 in the wafer state, by inserting the inspection needle into the opening portion 104 from the surface side, in the lower portion of the conductor layer 81.

Although FIG. 48 illustrates the wafer state of the sensor board 50, similarly, the opening portions (see FIG. 2) which are formed from the surface side are formed also in the circuit board 60 and the memory board 70, and the conductor layers 83, 84 as the external connection terminals are provided in the opening portion. Then, it is possible to inspect the circuit board 60 or the memory board 70 in the wafer state, by inserting the inspection needle into the opening portion from the surface side, in the lower portions of the conductor layers 83, 84.

Then, it is possible to manufacture the semiconductor device illustrated in FIG. 47 by the respective boards being singulated in the scribe region 102, after the sensor board 50, the circuit board 60, and the memory board 70 in the wafer state are laminated. Thus, it is possible to form the semiconductor device in which the conductor layers 81, 83, 84 are formed as the external connection terminals, on the respective side surfaces of the sensor board 50, the circuit board 60, and the memory board 70.

Accordingly, as illustrated in FIG. 47, it is possible to form the semiconductor device having a configuration in which a plurality of semiconductor substrates having the external connection terminals provided on the respective side surfaces are laminated.

13. Seventh Embodiment

Semiconductor Device and Semiconductor Wafer

Next, the seventh embodiment of the semiconductor device and the semiconductor wafer will be described.

Figure 49:
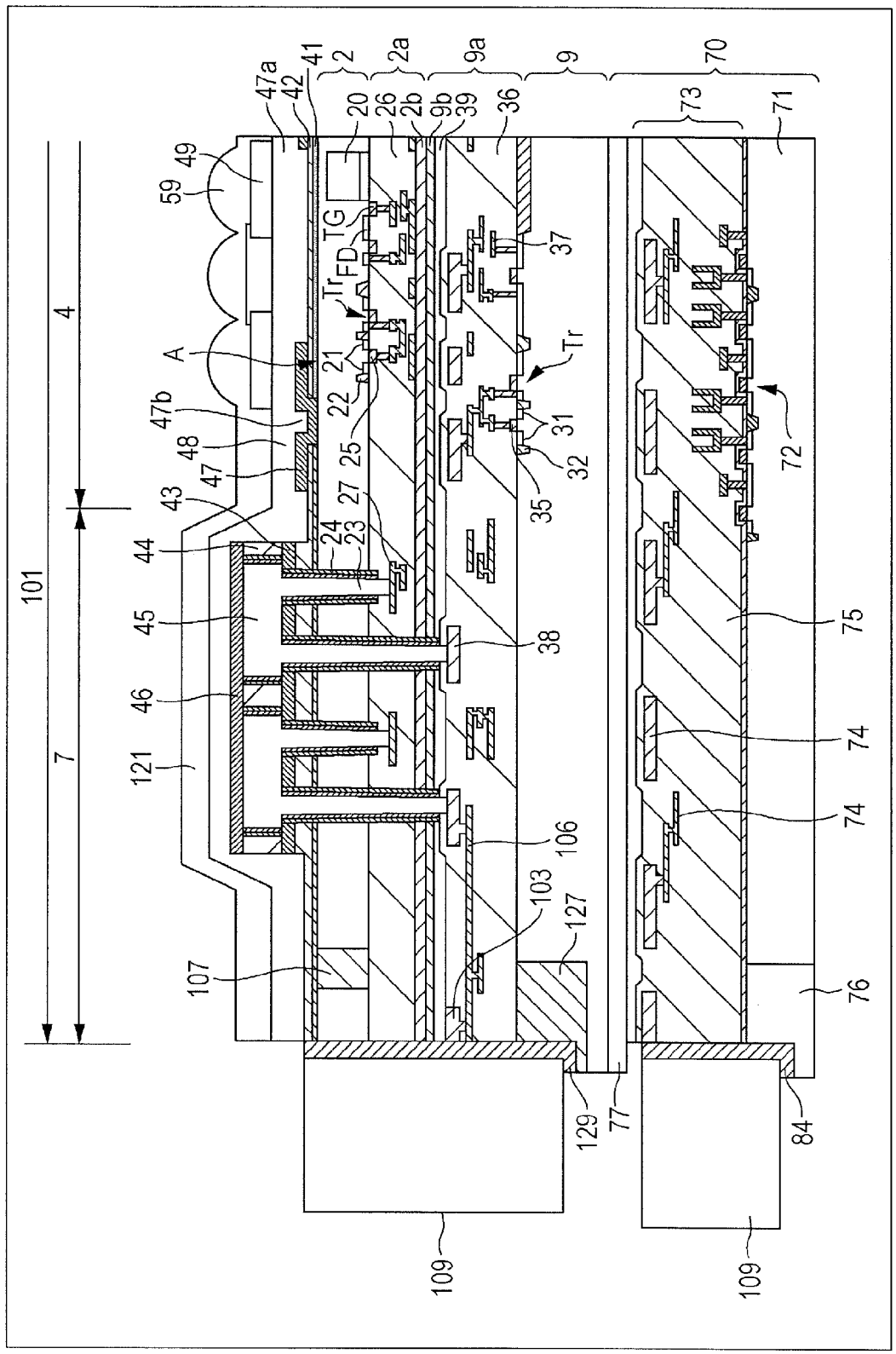
FIG. 49 is a diagram illustrating a configuration of the semiconductor device of a seventh embodiment.

FIG. 49 illustrates a schematic configuration of a back side illumination type solid state imaging device of a three-dimensional structure of the seventh embodiment. The solid state imaging device illustrated in FIG. 49 has a configuration in which a sensor board 2 in which photoelectric conversion units are arranged and formed, a circuit board 9, and a memory board 70 are laminated.

The sensor board 2 board and the circuit board 9 have the same configuration as the semiconductor device of the third embodiment illustrated in FIG. 23. Then, the memory board 70 is laminated on the sensor board 2 and the circuit board. 9. Further, the memory board 70 has the same configuration as that of the sixth embodiment described above.

In this manner, it is possible to laminate a memory board or the like, with respect to the configuration of the backside illumination type solid state imaging device described above. Then, it is possible to form a semiconductor device in which an external connection terminal is provided continuously on the side surfaces of the sensor board 2 and the circuit board 9, and the external connection terminal is provided only on the side surface of the memory board.

14. Eighth Embodiment

Semiconductor Device and Semiconductor Wafer

Next, the eighth embodiment of the semiconductor device and the semiconductor wafer will be described.

Figure 50:
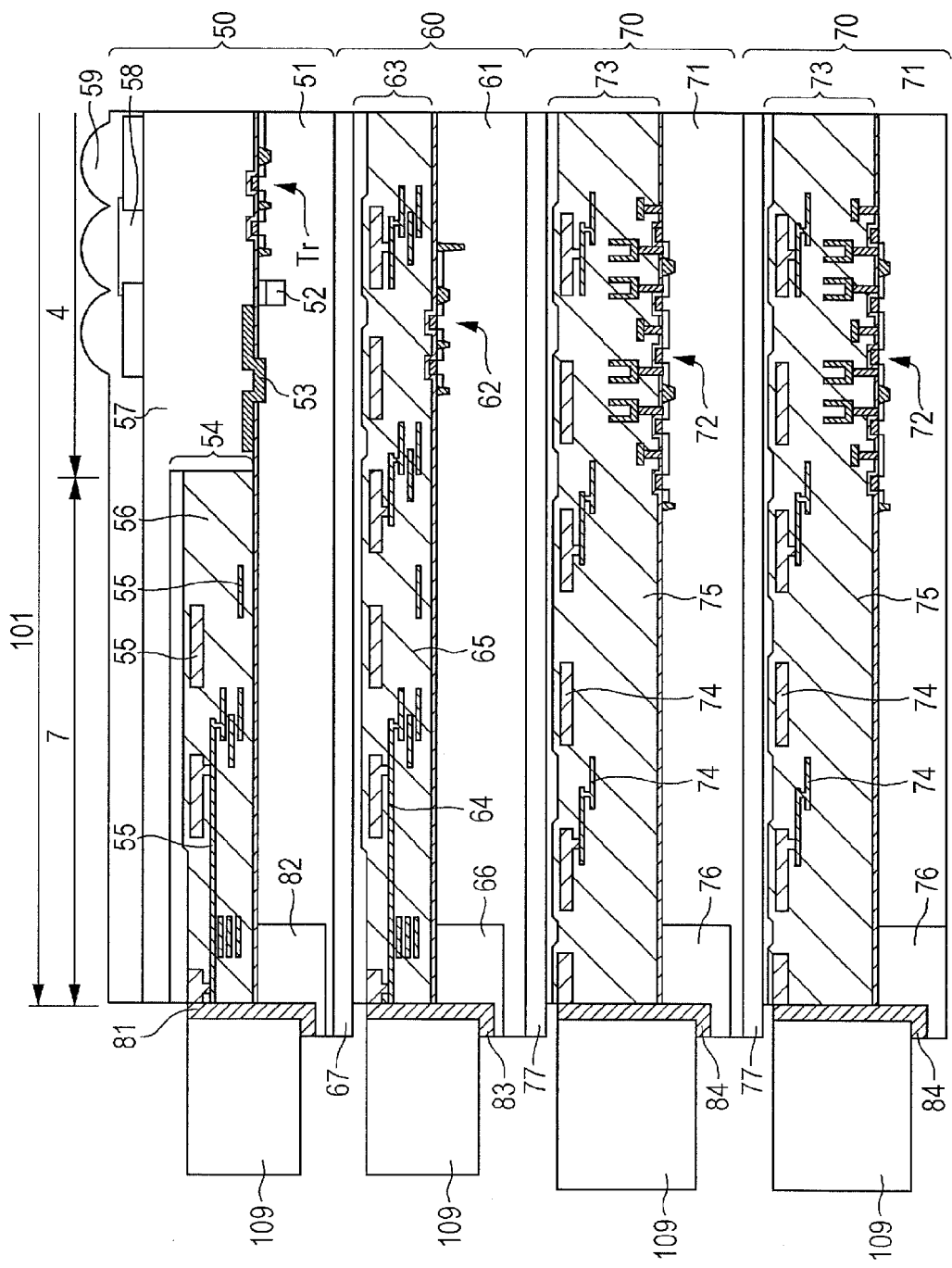
FIG. 50 is a diagram illustrating a configuration of the semiconductor device of an eighth embodiment.

FIG. 50 illustrates a schematic configuration of a front side illumination type solid state imaging device of a three-dimensional structure of the eighth embodiment. The solid state imaging device illustrated in FIG. 50 has a configuration in which the sensor board 50 in which photoelectric conversion units are arranged and formed, the circuit board 60, and the memory board 70 of two layers are laminated.

The semiconductor device illustrated in FIG. 50 has a configuration in which the memory board 70 is added to the semiconductor device of the sixth embodiment described above. The respective configurations of the sensor board 50, the circuit board 60, and the memory board 70 are the same as those of the sixth embodiment described above.

In this manner, it can also be configured to laminate the semiconductor substrate of four or more layers. Then, it is possible to respectively provide the conductor layer as the external connection terminal in the side surface of each semiconductor substrate. Further, it is possible to configure a semiconductor device with an increased number of layers, by further bonding the semiconductor substrate to the semiconductor device of the present example.

15. Ninth Embodiment

Semiconductor Device and Semiconductor Wafer

Next, the ninth embodiment of the semiconductor device and the semiconductor wafer will be described.

Figure 51:
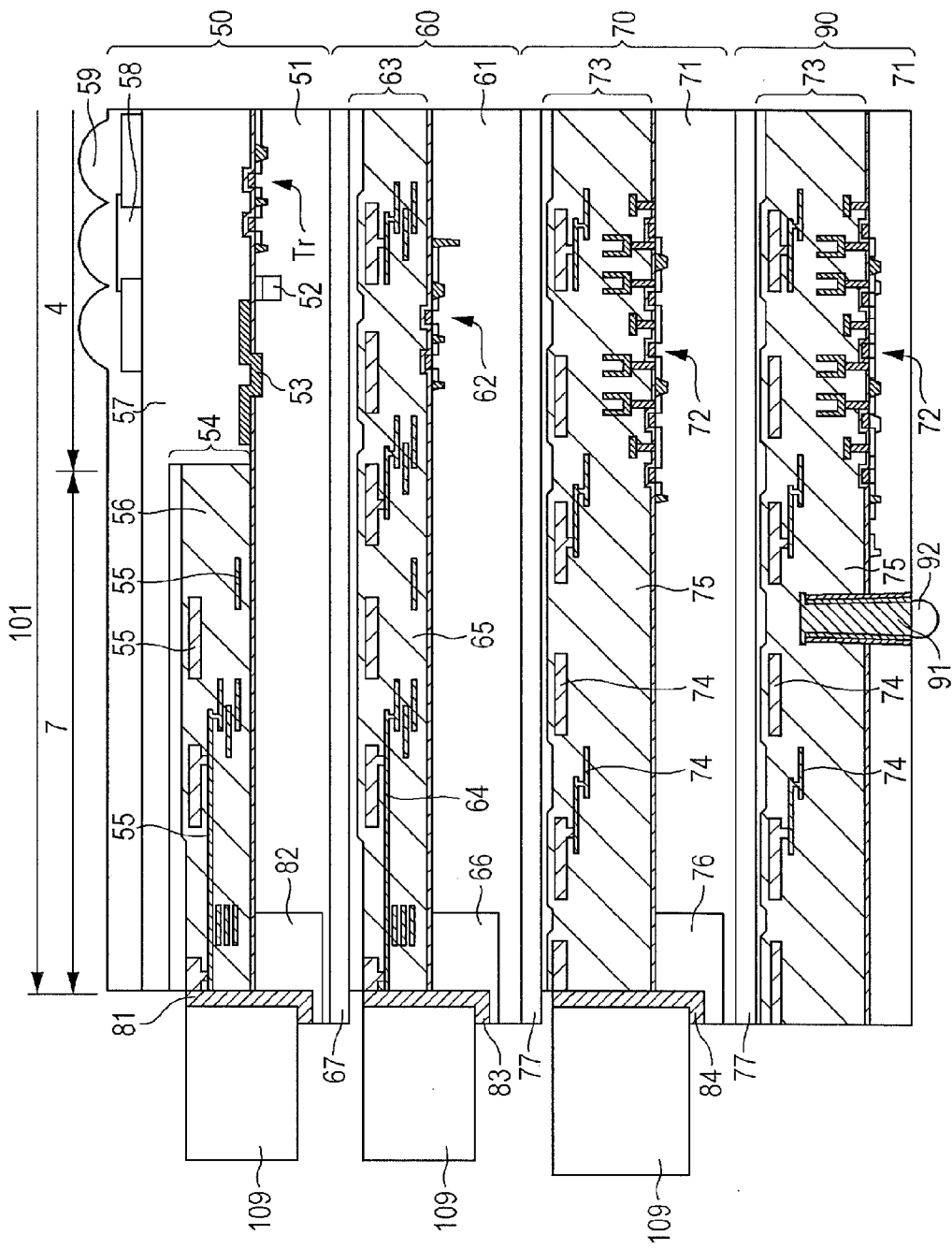
FIG. 51 is a diagram illustrating a configuration of the semiconductor device of a ninth embodiment.

FIG. 51 illustrates a schematic configuration of a front side illumination type solid state imaging device of a three-dimensional structure of the ninth embodiment. The solid state imaging device illustrated in FIG. 51 has a configuration in which the sensor board 50 in which photoelectric conversion units are arranged and formed, the circuit board 60, and the memory board 70, and a memory board 90 are laminated.

The semiconductor device illustrated in FIG. 51 has a configuration in which a memory board 90 is added to the semiconductor device of the sixth embodiment described above, in the bottom layer. The respective configurations of the sensor board 50, the circuit board 60, and the memory board 70 are the same as those of the sixth embodiment described above.

In the memory board 90, the conductor layer as the external connection terminal is provided on the back surface side of the substrate, rather than the side surface of the substrate. The memory board 90 has the same configuration as that of the memory board 70, excluding the configuration of the conductor layer as the external connection terminal.

The memory board 90 includes a penetrating electrode 91 penetrating from the conductor layer 74 provided in the wiring layer 73 to the back surface side of the semiconductor substrate 71. Then, a bump electrode 92 is provided on the surface of the penetrating electrode 91 which is exposed in the back surface side of the semiconductor substrate 71. The bump electrode 92 is the external connection terminal of the memory board 90. In this manner, it is possible to provide the external connection terminal in the back surface of the semiconductor substrate 71, and thus it is possible to suppress an increase in the area of the memory board 90, without needing to form a conductor layer on the side surface.

In this manner, in the configuration in which a plurality of semiconductor substrates are laminated, it is possible to provide the external connection terminal on the back surface side of the substrate, in the semiconductor substrate of the bottom layer. Then, in the semiconductor substrate other than the bottom layer, a conductor layer as the external connection terminal is provided on the side surface of the semiconductor substrate, similarly to the embodiment described above.

16. Tenth Embodiment

Electronic Equipment

Next, an embodiment of electronic equipment equipped with the semiconductor device described above will be described.

Figure 45:
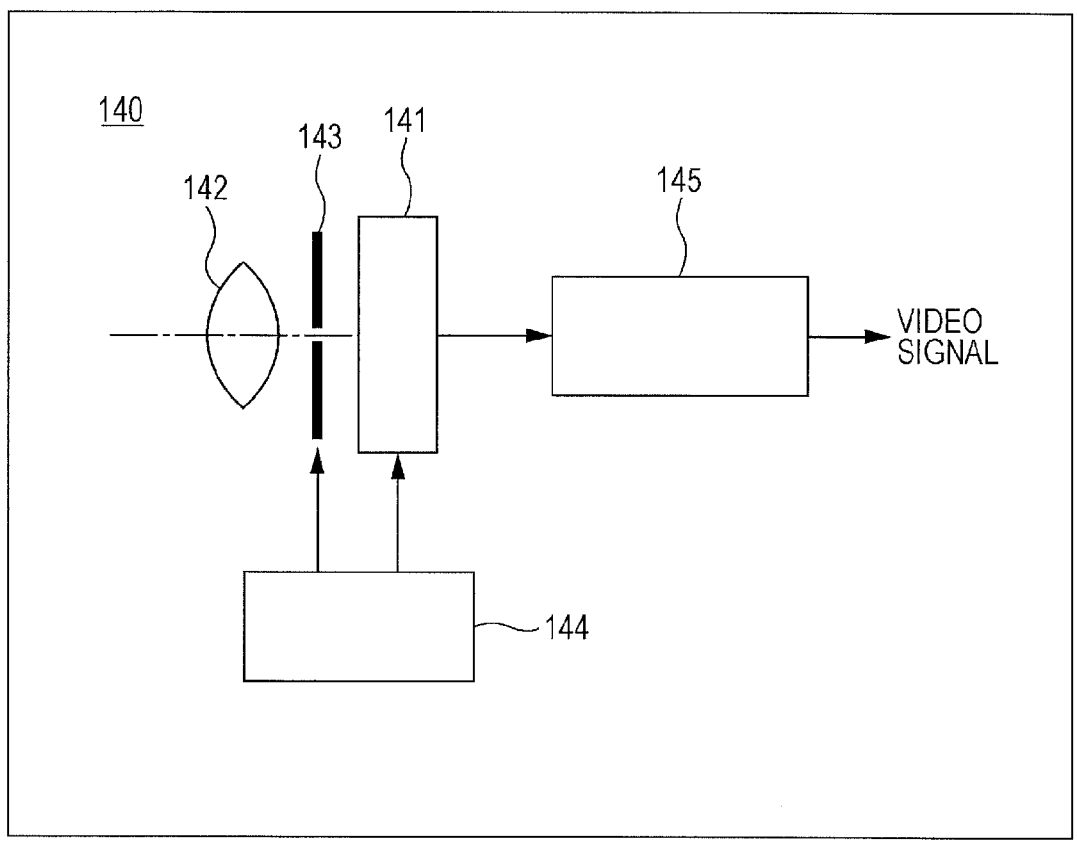
FIG. 45 is a diagram illustrating a configuration of electronic equipment.

The semiconductor device described above can be applied to electronic equipment such as, for example, camera systems such as digital cameras and video cameras, mobile telephones having imaging functions, or other devices having imaging functions. FIG. 45 illustrates a schematic configuration when the semiconductor device is applied to a camera capable of taking still images or moving images, as an example of electronic equipment.

A camera 140 in this example includes a semiconductor device 141, an optical system 142 that guides incident light to a light receiving sensor of the semiconductor device 141, a shutter device 143 which is provided between the semiconductor device 141 and the optical system 142, and a drive circuit 144 that drives the semiconductor device 141. Further, the camera 140 includes a signal processing circuit 145 that processes output signals of the semiconductor device 141.

The semiconductor devices illustrated in the respective embodiments described above can be applied to the semiconductor device 141. The optical system (optical lens) 142 focuses image light (incident light) from an object on the imaging surface (not illustrated) of the semiconductor device 141. Thus, signal charges are accumulated in the semiconductor device 141 for a certain period. In addition, the optical system 142 may be configured with an optical lens group including a plurality of optical lenses. Further, the shutter device 143 controls a light radiation period and a light shielding period of the incident light to the semiconductor device 141.

The drive circuit 144 supplies drive signals to the semiconductor device 141 and the shutter device 143. Then, the drive circuit 144 controls a signal output operation of the semiconductor device 141 to the signal processing circuit 145 and a shutter operation of the shutter device 143, by the supplied drive signals. In other words, in this example, a signal transfer operation from the semiconductor device 141 to the signal processing circuit 145 is performed by the drive signal (timing signal) supplied from the drive circuit 144.

The signal processing circuit 145 performs various signal processes on the signals transferred from the semiconductor device 141. Then, the signals (video signals) subjected to the various signal processes are stored in the storage medium such as a memory (not illustrated), or output to a monitor (not illustrated).

According to the electronic equipment such as the camera 140 described above, in the semiconductor device 141, the miniaturization of the device is possible without affecting the area of a meter circuit region. Therefore, it is possible to provide electronic equipment capable of being reduced in size without causing deterioration in characteristics.

In addition, in the respective embodiments described above, the configurations of the solid state imaging device having the photoelectric conversion unit in the semiconductor substrate have been described as an example of the semiconductor device of the present technology, but the present technology can be applied to semiconductor devices other than the solid state imaging device.

In addition, the present disclosure may also take the following configurations:

(1) A semiconductor device including a semiconductor substrate; a wiring layer that is formed on the semiconductor substrate; a drive circuit that is provided in a circuit forming region of the semiconductor substrate; a pad electrode that is electrically connected to the drive circuit and exposed from the side surface of the wiring layer; and an external connection terminal that is provided in side surfaces of the semiconductor substrate and the wiring layer, and is electrically connected to the pad electrode.

(2) The semiconductor device according to (1), further including a photoelectric conversion unit that is provided in the circuit forming region; and the wiring layer that is provided on a surface side opposite to a light receiving surface for the photoelectric conversion unit in the circuit forming region.

(3) The semiconductor device according to (1) or (2), further including a second semiconductor substrate that is bonded with a side surface on which the wiring layer of the semiconductor substrate is formed, wherein the external connection terminal is continuously formed in a side surface of the semiconductor substrate to a side surface of the second semiconductor substrate.

(4) The semiconductor device according to any one of (1) to (3), wherein the external connection terminal is continuously formed in a light receiving surface side of the semiconductor substrate to a wiring layer of the second semiconductor substrate.

(5) The semiconductor device according to any one of (1) to (4), wherein parts other than an exposed surface of the external connection terminal are embedded in the semiconductor substrate and the wiring layer on the semiconductor substrate, and wherein the pad electrode is electrically connected to the drive circuit through the external connection terminal.

(6) A semiconductor wafer including a plurality of circuit forming regions; a scribe region that is arranged to surround the circuit forming regions; a drive circuit that is provided in the circuit forming regions; a pad electrode that is electrically connected to the drive circuit and formed from an end of the circuit forming region to the scribe region; an opening portion that is formed on the pad electrode; and a conductor layer that is formed on a side surface and a lower surface of the opening portion and is electrically connected to the drive circuit.

(7) The semiconductor wafer according to (6), further including a photoelectric conversion unit that is provided in each of the circuit forming regions; the drive circuit that is provided on a surface side opposite to a light receiving surface for the photoelectric conversion unit in each of the circuit forming regions; an opening portion that is formed from an end of the circuit forming regions to a scribe region, to a depth which is equal to or greater than a depth of the drive circuit from the light receiving surface side; and a conductor layer that is formed in a side surface and a lower surface of the opening portion, and is electrically connected to the drive circuit.

(8) A manufacturing method of a semiconductor device, including a process of forming a drive circuit in a circuit forming region of a semiconductor substrate; a process of forming a wiring layer on the semiconductor substrate; a process of forming a pad electrode in the wiring layer; a process of forming an opening portion for exposing the pad electrode in a surface, from the circuit forming region to a scribe region; a process of forming a conductor layer in a side surface of the opening portion; and a process of singulating the circuit forming region in the scribe region.

(9) The manufacturing method of a semiconductor device according to (8), further including: engraving further the opening portion after the opening portion for exposing the pad electrode in a surface is formed, and forming the conductor layer in the engraved opening portion.

(10) A manufacturing method of a semiconductor device, including a process of forming a drive circuit in a circuit forming region of a semiconductor substrate; a process of forming a wiring layer on a semiconductor substrate; a process of forming a pad electrode in the wiring layer; a process of forming a penetrating electrode which penetrates the semiconductor substrate and is connected to the pad electrode; a process of forming an opening portion for exposing the pad electrode in a surface and exposing the penetrating electrode in a side surface, from the circuit forming region to the scribe region; and a process of singulating the circuit forming region in the scribe region.

(11) Electronic equipment including the semiconductor device according to any one of (1) to (5); and a signal processing circuit that processes an output signal of the semiconductor device.

(12) A semiconductor device including: a first semiconductor substrate and a second semiconductor substrate, wherein the first semiconductor substrate includes a wiring layer that is formed on the first semiconductor substrate; a drive circuit that is provided in a circuit forming region of the first semiconductor substrate; and an external connection terminal that is provided in side surfaces of the first semiconductor substrate and the wiring layer, wherein the second semiconductor substrate includes a wiring layer that is formed on the second semiconductor substrate; a drive circuit that is provided in a circuit forming region of the second semiconductor substrate; and an external connection terminal that is provided in side surfaces of the second semiconductor substrate and the wiring layer, and wherein the first semiconductor substrate and the second semiconductor substrate are laminated.

(13) The semiconductor device according to (12), wherein the first semiconductor substrate includes a photoelectric conversion unit that is provided in the circuit forming region, and an insulating layer that covers an entire surface of the semiconductor substrate on a light receiving surface side of the photoelectric conversion unit.

(14) The semiconductor device according to (12) or (13), wherein the second semiconductor substrate includes a drive circuit of the photoelectric conversion unit in the circuit forming region.

(15) The semiconductor device according to any one of (12) to (14), further including a third semiconductor substrate in addition to the first semiconductor substrate and the second semiconductor substrate, wherein the third semiconductor substrate includes a wiring layer that is formed on the third semiconductor substrate; a drive circuit that is provided in a circuit forming region of the third semiconductor substrate; and an external connection terminal that is provided in side surfaces of the third semiconductor substrate and the wiring layer, and wherein the first semiconductor substrate, the second semiconductor substrate, and the third semiconductor substrate are laminated.

(16) A manufacturing method of a semiconductor device, including a process of forming a drive circuit in a circuit forming region of a first semiconductor substrate; a process of forming a wiring layer on the first semiconductor substrate; a process of forming an opening portion in a scribed region of the first semiconductor substrate; a process of forming a conductor layer in the opening portion of the first semiconductor substrate; a process of forming a drive circuit in a circuit forming region of a second semiconductor substrate; a process of forming a wiring layer on the second semiconductor substrate; a process of forming an opening portion in a scribed region of the second semiconductor substrate; a process of forming a conductor layer in the opening portion of the second semiconductor substrate; a process of laminating the first semiconductor substrate and the second semiconductor substrate; and a process of singulating the first semiconductor substrate and the second semiconductor substrate in the scribe region.

REFERENCE SIGNS LIST

1 SOLID STATE IMAGING DEVICE
2, 50 SENSOR BOARD
2a, 9a, 54, 63, 73 WIRING LAYER
2b, 9b, 9c, 67, 77 PROTECTIVE FILM
3 PIXEL
4 PIXEL REGION
5 PIXEL DRIVING LINE
6 VERTICAL SIGNAL LINE
7 PERIPHERAL REGION
9, 60 CIRCUIT BOARD
10 VERTICAL DRIVE CIRCUIT
11 COLUMN SIGNAL PROCESSING CIRCUIT
12 HORIZONTAL DRIVE CIRCUIT
13 SYSTEM CONTROL CIRCUIT
20, 52 PHOTOELECTRIC CONVERSION UNIT
21, 31 SOURCE/DRAIN
22, 32 ELEMENT SEPARATOR
23, 91 PENETRATING ELECTRODE
24 SEPARATION INSULATING FILM
25, 35 GATE ELECTRODE
26, 36, 56, 65, 75 INTER-LAYER INSULATING FILM
27, 37, 38, 45, 106 WIRING
39 FLATTENING FILM
41 ANTI-REFLECTION FILM
42 INTERFACE LEVEL SUPPRESSING FILM
43 ETCHING STOP FILM
44 WIRING GROOVE FORMING FILM
46 CAP FILM
47, 53 LIGHT SHIELDING FILM
47a LIGHT RECEIVING OPENING
47b OPENING
48, 57 TRANSPARENT PROTECTIVE FILM
49, 58 COLOR FILTER
55, 64, 74, 81, 83, 84, 105, 105A, 124A, 128, 12859 ON-CHIP LENS
51, 61, 71 SEMICONDUCTOR SUBSTRATE
62, 144 DRIVE CIRCUIT
66, 76, 82, 107, 123, 127 INSULATING PORTION
70, 90 MEMORY BOARD
72 STORAGE UNIT
92 BUMP ELECTRODE
100 SEMICONDUCTOR WAFER
101, 501 CIRCUIT FORMING REGION
102 SCRIBE REGION
103, 130 PAD ELECTRODE
104, 126, 133, 134 OPENING PORTION
A, 131, 131A, 135 CONDUCTOR LAYER
108, 124, 129, 132 EXTERNAL CONNECTION TERMINAL
109 CONTACT JIG
110, 141 SEMICONDUCTOR DEVICE
111 MOUNTING SUBSTRATE
112 PACKAGE SUBSTRATE
113 COVER GLASS
114 LENS
121 LENS MATERIAL LAYER
122, 125, 136 RESIST LAYER
140 CAMERA
142 OPTICAL SYSTEM
143 SHUTTER DEVICE
145 SIGNAL PROCESSING CIRCUIT
500 WAFER
502 EXTENSION BOND PAD
503 FIRST BOND PAD
504 SECOND BOND PAD
505 METAL EXTENSION PORTION
506 OUTER PERIPHERAL PORTION

The invention claimed is:
1. A semiconductor device comprising:
a semiconductor substrate;
a wiring layer that is formed on the semiconductor substrate;
a drive circuit that is provided in a circuit forming region of the semiconductor substrate;

a pad electrode that is electrically connected to the drive circuit and exposed from the side surface of the wiring layer;

an external connection terminal that is provided in side surfaces of the semiconductor substrate and the wiring layer, and is electrically connected to the pad electrode; and a second semiconductor substrate that is bonded with a side surface on which the wiring layer of the semiconductor substrate is formed, wherein the external connection terminal is continuously formed in a side surface of the semiconductor substrate to a side surface of the second semiconductor substrate.

2. The semiconductor device according to claim 1, further comprising:

a photoelectric conversion unit that is provided in the circuit forming region; and the wiring layer that is provided on a surface side opposite to a light receiving surface for the photoelectric conversion unit in the circuit forming region.

3. The semiconductor device according to claim 1, wherein the external connection terminal is continuously formed in a light receiving surface side of the semiconductor substrate to a wiring layer of the second semiconductor substrate.

4. A semiconductor device comprising:

a semiconductor substrate;

a wiring layer that is formed on the semiconductor substrate;

a drive circuit that is provided in a circuit forming region of the semiconductor substrate;

a pad electrode that is electrically connected to the drive circuit and exposed from the side surface of the wiring layer; and an external connection terminal that is provided in side surfaces of the semiconductor substrate and the wiring layer, and is electrically connected to the pad electrode, wherein parts other than an exposed surface of the external connection terminal are embedded in the semiconductor substrate and the wiring layer on the semiconductor substrate, and wherein the pad electrode is electrically connected to the drive circuit through the external connection terminal.

5. A semiconductor wafer comprising:

a plurality of circuit forming regions;

a scribe region that is arranged to surround the circuit forming regions;

a drive circuit that is provided in the circuit forming regions;

a pad electrode that is electrically connected to the drive circuit and formed from an end of the circuit forming region to the scribe region;

an opening portion that is formed on the pad electrode; and a conductor layer that is formed on a side surface and a lower surface of the opening portion and is electrically connected to the drive circuit.

6. The semiconductor wafer according to claim 5, further comprising:

a photoelectric conversion unit that is provided in each of the circuit forming regions;

the drive circuit that is provided on a surface side opposite to a light receiving surface for the photoelectric conversion unit in each of the circuit forming regions;

an opening portion that is formed from an end of the circuit forming regions to a scribe region, to a depth which is equal to or greater than a depth of the drive circuit from the light receiving surface side; and a conductor layer that is formed in a side surface and a lower surface of the opening portion, and is electrically connected to the drive circuit.

7. A manufacturing method of a semiconductor device, comprising:

a process of forming a drive circuit in a circuit forming region of a semiconductor substrate;

a process of forming a wiring layer on the semiconductor substrate;

a process of forming a pad electrode in the wiring layer;

a process of forming an opening portion for exposing the pad electrode in a surface, from the circuit forming region to a scribe region;

a process of forming a conductor layer in a side surface of the opening portion; and a process of singulating the circuit forming region in the scribe region.

8. The manufacturing method of a semiconductor device according to claim 7, further comprising:

engraving further the opening portion after the opening portion for exposing the pad electrode in a surface is formed; and forming the conductor layer in the engraved opening portion.

9. A manufacturing method of a semiconductor device, comprising:

a process of forming a drive circuit in a circuit forming region of a semiconductor substrate;

a process of forming a wiring layer on a semiconductor substrate;

a process of forming a pad electrode in the wiring layer;

a process of forming a penetrating electrode which penetrates the semiconductor substrate and is connected to the pad electrode;

a process of forming an opening portion for exposing the pad electrode in a surface and exposing the penetrating electrode in a side surface, from the circuit forming region to the scribe region; and a process of singulating the circuit forming region in the scribe region.

10. Electronic equipment comprising:

a semiconductor device including a semiconductor substrate, a wiring layer that is formed on the semiconductor substrate, a drive circuit that is provided in a circuit forming region of the semiconductor substrate, a pad electrode that is electrically connected to the drive circuit and exposed from the side surface of the wiring layer, and an external connection terminal that is provided in side surfaces of the semiconductor substrate and the wiring layer, and is electrically connected to the pad electrode; and a signal processing circuit that processes an output signal of the semiconductor device.

11. A semiconductor device comprising:

a first semiconductor substrate and a second semiconductor substrate, wherein the first semiconductor substrate includes:

a wiring layer that is formed on the first semiconductor substrate;

a drive circuit that is provided in a circuit forming region of the first semiconductor substrate; and an external connection terminal that is provided in side surfaces of the first semiconductor substrate and the wiring layer, wherein the second semiconductor substrate includes:

a wiring layer that is formed on the second semiconductor substrate;

a drive circuit that is provided in a circuit forming region of the second semiconductor substrate; and an external connection terminal that is provided in side surfaces of the second semiconductor substrate and the wiring layer, and wherein the first semiconductor substrate and the second semiconductor substrate are laminated.

12. The semiconductor device according to claim 11, wherein the first semiconductor substrate includes a photoelectric conversion unit that is provided in the circuit forming region, and an insulating layer that covers an entire surface of the semiconductor substrate on a light receiving surface side of the photoelectric conversion unit.

13. The semiconductor device according to claim 11, wherein the second semiconductor substrate includes a drive circuit of the photoelectric conversion unit in the circuit forming region.

14. The semiconductor device according to claim 11, further comprising:

a third semiconductor substrate in addition to the first semiconductor substrate and the second semiconductor substrate, wherein the third semiconductor substrate includes:

a wiring layer that is formed on the third semiconductor substrate;

a drive circuit that is provided in a circuit forming region of the third semiconductor substrate; and an external connection terminal that is provided in side surfaces of the third semiconductor substrate and the wiring layer, and wherein the first semiconductor substrate, the second semiconductor substrate, and the third semiconductor substrate are laminated.

15. A manufacturing method of a semiconductor device, comprising:

a process of forming a drive circuit in a circuit forming region of a first semiconductor substrate;

a process of forming a wiring layer on the first semiconductor substrate;

a process of forming an opening portion in a scribed region of the first semiconductor substrate;

a process of forming a conductor layer in the opening portion of the first semiconductor substrate;

a process of forming a drive circuit in a circuit forming region of a second semiconductor substrate;

a process of forming a wiring layer on the second semiconductor substrate;

a process of forming an opening portion in a scribed region of the second semiconductor substrate;

a process of forming a conductor layer in the opening portion of the second semiconductor substrate;

a process of laminating the first semiconductor substrate and the second semiconductor substrate; and a process of singulating the first semiconductor substrate and the second semiconductor substrate in the scribe region.

* * * * *